US012660327B2

(12) United States Patent
Tura et al.

(10) Patent No.: US 12,660,327 B2
(45) Date of Patent: Jun. 16, 2026

(54) DIFFERENT POLY PITCHES FOR ADVANCED INTEGRATED CIRCUIT STRUCTURE FABRICATION

(71) Applicant: Intel Corporation, Santa Clara, CA (US)

(72) Inventors: Ahmet Tura, Portland, OR (US); Steven G. Jaloviar, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 16/950,042

(22) Filed: Nov. 17, 2020

(65) Prior Publication Data

US 2022/0068907 A1      Mar. 3, 2022

Related U.S. Application Data

(60) Provisional application No. 63/072,831, filed on Aug. 31, 2020.

(51) Int. Cl.
| | |
|---|---|
| *H10D 89/10* | (2025.01) |
| *B82Y 10/00* | (2011.01) |
| *B82Y 40/00* | (2011.01) |
| *H03K 19/08* | (2006.01) |

(52) U.S. Cl.
CPC .............. *H10D 89/10* (2025.01); *B82Y 10/00* (2013.01); *B82Y 40/00* (2013.01); *H03K 19/08* (2013.01)

(58) Field of Classification Search
CPC .............. G01N 21/9501; G06F 30/392; G06F 2111/20; G06F 30/18; G06F 30/39; H01L 27/0207
See application file for complete search history.

(56) References Cited

U.S. PATENT DOCUMENTS

| | | | |
|---|---|---|---|
| 10,332,881 B1 | 6/2019 | Badaroglu et al. | |
| 10,559,503 B2 * | 2/2020 | Bouche .................. | H01L 21/027 |
| 2019/0378830 A1 * | 12/2019 | Bao ........................ | H01L 27/088 |

OTHER PUBLICATIONS

Office Action from Taiwanese Patent Application No. 110127165, mailed Dec. 16, 2024, 15 pages.
Notice of Allowance from Taiwanese Patent Application No. 110127165, mailed May 26, 2025, 3 pages.

* cited by examiner

*Primary Examiner* — Evren Seven
(74) *Attorney, Agent, or Firm* — Schwabe, Williamson & Wyatt P.C.

(57) ABSTRACT

Embodiments of the disclosure are in the field of advanced integrated circuit structure fabrication and, in particular, 10 nanometer node and smaller integrated circuit structure fabrication and the resulting structures. In an example, an integrated circuit structure includes a first plurality of logic gate structures having a first pitch between adjacent ones of the first plurality of logic gate structures. The integrated circuit structure also includes a second plurality of logic gate structures having a second pitch between adjacent ones of the second plurality of logic gate structures. The second pitch is greater than the first pitch.

20 Claims, 44 Drawing Sheets

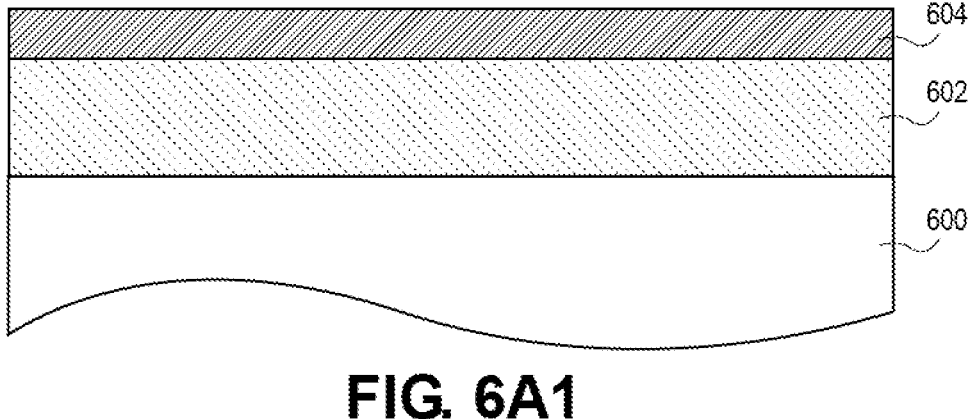
604
602
600
FIG. 6A1
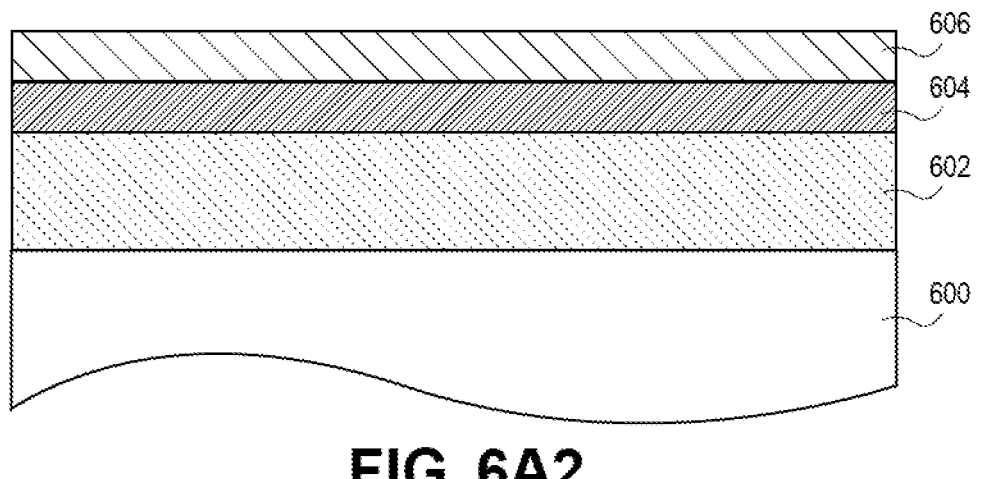
606
604
602
600
FIG. 6A2

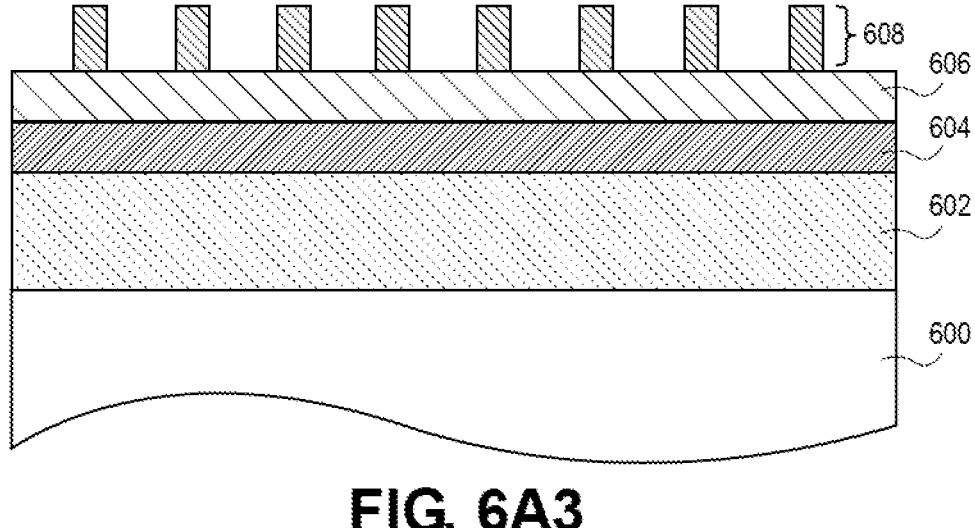
FIG. 6A3
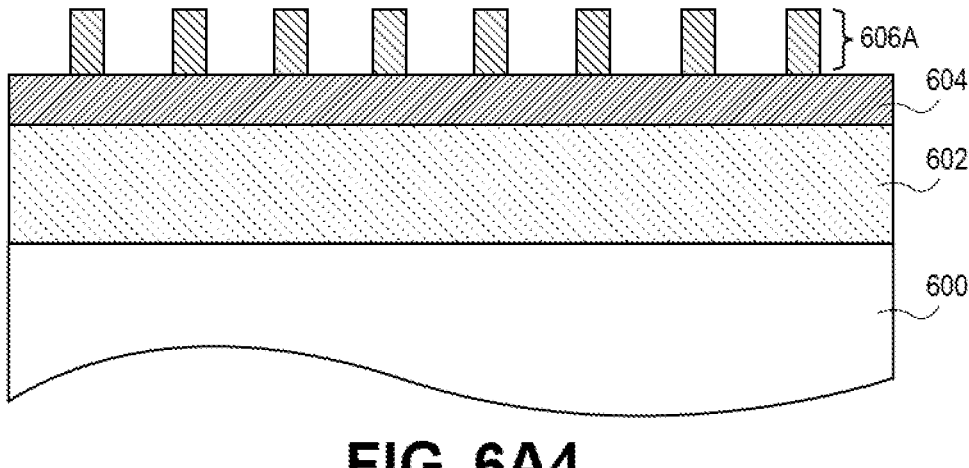
FIG. 6A4

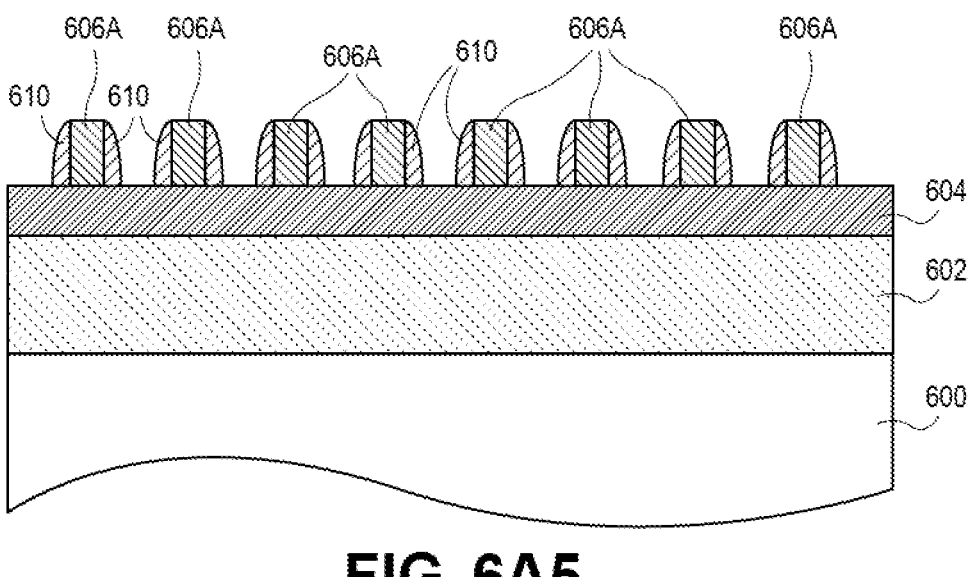
FIG. 6A5
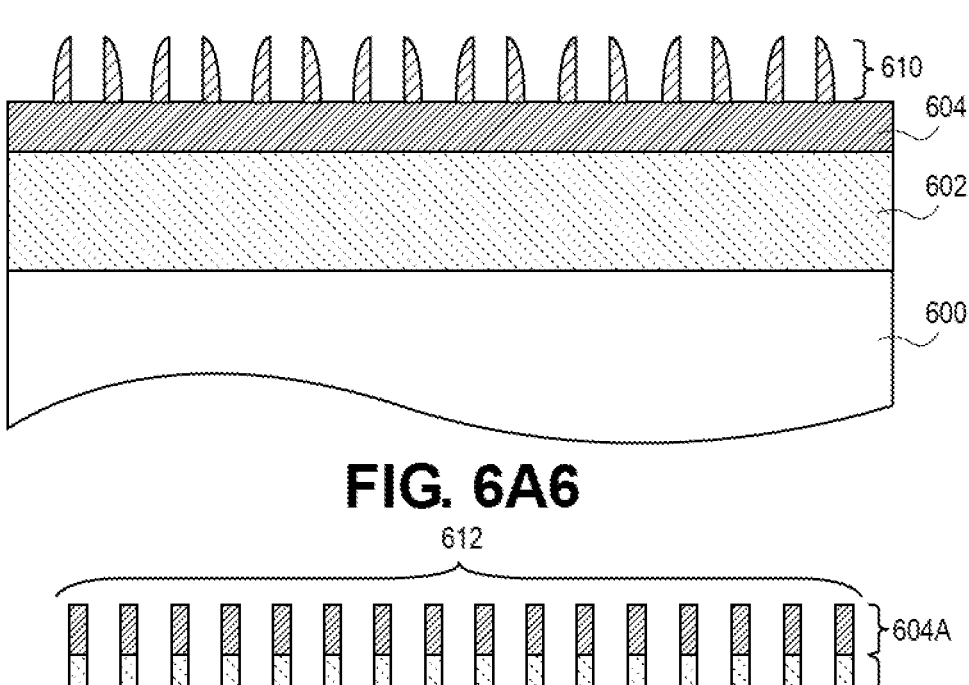
FIG. 6A6
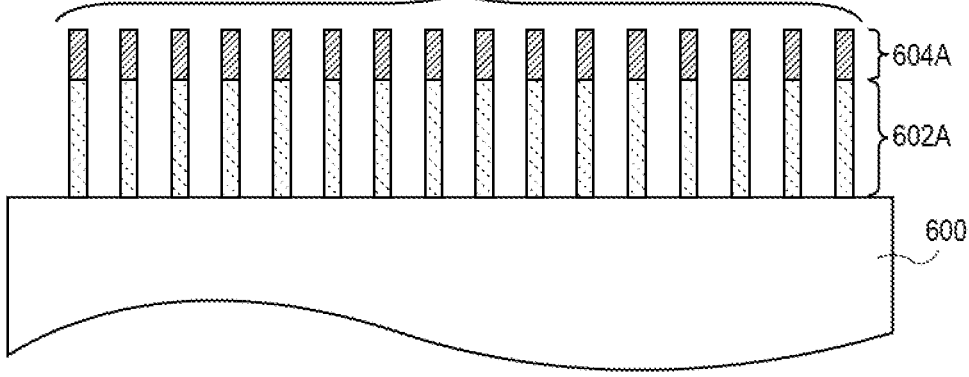
FIG. 6A7

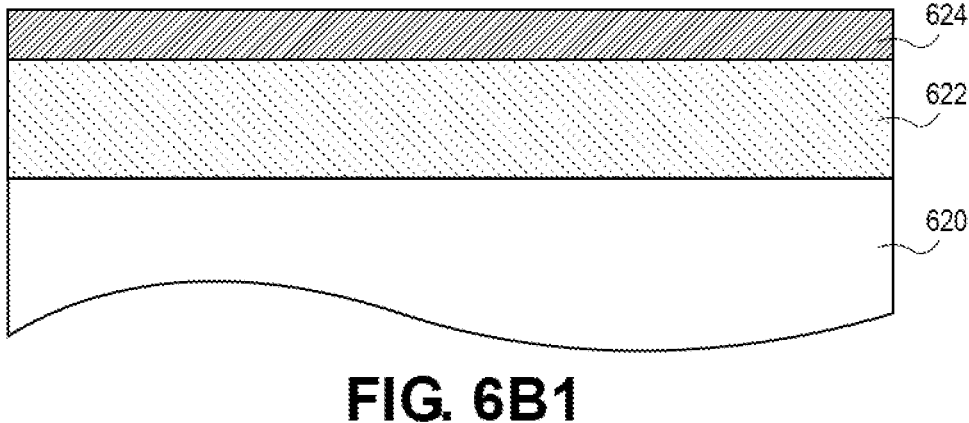
FIG. 6B1
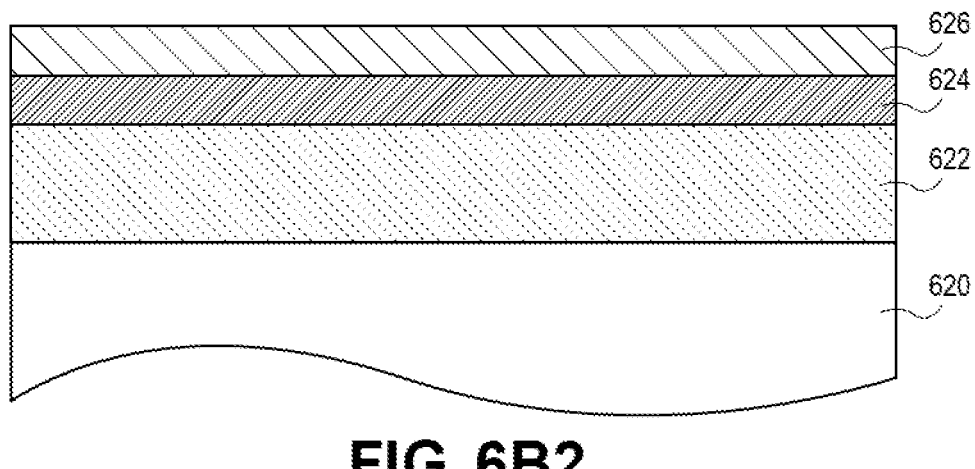
FIG. 6B2

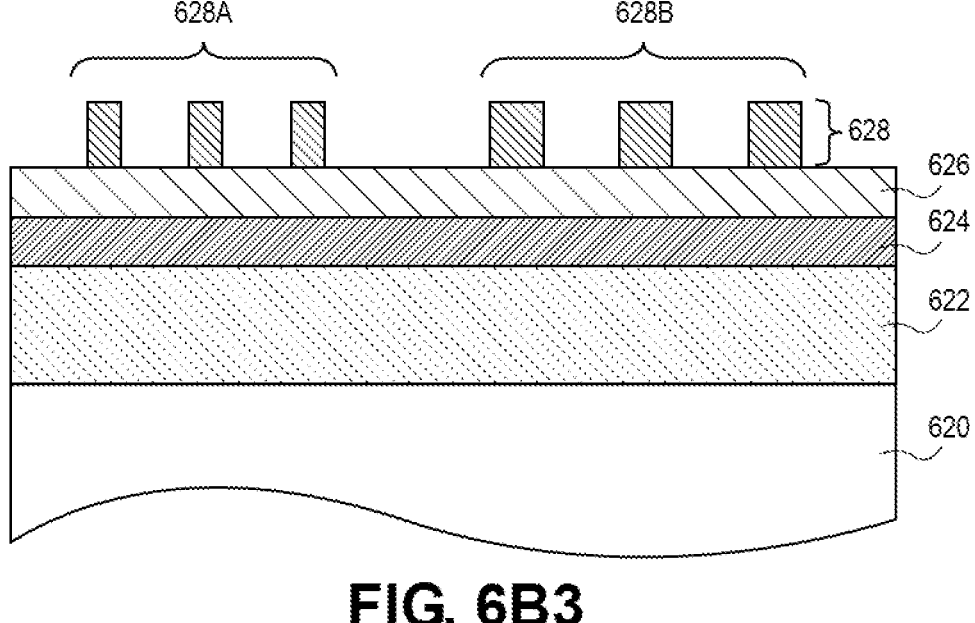
FIG. 6B3
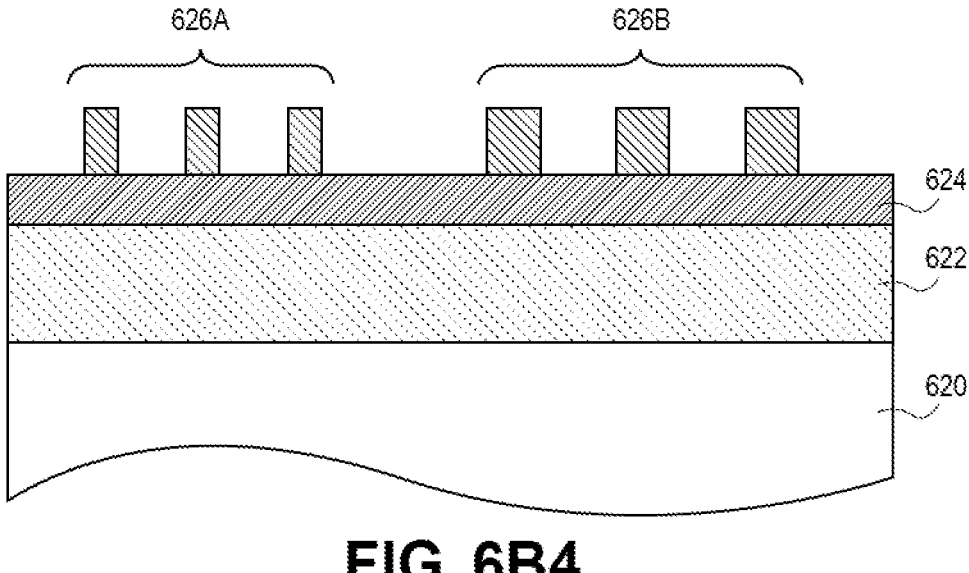
FIG. 6B4

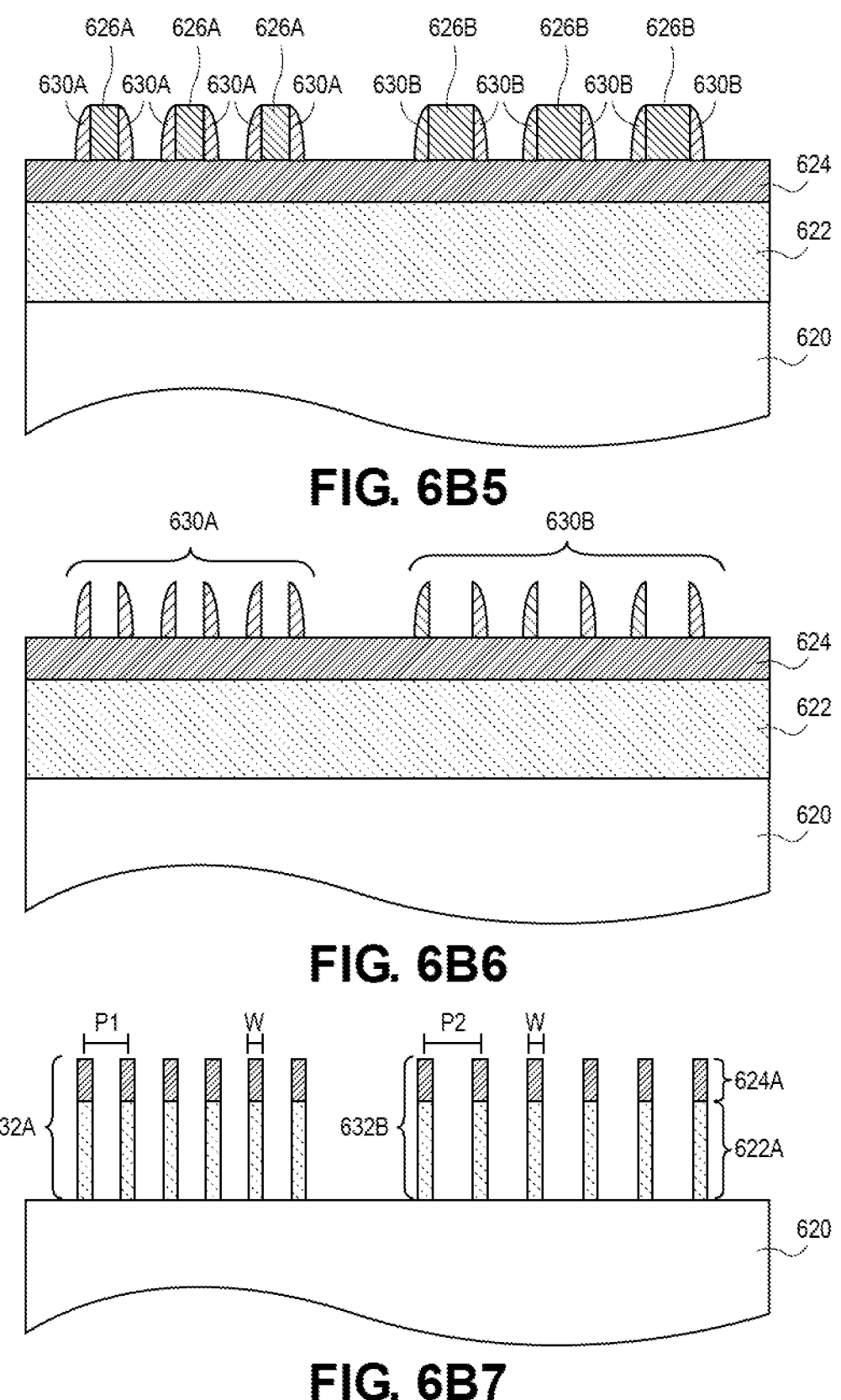
FIG. 6B5
FIG. 6B6
FIG. 6B7

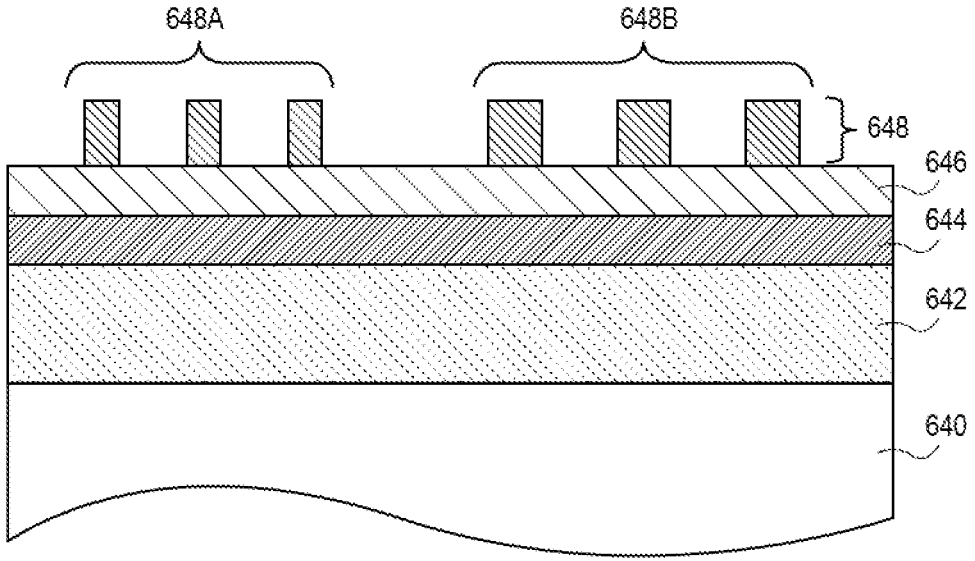
FIG. 6C1
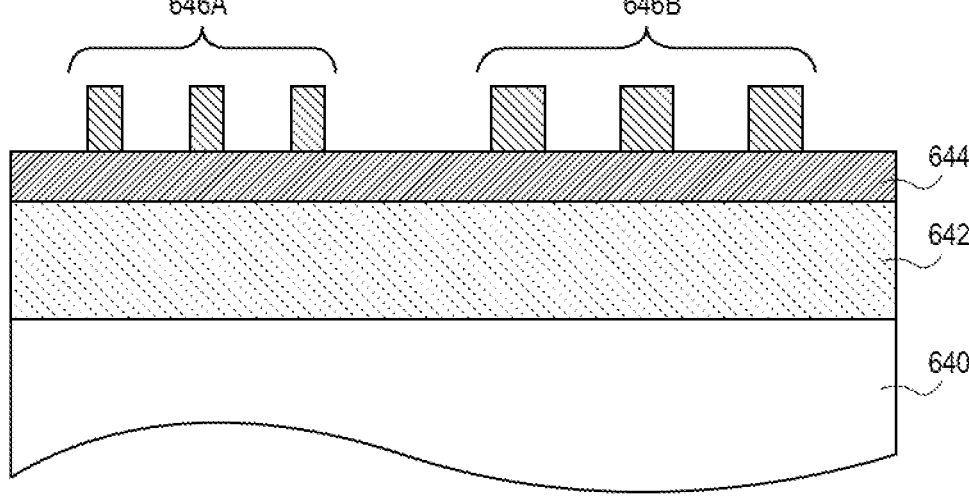
FIG. 6C2

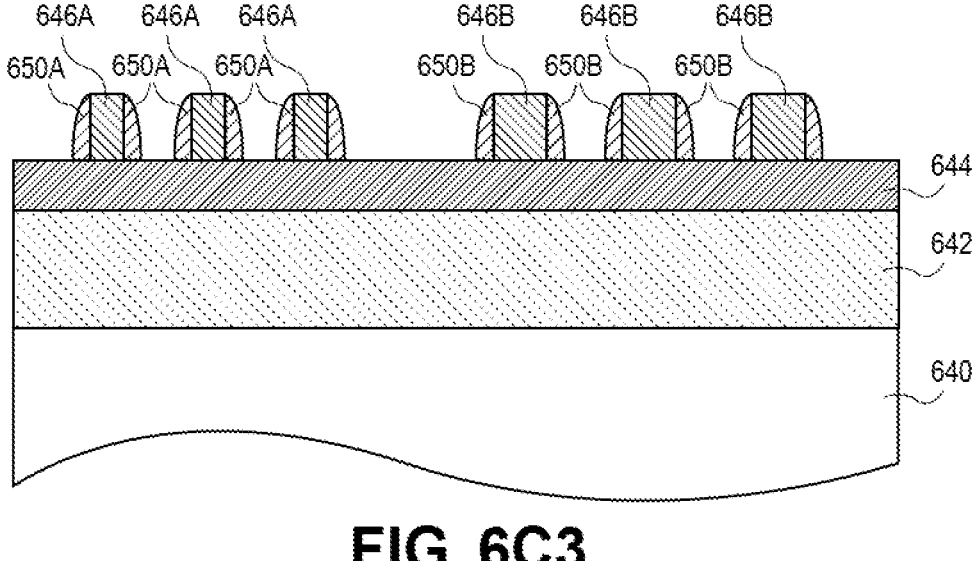
FIG. 6C3
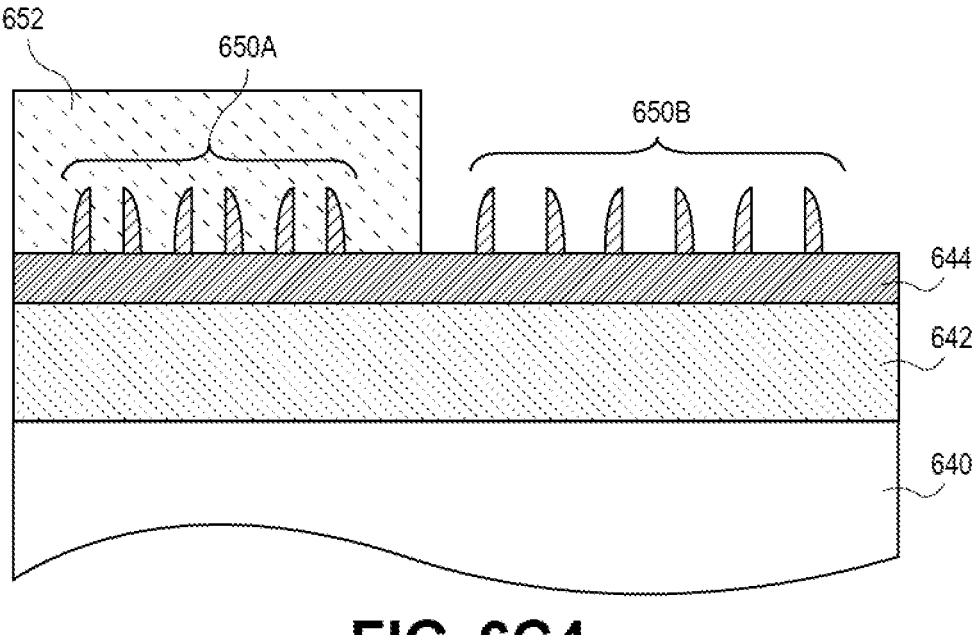
FIG. 6C4

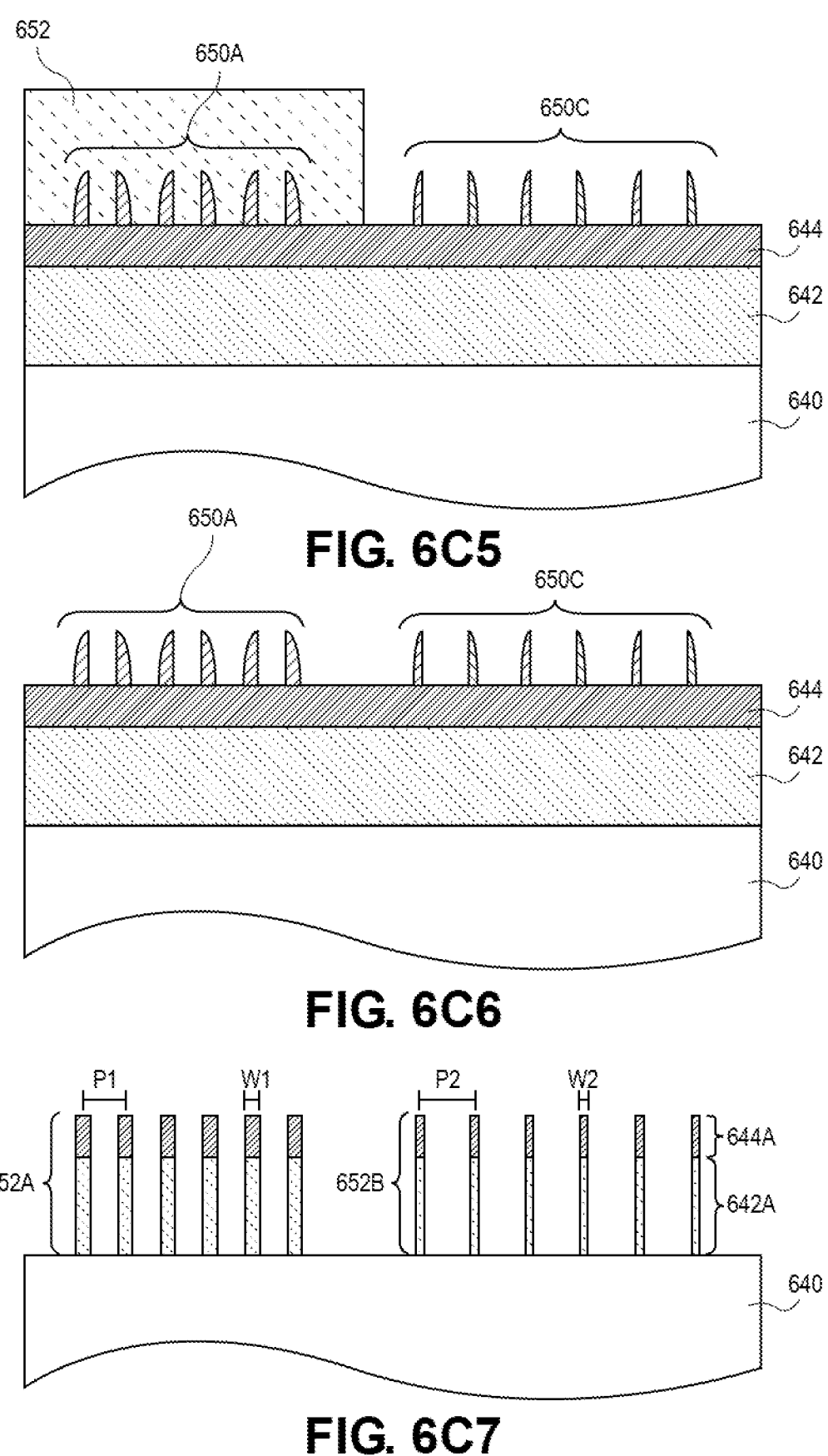
FIG. 6C5
FIG. 6C6
FIG. 6C7

STD VT NMOS                    LOW VT NMOS

STD VT PMOS                    HIGH VT PMOS

DIFFERENT POLY PITCHES FOR ADVANCED INTEGRATED CIRCUIT STRUCTURE FABRICATION

CROSS-REFERENCE TO RELATED APPLICATIONS

This application claims the benefit of U.S. Provisional Application No. 63/072,831, entitled "DIFFERENT POLY PITCHES FOR ADVANCED CIRCUIT STRUCTURE FABRICATION," filed on Aug. 31, 2020, the entire contents of which are hereby incorporated by reference herein.

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 6A1-6A7 illustrate cross-sectional views representing various operations in a method of fabricating a single poly pitch, in accordance with an embodiment of the present disclosure.

FIGS. 6B1-6B7 illustrate cross-sectional views representing various operations in a method of fabricating two poly pitches, in accordance with an embodiment of the present disclosure.

FIGS. 6C1-6C7 illustrate cross-sectional views representing various operations in a method of fabricating two poly pitches, in accordance with an embodiment of the present disclosure.

DESCRIPTION OF THE EMBODIMENTS

Figure 1A:
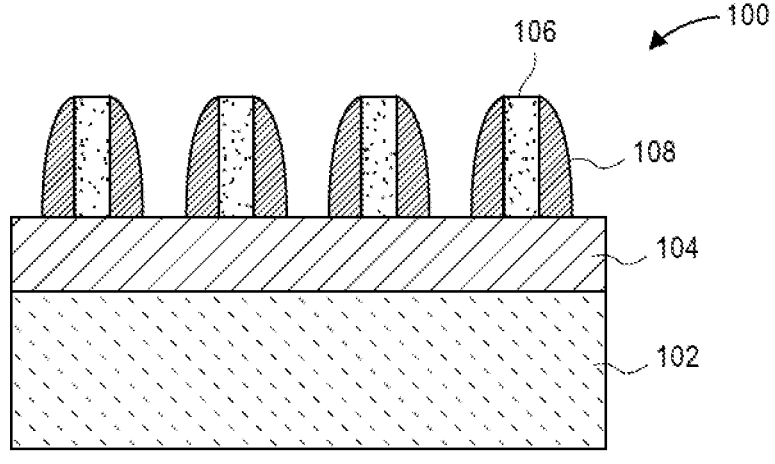
FIG. 1A illustrates a cross-sectional view of an initial structure following deposition, but prior to patterning, of a hardmask material layer formed on an interlayer dielectric (ILD) layer.

Advanced integrated circuit structure fabrication is described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Figure 1B:
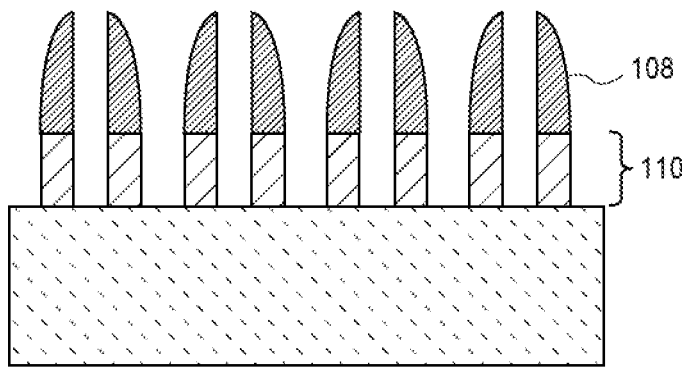
FIG. 1B illustrates a cross-sectional view of the structure of FIG. 1A following patterning of the hardmask layer by pitch halving.

In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through selected lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, for either front-end of line (FEOL) or back-end of line (BEOL), or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

In accordance with one or more embodiments of the present disclosure, a pitch quartering approach is implemented for patterning a semiconductor layer to form semiconductor fins. In one or more embodiments, a merged fin pitch quartering approach is implemented.

Figure 2A:
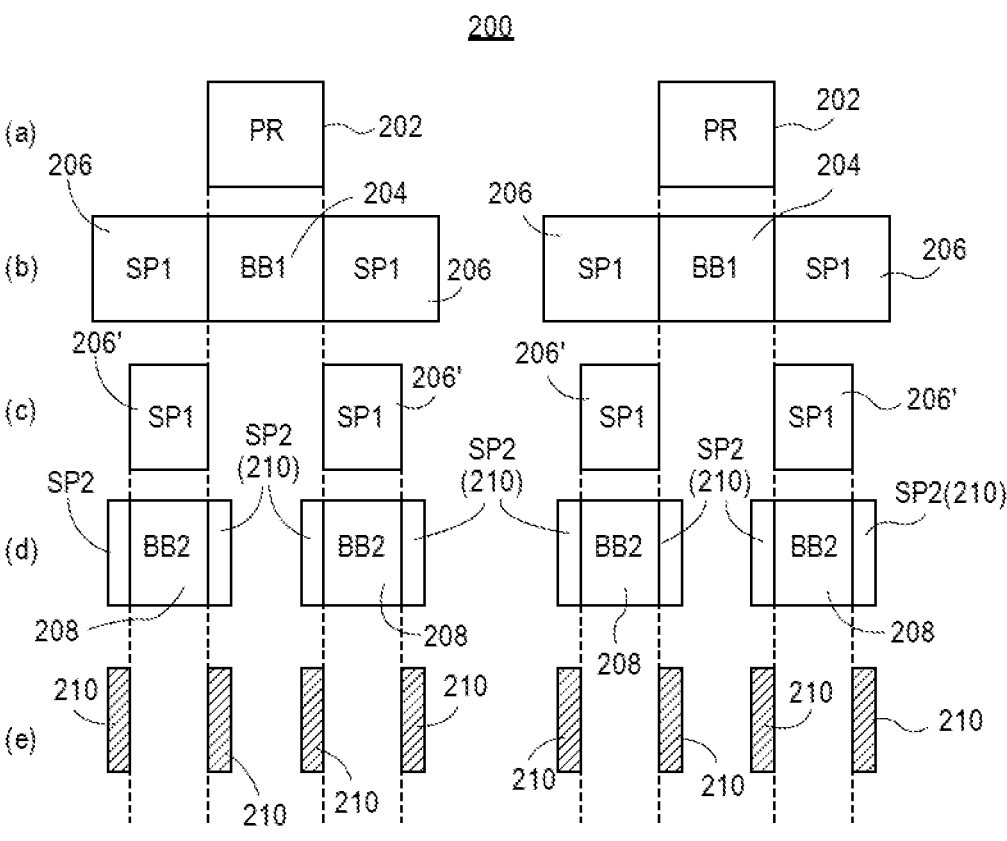
FIG. 2A is a schematic of a pitch quartering approach used to fabricate semiconductor fins, in accordance with an embodiment of the present disclosure.
Figure 2B:
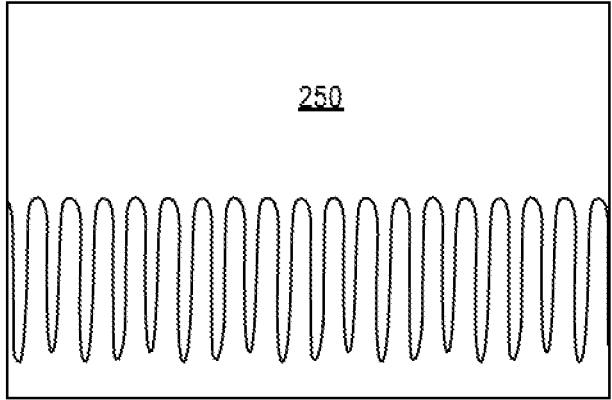
FIG. 2B illustrates a cross-sectional view of semiconductor fins fabricated using a pitch quartering approach, in accordance with an embodiment of the present disclosure.

FIG. 2A is a schematic of a pitch quartering approach 200 used to fabricate semiconductor fins, in accordance with an embodiment of the present disclosure. FIG. 2B illustrates a cross-sectional view of semiconductor fins fabricated using a pitch quartering approach, in accordance with an embodiment of the present disclosure.

Referring to FIG. 2A, at operation (a), a photoresist layer (PR) is patterned to form photoresist features 202. The photoresist features 202 may be patterned using standard lithographic processing techniques, such as 193 immersion lithography. At operation (b), the photoresist features 202 are used to pattern a material layer, such as an insulating or dielectric hardmask layer, to form first backbone (BB1) features 204. First spacer (SP1) features 206 are then formed adjacent the sidewalls of the first backbone features 204. At operation (c), the first backbone features 204 are removed to leave only the first spacer features 206 remaining. Prior to or during the removal of the first backbone features 204, the first spacer features 206 may be thinned to form thinned first spacer features 206', as is depicted in FIG. 2A. This thinning can be performed prior to (as depicted) of after BB1 (feature 204) removal, depending on the required spacing and sizing needed for the BB2 features (208, described below). At operation (d), the first spacer features 206 or the thinned first spacer features 206' are used to pattern a material layer, such as an insulating or dielectric hardmask layer, to form second backbone (BB2) features 208. Second spacer (SP2) features 210 are then formed adjacent the sidewalls of the second backbone features 208. At operation (e), the second backbone features 208 are removed to leave only the second spacer features 210 remaining. The remaining second spacer features 210 may then be used to pattern a semiconductor layer to provide a plurality of semiconductor fins having a pitch quartered dimension relative to the initial patterned photoresist features 202. As an example, referring to FIG. 2B, a plurality of semiconductor fins 250, such as silicon fins formed from a bulk silicon layer, is formed using the second spacer features 210 as a mask for the patterning, e.g., a dry or plasma etch patterning. In the example of FIG. 2B, the plurality of semiconductor fins 250 has essentially a same pitch and spacing throughout.

Figure 3A:
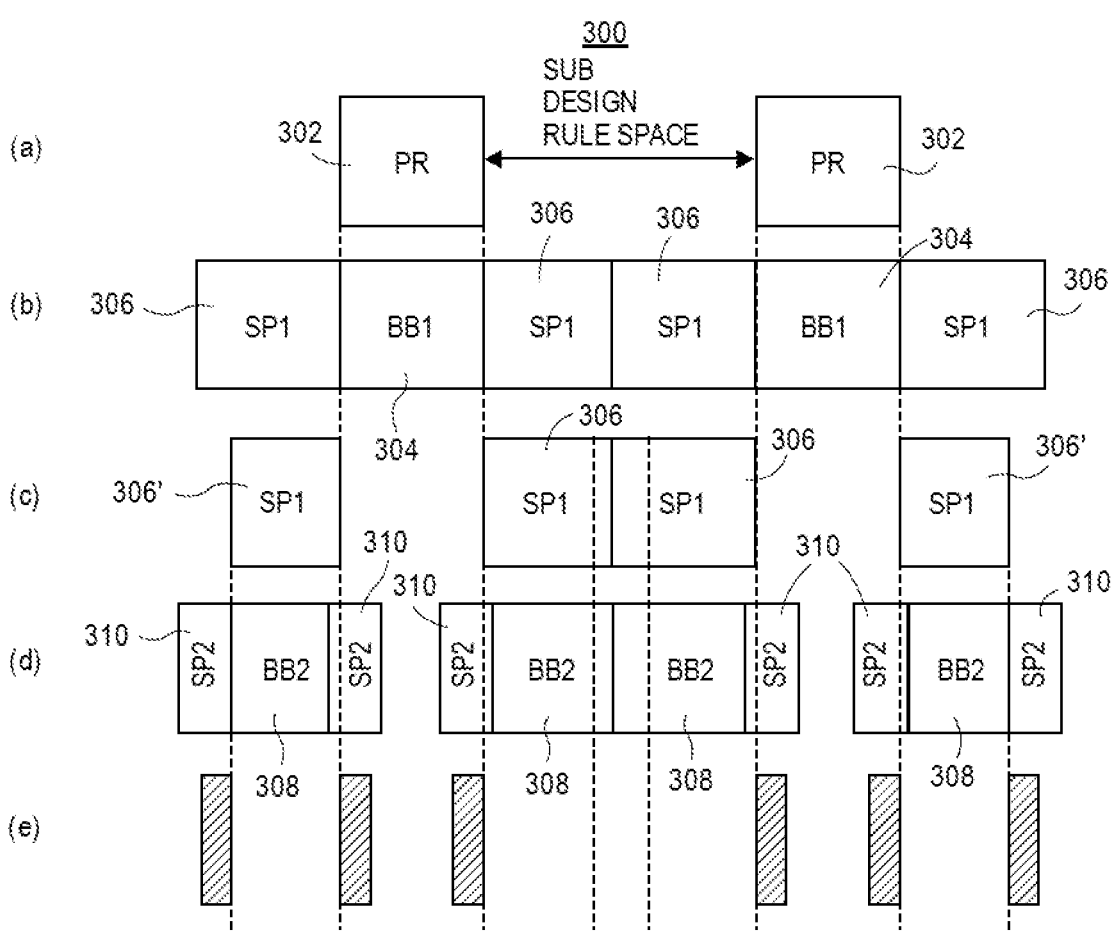
FIG. 3A is a schematic of a merged fin pitch quartering approach used to fabricate semiconductor fins, in accordance with an embodiment of the present disclosure.
Figure 3B:
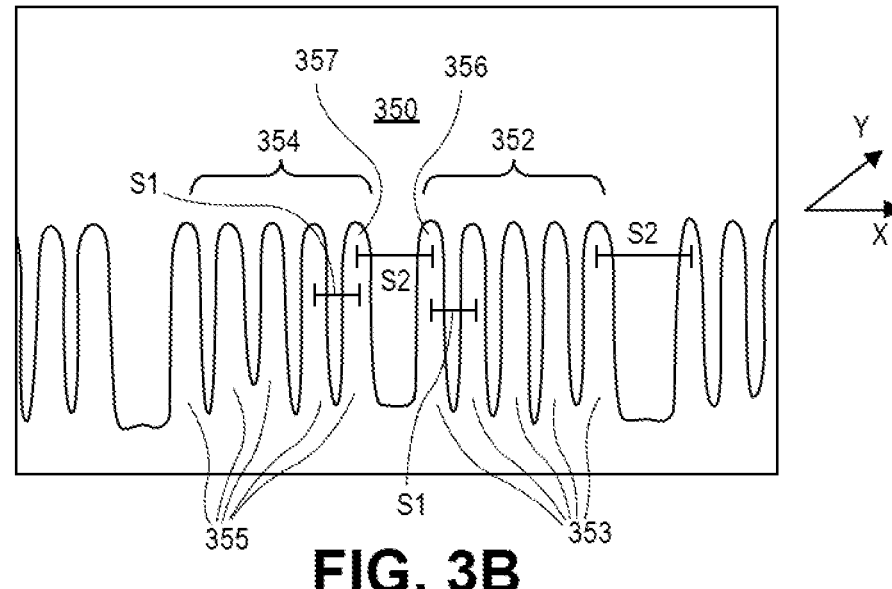
FIG. 3B illustrates a cross-sectional view of semiconductor fins fabricated using a merged fin pitch quartering approach, in accordance with an embodiment of the present disclosure.

It is to be appreciated that the spacing between initially patterned photoresist features can be modified to vary the structural result of the pitch quartering process. In an example, FIG. 3A is a schematic of a merged fin pitch quartering approach 300 used to fabricate semiconductor fins, in accordance with an embodiment of the present disclosure. FIG. 3B illustrates a cross-sectional view of semiconductor fins fabricated using a merged fin pitch quartering approach, in accordance with an embodiment of the present disclosure.

Referring to FIG. 3A, at operation (a), a photoresist layer (PR) is patterned to form photoresist features 302. The photoresist features 302 may be patterned using standard lithographic processing techniques, such as 193 immersion lithography, but at a spacing that may ultimately interfere with design rules required to produce a uniform pitch multiplied pattern (e.g., a spacing referred to as a sub design rule space). At operation (b), the photoresist features 302 are used to pattern a material layer, such as an insulating or dielectric hardmask layer, to form first backbone (BB1) features 304. First spacer (SP1) features 306 are then formed adjacent the sidewalls of the first backbone features 304. However, in contrast to the scheme illustrated in FIG. 2A, some of the adjacent first spacer features 306 are merged spacer features as a result of the tighter photoresist features 302. At operation (c), the first backbone features 304 are removed to leave only the first spacer features 306 remaining. Prior to or after the removal of the first backbone features 304, some of the first spacer features 306 may be thinned to form thinned first spacer features 306', as is depicted in FIG. 3A. At operation (d), the first spacer features 306 and the thinned first spacer features 306' are used to pattern a material layer, such as an insulating or dielectric hardmask layer, to form second backbone (BB2) features 308. Second spacer (SP2) features 310 are then formed adjacent the sidewalls of the second backbone features 308. However, in locations where BB2 features 308 are merged features, such as at the central BB2 features 308 of FIG. 3A, second spacers are not formed. At operation (e), the second backbone features 308 are removed to leave only the second spacer features 310 remaining. The remaining second spacer features 310 may then be used to pattern a semiconductor layer to provide a plurality of semiconductor fins having a pitch quartered dimension relative to the initial patterned photoresist features 302.

As an example, referring to FIG. 3B, a plurality of semiconductor fins 350, such as silicon fins formed from a bulk silicon layer, is formed using the second spacer features 310 as a mask for the patterning, e.g., a dry or plasma etch patterning. In the example of FIG. 3B, however, the plurality of semiconductor fins 350 has a varied pitch and spacing. Such a merged fin spacer patterning approach may be implemented to essentially eliminate the presence of a fin in certain locations of a pattern of a plurality of fins. Accordingly, merging the first spacer features 306 in certain locations allows for the fabrication of six or four fins with based on two first backbone features 304, which typically generate eight fins, as described in association with FIGS. 2A and 2B. In one example, in board fins have a tighter pitch than would normally be allowed by creating the fins at uniform pitch and then cutting the unneeded fins, although the latter approach may still be implemented in accordance with embodiments described herein.

In an exemplary embodiment, referring to FIG. 3B, an integrated circuit structure, a first plurality of semiconductor fins 352 has a longest dimension along a first direction (y, into the page). Adjacent individual semiconductor fins 353 of the first plurality of semiconductor fins 352 are spaced apart from one another by a first amount (S1) in a second direction (x) orthogonal to the first direction y. A second plurality of semiconductor fins 354 has a longest dimension along the first direction y. Adjacent individual semiconductor fins 355 of the second plurality of semiconductor fins 354 are spaced apart from one another by the first amount (S1) in the second direction. Closest semiconductor fins 356 and 357 of the first plurality of semiconductor fins 352 and the second plurality of semiconductor fins 354, respectively, are spaced apart from one another by a second amount (S2) in the second direction x. In an embodiment, the second amount S2 is greater than the first amount S1 but less than twice the first amount S1. In another embodiment, the second amount S2 is more than two times the first amount S1.

In one embodiment, the first plurality of semiconductor fins 352 and the second plurality of semiconductor fins 354 include silicon. In one embodiment, the first plurality of semiconductor fins 352 and the second plurality of semiconductor fins 354 are continuous with an underlying monocrystalline silicon substrate. In one embodiment, individual ones of the first plurality of semiconductor fins 352 and the second plurality of semiconductor fins 354 have outwardly tapering sidewalls along the second direction x from a top to a bottom of individual ones of the first plurality of semiconductor fins 352 and the second plurality of semiconductor fins 354. In one embodiment, the first plurality of semiconductor fins 352 has exactly five semiconductor fins, and the second plurality of semiconductor fins 354 has exactly five semiconductor fins.

In another exemplary embodiment, referring to FIGS. 3A and 3B, a method of fabricating an integrated circuit structure includes forming a first primary backbone structure 304 (left BB1) and a second primary backbone structure 304 (right BB1). Primary spacer structures 306 are formed adjacent sidewalls of the first primary backbone structure 304 (left BB1) and the second primary backbone structure 304 (right BB1) Primary spacer structures 306 between the first primary backbone structure 304 (left BB1) and the second primary backbone structure 304 (right BB1) are merged. The first primary backbone structure (left BB1) and the second primary backbone structure (right BB1) are removed, and first, second, third and fourth secondary backbone structures 308 are provided. The second and third secondary backbone structures (e.g., the central pair of the secondary backbone structures 308) are merged. Secondary spacer structures 310 are formed adjacent sidewalls of the first, second, third and fourth secondary backbone structures 308. The first, second, third and fourth secondary backbone structures 308 are then removed. A semiconductor material is then patterned with the secondary spacer structures 310 to form semiconductor fins 350 in the semiconductor material.

In one embodiment, the first primary backbone structure 304 (left BB1) and the second primary backbone structure 304 (right BB1) are patterned with a sub-design rule spacing between the first primary backbone structure and the second primary backbone structure. In one embodiment, the semiconductor material includes silicon. In one embodiment, individual ones of the semiconductor fins 350 have outwardly tapering sidewalls along the second direction x from a top to a bottom of individual ones of the semiconductor fins 350. In one embodiment, the semiconductor fins 350 are continuous with an underlying monocrystalline silicon substrate. In one embodiment, patterning the semiconductor material with the secondary spacer structures 310 includes forming a first plurality of semiconductor fins 352 having a longest dimension along a first direction y, where adjacent individual semiconductor fins of the first plurality of semiconductor fins 352 are spaced apart from one another by a first amount S1 in a second direction x orthogonal to the first direction y. A second plurality of semiconductor fins 354 is formed having a longest dimension along the first direction y, where adjacent individual semiconductor fins of the second plurality of semiconductor fins 354 are spaced apart from one another by the first amount S1 in the second direction x. Closest semiconductor fins 356 and 357 of the first plurality of semiconductor fins 352 and the second plurality of semiconductor fins 354, respectively, are spaced apart from one another by a second amount S2 in the second direction x. In an embodiment, the second amount S2 is greater than the first amount S1. In one such embodiment, the second amount S2 is less than twice the first amount S1. In another such embodiment, the second amount S2 is more than two times but less than three times greater than the first amount S1. In an embodiment, the first plurality of semiconductor fins 352 has exactly five semiconductor fins, and the second plurality of semiconductor fins 254 has exactly five semiconductor fins, as is depicted in FIG. 3B.

In another aspect, it is to be appreciated that a fin trim process, where fin removal is performed as an alternative to a merged fin approach, fins may be trimmed (removed) during hardmask patterning or by physically removing the fin. As an example, of the latter approach, FIGS. 4A-4C cross-sectional views representing various operations in a method of fabricating a plurality of semiconductor fins, in accordance with an embodiment of the present disclosure.

Figure 4A:
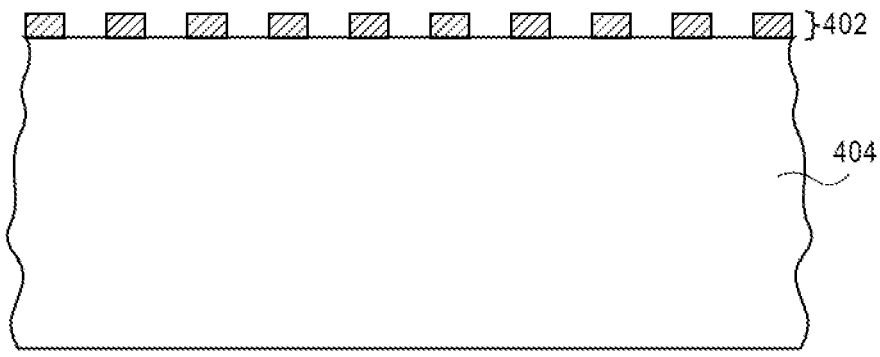
FIGS. 4A-4C illustrate cross-sectional views representing various operations in a method of fabricating a plurality of semiconductor fins, in accordance with an embodiment of the present disclosure.
Figure 4B:
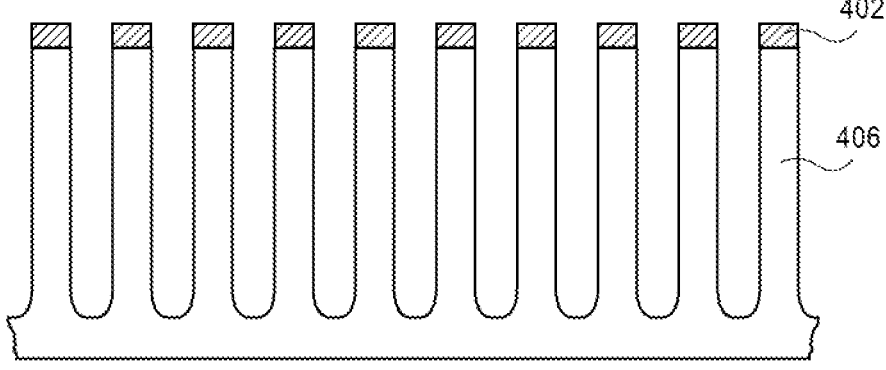
Figure 4C:
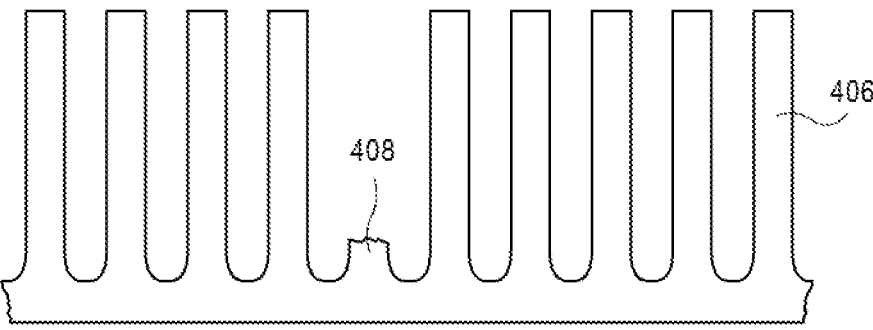

Referring to FIG. 4A, a patterned hardmask layer 402 is formed above a semiconductor layer 404, such as a bulk single crystalline silicon layer. Referring to FIG. 4B, fins 406 are then formed in the semiconductor layer 404, e.g., by a dry or plasma etch process. Referring to FIG. 4C, select fins 406 are removed, e.g., using a masking and etch process. In the example shown, one of the fins 406 is removed and may leave a remnant fin stub 408, as is depicted in FIG. 4C. In such a "fin trim last" approach, the hardmask 402 is patterned as whole to provide a grating structure without removal or modification of individual features. The fin population is not modified until after fins are fabricated.

In another aspect, a multi-layer trench isolation region, which may be referred to as a shallow trench isolation (STI) structure, may be implemented between semiconductor fins. In an embodiment, a multi-layer STI structure is formed between silicon fins formed in a bulk silicon substrate to define sub-fin regions of the silicon fins.

It may be desirable to use bulk silicon for fins or trigate based transistors. However, there is a concern that regions (sub-fin) below the active silicon fin portion of the device (e.g., the gate-controlled region, or HSi) is under diminished or no gate control. As such, if source or drain regions are at or below the HSi point, then leakage pathways may exist through the sub-fin region. It may be the case that leakage pathways in the sub-fin region should be controlled for proper device operation.

One approach to addressing the above issues have involved the use of well implant operations, where the sub-fin region is heavily doped (e.g., much greater than $2E18/cm^3$), which shuts off sub-fin leakage but leads to substantial doping in the fin as well. The addition of halo implants further increases fin doping such that end of line fins are doped at a high level (e.g., greater than approximately $1E18/cm^3$).

Another approach involves doping provided through sub-fin doping without necessarily delivering the same level of doping to the HSi portions of the fins. Processes may involve selectively doping sub-fin regions of tri-gate or FinFET transistors fabricated on bulk silicon wafers, e.g., by way of tri-gate doped glass sub-fin out-diffusion. For example, selectively doping a sub-fin region of tri-gate or FinFET transistors may mitigate sub-fin leakage while simultaneously keeping fin doping low. Incorporation of a solid state doping sources (e.g., p-type and n-type doped oxides, nitrides, or carbides) into the transistor process flow, which after being recessed from the fin sidewalls, delivers well doping into the sub-fin region while keeping the fin body relatively undoped.

Thus, process schemes may include the use of a solid source doping layer (e.g. boron doped oxide) deposited on fins subsequent to fin etch. Later, after trench fill and polish, the doping layer is recessed along with the trench fill material to define the fin height (HSi) for the device. The operation removes the doping layer from the fin sidewalls above HSi. Therefore, the doping layer is present only along the fin sidewalls in the sub-fin region which ensures precise control of doping placement. After a drive-in anneal, high doping is limited to the sub-fin region, quickly transitioning to low doping in the adjacent region of the fin above HSi (which forms the channel region of the transistor). In general, borosilicate glass (BSG) is implemented for NMOS fin doping, while a phosphosilicate (PSG) or arsenic-silicate glass (AsSG) layer is implemented for PMOS fin doping. In one example, such a P-type solid state dopant source layer is a BSG layer having a boron concentration approximately in the range of 0.1-10 weight %. In a another example, such an N-type solid state dopant source layer is a PSG layer or an AsSG layer having a phosphorous or arsenic, respectively, concentration approximately in the range of 0.1-10 weight %. A silicon nitride capping layer may be included on the doping layer, and a silicon dioxide or silicon oxide fill material may then be included on the silicon nitride capping layer.

In accordance with another embodiment of the present disclosure, sub fin leakage is sufficiently low for relatively thinner fins (e.g., fins having a width of less than approximately 20 nanometers) where an undoped or lightly doped silicon oxide or silicon dioxide film is formed directly adjacent a fin, a silicon nitride layer is formed on the undoped or lightly doped silicon oxide or silicon dioxide film, and a silicon dioxide or silicon oxide fill material is included on the silicon nitride capping layer. It is to be appreciated that doping, such as halo doping, of the sub-fin regions may also be implemented with such a structure.

Figure 5A:
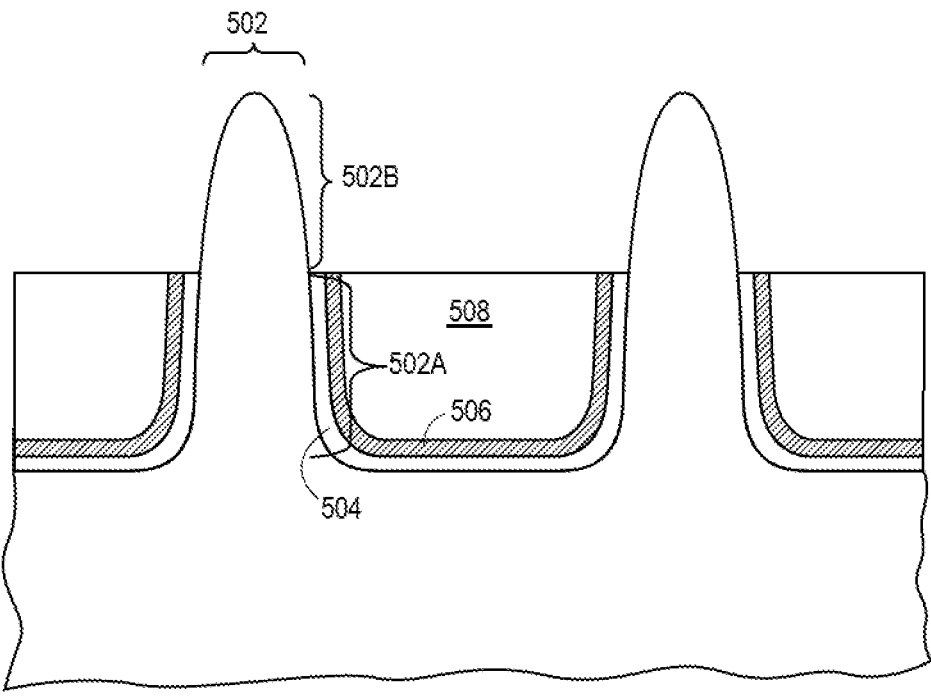
FIG. 5A illustrates a cross-sectional view of a pair of semiconductor fins separated by a three-layer trench isolation structure, in accordance with an embodiment of the present disclosure.

FIG. 5A illustrates a cross-sectional view of a pair of semiconductor fins separated by a three-layer trench isolation structure, in accordance with an embodiment of the present disclosure.

Referring to FIG. 5A, an integrated circuit structure includes a fin 502, such as a silicon fin. The fin 502 has a lower fin portion (sub-fin) 502A and an upper fin portion 502B (Hsi). A first insulating layer 504 is directly on sidewalls of the lower fin portion 502A of the fin 502. A second insulating layer 506 is directly on the first insulating layer 504 directly on the sidewalls of the lower fin portion 502A of the fin 502. A dielectric fill material 508 is directly laterally adjacent to the second insulating layer 506 directly on the first insulating layer 504 directly on the sidewalls of the lower fin portion 502A of the fin 502.

In an embodiment, the first insulating layer 504 is a non-doped insulating layer including silicon and oxygen, such as a silicon oxide or silicon dioxide insulating layer. In an embodiment, the first insulating layer 504 includes silicon and oxygen and has no other atomic species having an atomic concentration greater than 1E15 atoms per cubic centimeter. In an embodiment, the first insulating layer 504 has a thickness in the range of 0.5-2 nanometers.

In an embodiment, the second insulating layer 506 includes silicon and nitrogen, such as a stoichiometric $Si_3N_4$ silicon nitride insulating layer, a silicon-rich silicon nitride insulating layer, or a silicon-poor silicon nitride insulating layer. In an embodiment, the second insulating layer 506 has a thickness in the range of 2-5 nanometers.

In an embodiment, the dielectric fill material 508 includes silicon and oxygen, such as a silicon oxide or silicon dioxide insulating layer. In an embodiment, a gate electrode is ultimately formed over a top of and laterally adjacent to sidewalls of the upper fin portion 502B of the fin 502.

It is to be appreciated that during processing, upper fin portions of semiconductor fins may be eroded or consumed. Also, trench isolation structures between fins may also become eroded to have non-planar topography or may be formed with non-planar topography up fabrication. As an example, FIG. 5B illustrates a cross-sectional view of another pair of semiconductor fins separated by another three-layer trench isolation structure, in accordance with another embodiment of the present disclosure.

Figure 5B:
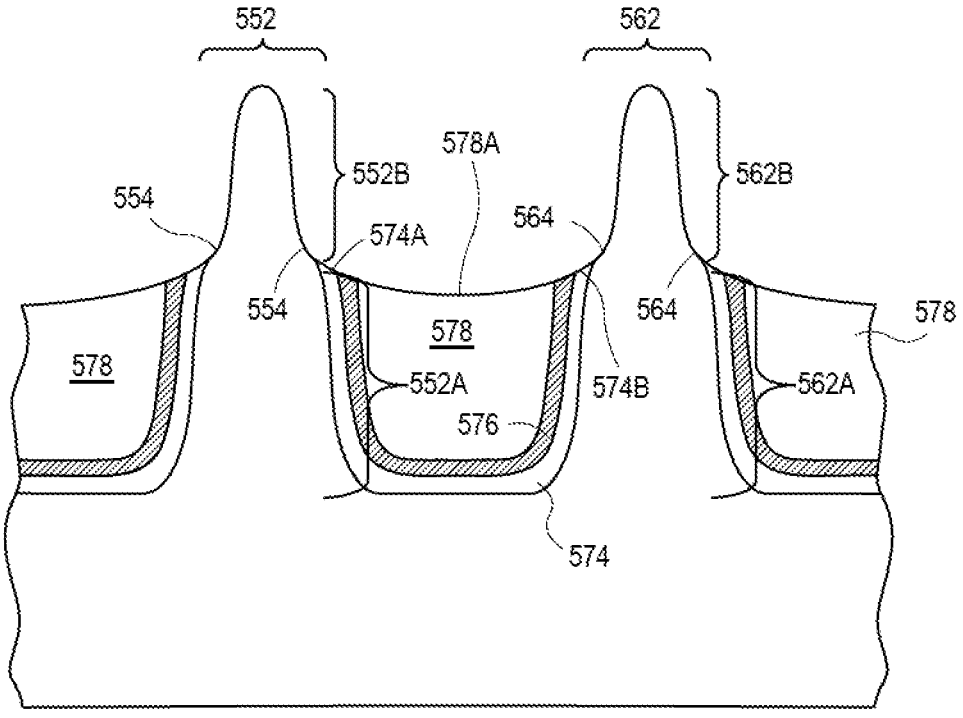
FIG. 5B illustrates a cross-sectional view of another pair of semiconductor fins separated by another three-layer trench isolation structure, in accordance with another embodiment of the present disclosure.

Referring to FIG. 5B, an integrated circuit structure includes a first fin 552, such as a silicon fin. The first fin 552 has a lower fin portion 552A and an upper fin portion 552B and a shoulder feature 554 at a region between the lower fin portion 552A and the upper fin portion 552B. A second fin 562, such as a second silicon fin, has a lower fin portion 562A and an upper fin portion 562B and a shoulder feature 564 at a region between the lower fin portion 562A and the upper fin portion 562B. A first insulating layer 574 is directly on sidewalls of the lower fin portion 552A of the first fin 552 and directly on sidewalls of the lower fin portion 562A of the second fin 562. The first insulating layer 574 has a first end portion 574A substantially co-planar with the shoulder feature 554 of the first fin 552, and the first insulating layer 574 further has a second end portion 574B substantially co-planar with the shoulder feature 564 of the second fin 562. A second insulating layer 576 is directly on the first insulating layer 574 directly on the sidewalls of the lower fin portion 552A of the first fin 552 and directly on the sidewalls of the lower fin portion 562A of the second fin 562.

A dielectric fill material 578 is directly laterally adjacent to the second insulating layer 576 directly on the first insulating layer 574 directly on the sidewalls of the lower fin portion 552A of the first fin 552 and directly on the sidewalls of the lower fin portion 562A of the second fin 562. In an embodiment, the dielectric fill material 578 has an upper surface 578A, where a portion of the upper surface 578A of the dielectric fill material 578 is below at least one of the shoulder features 554 of the first fin 552 and below at least one of the shoulder features 564 of the second fin 562, as is depicted in FIG. 5B.

In an embodiment, the first insulating layer 574 is a non-doped insulating layer including silicon and oxygen, such as a silicon oxide or silicon dioxide insulating layer. In an embodiment, the first insulating layer 574 includes silicon and oxygen and has no other atomic species having an atomic concentration greater than 1E15 atoms per cubic centimeter. In an embodiment, the first insulating layer 574 has a thickness in the range of 0.5-2 nanometers.

In an embodiment, the second insulating layer 576 includes silicon and nitrogen, such as a stoichiometric $Si_3N_4$ silicon nitride insulating layer, a silicon-rich silicon nitride insulating layer, or a silicon-poor silicon nitride insulating layer. In an embodiment, the second insulating layer 576 has a thickness in the range of 2-5 nanometers.

In an embodiment, the dielectric fill material 578 includes silicon and oxygen, such as a silicon oxide or silicon dioxide insulating layer. In an embodiment, a gate electrode is ultimately formed over a top of and laterally adjacent to sidewalls of the upper fin portion 552B of the first fin 552, and over a top of and laterally adjacent to sidewalls of the upper fin portion 562B of the second fin 562. The gate electrode is further over the dielectric fill material 578 between the first fin 552 and the second fin 562.

In another aspect, leading edge CMOS technology nodes have a high performance transistor library that runs with high density and best possible performance. A key metric to achieve high transistor density is the minimum contacted poly (gate) pitch. Decreasing minimum contacted poly pitch increases density, but typically degrades transistor performance.

Recent leading edge CMOS technology nodes have tended to have a uniform poly pitch for all logic applications. Sometimes, wider poly pitches have been provided to enable analog functionality, but logic applications have been forced to a single poly pitch.

In accordance with one or more embodiments of the present disclosure, two different poly pitches are included on the same die for high performance, high density applications, e.g., for logic applications. In one embodiment, there is a 54 nm poly pitch transistor library, with best-available density, and a 60 nm poly pitch transistor library, which provides significant performance improvement at a small area penalty. By making both transistors available to product customers, designers can select the best type of transistor for circuits or subsystems in a microprocess or system-on-a-chip.

As a comparative example of using pitch division with a uniform grid to form poly gates, FIGS. 6A1-6A7 illustrate cross-sectional views representing various operations in a method of fabricating a single poly (gate) pitch, in accordance with an embodiment of the present disclosure.

Referring to FIG. 6A1, a gate material 602, such as a dummy polysilicon gate material, is formed above a substrate 600, such as over a pattern of fins described above. A hardmask 604, such as a silicon nitride hardmask, is formed on the gate material 602.

Referring to FIG. 6A2, a backbone material 606 is formed on the hardmask 604.

Referring to FIG. 6A3, lithography is used to form a patterned resist mask 608 on the backbone material 606. The patterned resist mask 608 includes features that are to be transferred to the backbone material 606.

Referring to FIG. 6A4, the pattern of the features of the patterned mask 608 is transferred into the backbone material 606, e.g., by an etch process, to form patterned backbone material 606A. The patterned resist mask 608 is removed.

Referring to FIG. 6A5, spacers 610 are formed along sidewalls of the features of the patterned backbone material 606A. The spacers 610 may be formed by blanket deposition followed by anisotropic etching in a process that may be referred to as a spacerizing the backbone.

Referring to FIG. 6A6, the patterned backbone material 606A is removed. The spacers 610 remain on the hardmask 604.

Referring to FIG. 6A7, the spacers 610 are used as a mask during etching of the hardmask 604 and the gate material 602. The spacers 610 are then removed to leave structures 612 of patterned gate material 602A having patterned hardmask 604A thereon. The structures 612 may ultimately be used in a replacement gate process, such as described below. The structures 612 have a uniform gate pitch and, as such, in an embodiment, ultimately formed permanent gate stacks have a uniform gate pitch.

As an example of adjusting the backbone dimensions to achieve desired variable poly pitch, FIGS. 6B1-6B7 illustrate cross-sectional views representing various operations in a method of fabricating two poly (gate) pitches, in accordance with an embodiment of the present disclosure. The process may be implemented to realize multiple logic pitches. In one embodiment, the difference in poly pitch offered for two logic libraries can be anywhere from a 5% increase to a 25% increase over the minimum poly pitch. This is in contrast to a wide poly pitch library offered for analog process, which is typically an increase in poly pitch from 50% to 250% over the minimum poly pitch.

Referring to FIG. 6B1, a gate material 622, such as a dummy polysilicon gate material, is formed above a substrate 620, such as over a pattern of fins described above. A hardmask 624, such as a silicon nitride hardmask, is formed on the gate material 622.

Referring to FIG. 6B2, a backbone material 626 is formed on the hardmask 624.

Referring to FIG. 6B3, lithography is used to form a patterned resist mask 628 on the backbone material 626. The patterned resist mask 628 includes features that are to be transferred to the backbone material 626. In one embodiment, the patterned resist mask 628 includes features 628A having a first pitch, and features 628B having a second pitch greater than the first pitch.

Referring to FIG. 6B4, the pattern of the features 628A and 628B of the patterned mask 628 is transferred into the backbone material 626, e.g., by an etch process, to form patterned backbone material having features 626A and 626B. The patterned resist mask 628 is removed.

Referring to FIG. 6B5, spacers 630A are formed along sidewalls of the features 626A of the patterned backbone material, and spacers 630B are formed along sidewalls of the features 626B of the patterned backbone material. The spacers 630A and 630B may be formed by blanket deposition followed by anisotropic etching in a process that may be referred to as a spacerizing the backbone.

Referring to FIG. 6B6, the features 626A and 626B of the patterned backbone material are removed. The spacers 630A and 630B remain on the hardmask 624.

Referring to FIG. 6B7, the spacers 630A and 630B are used as a mask during etching of the hardmask 624 and the gate material 622. The spacers 630A and 630B are then removed to leave structures 632A and 632B of patterned gate material 622A having patterned hardmask 624A thereon. The structures 632A and 632B may ultimately be used in a replacement gate process, such as described below, to form permanent gate stacks having the same dimensions as the structures 632A and 632B.

In an embodiment, the structures 632A have a first pitch (P1), and the structures 632B have a second pitch (P2). In one such embodiment, the first pitch (P1) is less than the second pitch (P2), as is depicted. In a specific such embodiment, the first pitch is about 54 nm, and the second pitch (P2) is about 60 nm. In an embodiment, the structures 632A have a width (W) the same as a width (W) of the structures 632B.

It may be desirable to finely tune the difference in poly CD between the poly pitch libraries. It may be desirable to have a small difference in poly CD between two different libraries, or may be desirable to have exactly the same poly CD for the same libraries. Such tuning can be achieved by adjusting the characteristics of the etches that transfer the spacer pattern into the poly hardmask and poly silicon. This tuning can also be achieved by using a dedicated trim operation, an example of which is described below.

As an exemplary flow including a trim step, FIGS. 6C1-6C7 illustrate cross-sectional views representing various operations in a method of fabricating two poly (gate) pitches, in accordance with an embodiment of the present disclosure.

Referring to FIG. 6C1, a gate material 642, such as a dummy polysilicon gate material, is formed above a substrate 640, such as over a pattern of fins described above. A hardmask 644, such as a silicon nitride hardmask, is formed on the gate material 642. A backbone material 646 is formed on the hardmask 644. Lithography is used to form a patterned resist mask 648 on the backbone material 646. The patterned resist mask 648 includes features that are to be transferred to the backbone material 646. In one embodiment, the patterned resist mask 648 includes features 648A having a first pitch, and features 648B having a second pitch greater than the first pitch.

Referring to FIG. 6C2, the pattern of the features 648A and 648B of the patterned mask 648 is transferred into the backbone material 646, e.g., by an etch process, to form patterned backbone material having features 646A and 646B. The patterned resist mask 648 is removed.

Referring to FIG. 6C3, spacers 650A are formed along sidewalls of the features 646A of the patterned backbone material, and spacers 650B are formed along sidewalls of the features 646B of the patterned backbone material. The spacers 650A and 650B may be formed by blanket deposition followed by anisotropic etching in a process that may be referred to as a spacerizing the backbone.

Referring to FIG. 6C4, the features 646A and 646B of the patterned backbone material are removed. The spacers 650A and 650B remain on the hardmask 644. A trim resist 652 is formed over the spacers 650A, exposing the spacers 650B. It is to be appreciated that the trim resist 652 can alternatively be formed over the spacers 650B, exposing the spacers 650A.

Referring to FIG. 6C5, the exposed spacers 650B are subjected to an isotropic etch to reduce the width of the spacers, forming spacers 650C.

Referring to FIG. 6C6, the trim resist 652 is removed, re-exposing spacers 650A.

Referring to FIG. 6C7, the spacers 650A and 650C are used as a mask during etching of the hardmask 644 and the gate material 642. The spacers 650A and 650C are then removed to leave structures 652A and 652B of patterned gate material 642A having patterned hardmask 644A thereon. The structures 652A and 652B may ultimately be used in a replacement gate process, such as described below, to form permanent gate stacks having the same dimensions as the structures 652A and 652B.

In an embodiment, the structures 652A have a first pitch (P1), and the structures 652B have a second pitch (P2). In one such embodiment, the first pitch (P1) is less than the second pitch (P2), as is depicted. In a specific such embodiment, the first pitch is about 54 nm, and the second pitch (P2) is about 60 nm. In an embodiment, the structures 652B have a width (W2) less than a width (W1) of the structures 652A, as is depicted. In an alternative embodiment, the structures 652B have a width greater than a width of the structures 652A (e.g., in the case that the resist trim is reversed).

In another aspect, gate sidewall spacer material may be retained over certain trench isolation regions as a protection against erosion of the trench isolation regions during subsequent processing operations. For example, FIGS. 7A-7E illustrate angled three-dimensional cross-sectional views of various operations in a method of fabricating an integrated circuit structure, in accordance with an embodiment of the present disclosure.

Figure 7A:
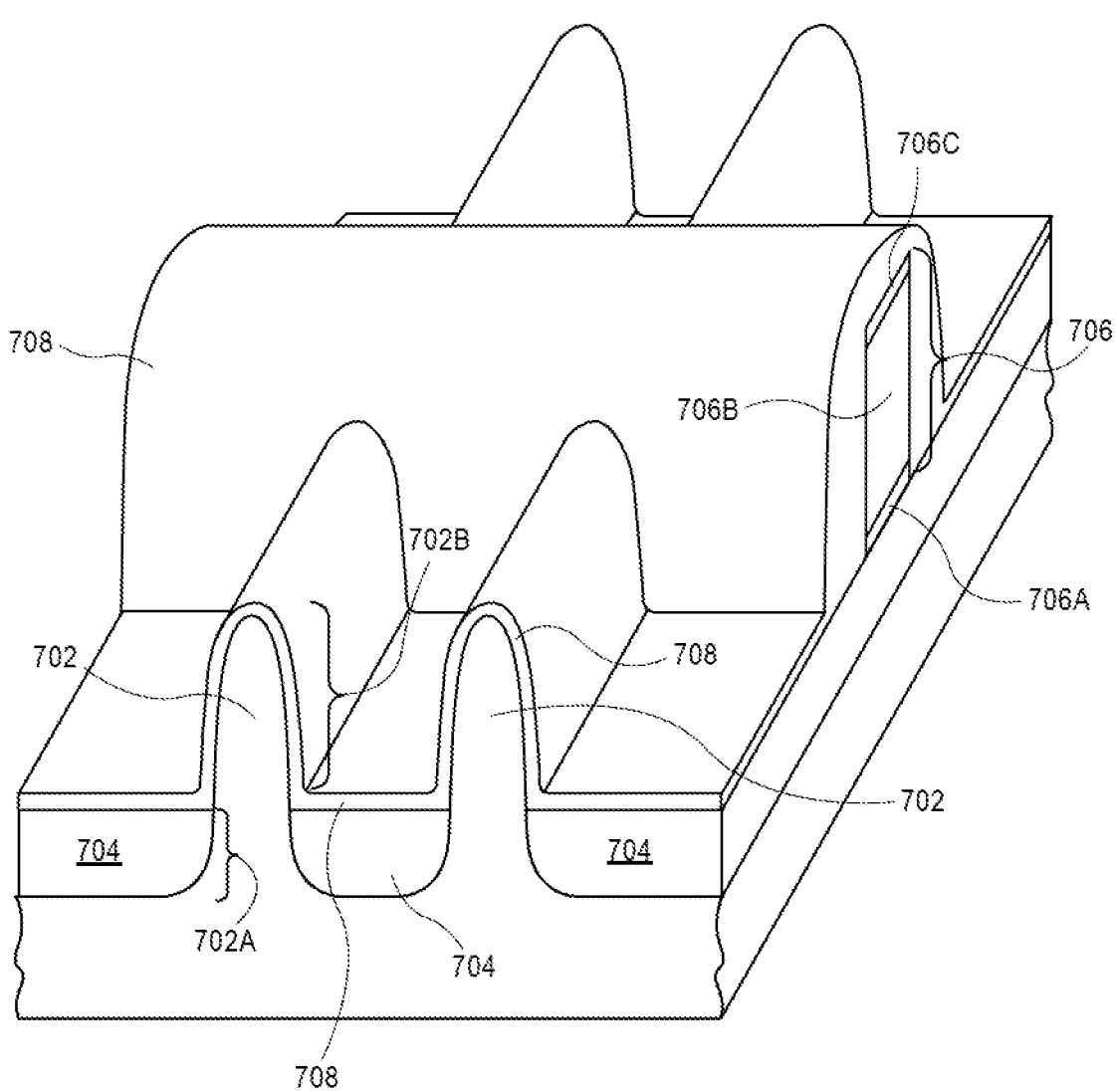
FIGS. 7A-7E illustrate angled three-dimensional cross-sectional views of various operations in a method of fabricating an integrated circuit structure, in accordance with an embodiment of the present disclosure.

Referring to FIG. 7A, a method of fabricating an integrated circuit structure includes forming a fin 702, such as a silicon fin. The fin 702 has a lower fin portion 702A and an upper fin portion 702B. An insulating structure 704 is formed directly adjacent sidewalls of the lower fin portion 702A of the fin 702. A gate structure 706 is formed over the upper fin portion 702B and over the insulating structure 704. In an embodiment, the gate structure is a placeholder or dummy gate structure including a sacrificial gate dielectric layer 706A, a sacrificial gate 706B, and a hardmask 706C. A dielectric material 708 is formed conformal with the upper fin portion 702B of the fin 702, conformal with the gate structure 706, and conformal with the insulating structure 704.

Figure 7B:
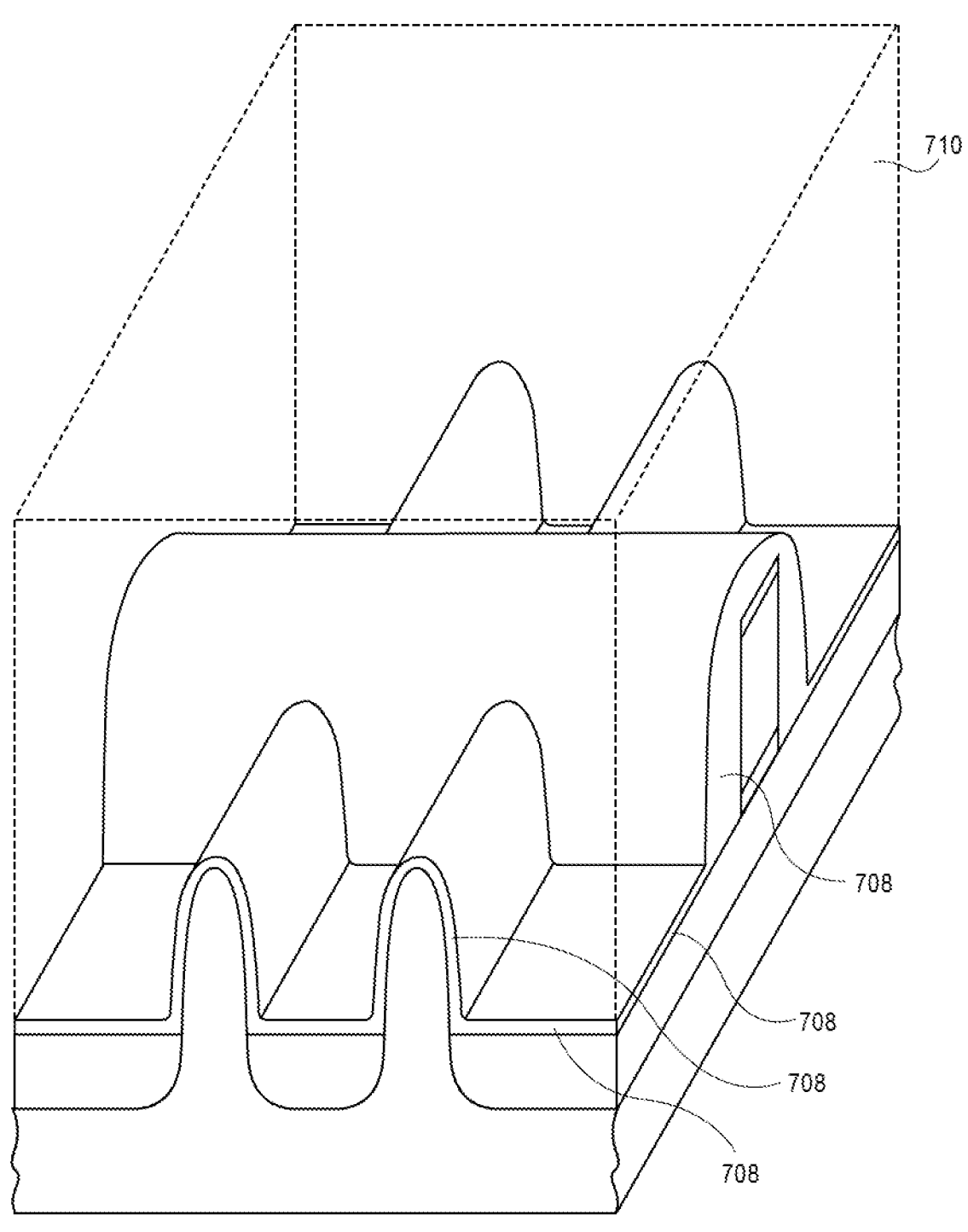

Referring to FIG. 7B, a hardmask material 710 is formed over the dielectric material 708. In an embodiment, the hardmask material 710 is a carbon-based hardmask material formed using a spin-on process.

Figure 7C:
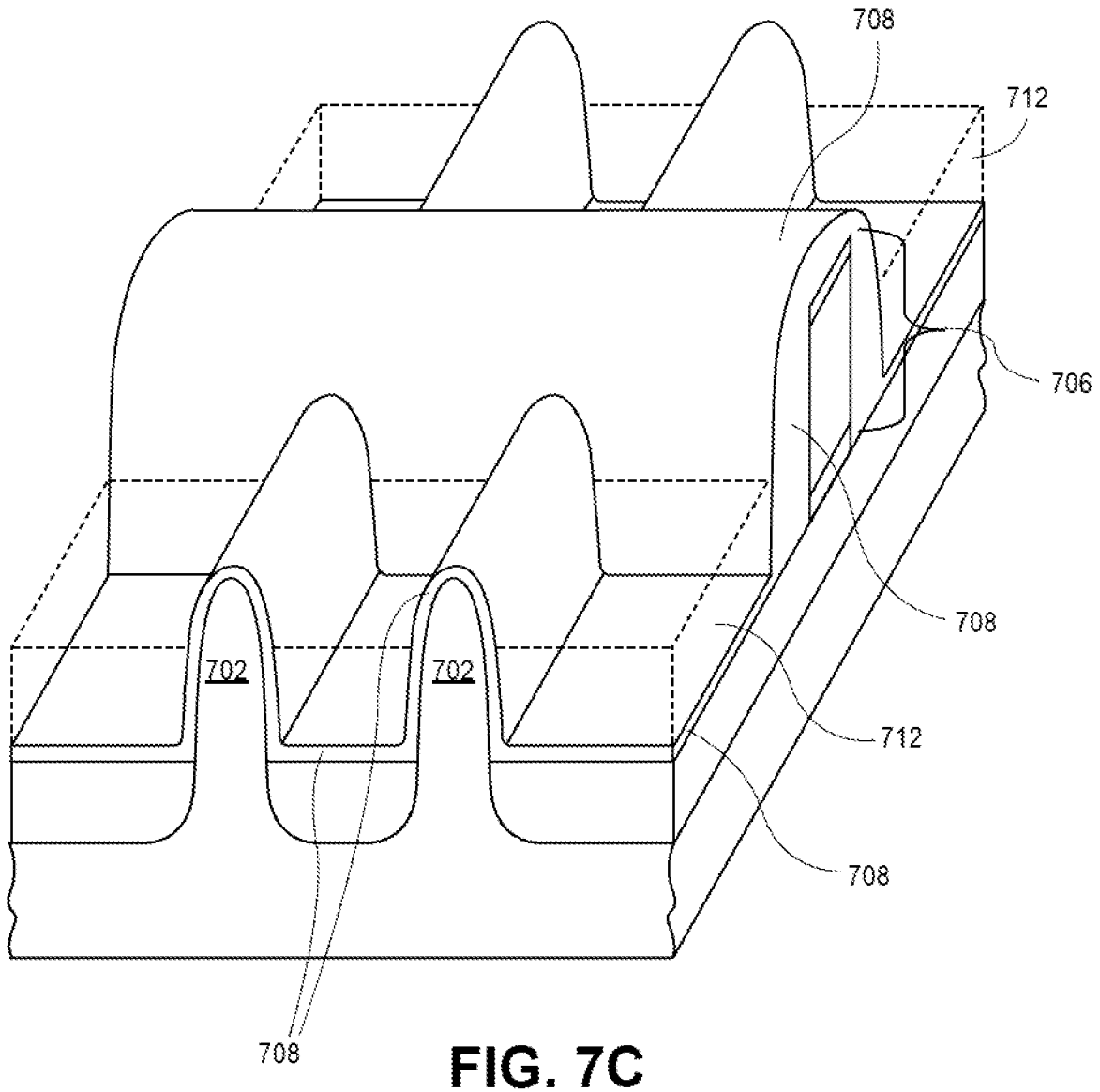

Referring to FIG. 7C, the hardmask material 710 is recessed to form a recessed hardmask material 712 and to expose a portion of the dielectric material 708 conformal with the upper fin portion 702B of the fin 702 and conformal with the gate structure 706. The recessed hardmask material 712 covers a portion of the dielectric material 708 conformal with the insulating structure 704. In an embodiment, the hardmask material 710 is recessed using a wet etching process. In another embodiment, the hardmask material 710 is recessed using an ash, a dry etch or a plasma etch process.

Figure 7D:
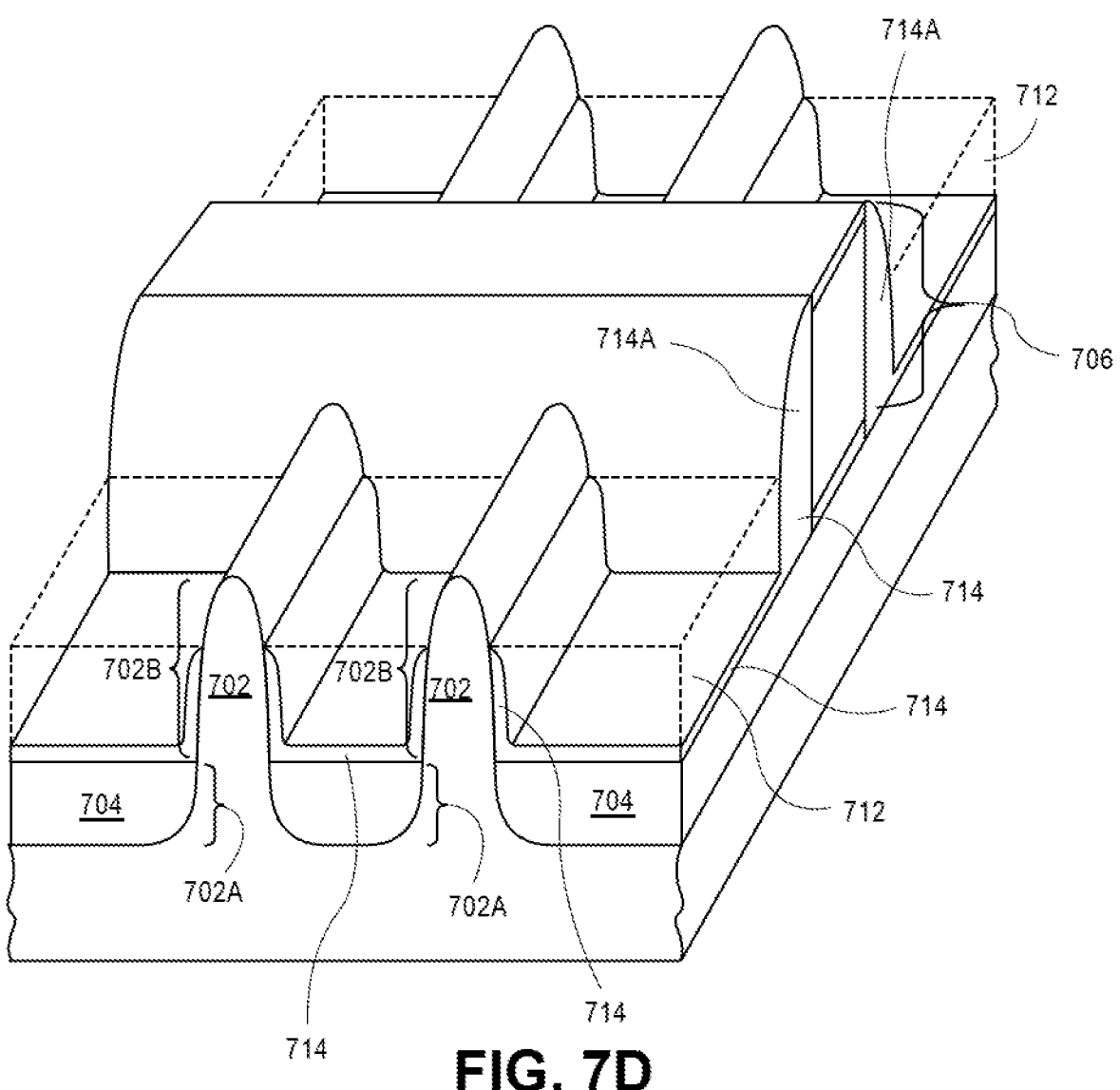

Referring to FIG. 7D, the dielectric material 708 is anisotropically etched to form a patterned dielectric material 714 along sidewalls of the gate structure 706 (as dielectric spacers 714A), along portions of the sidewalls of the upper fin portion 702B of the fin 702, and over the insulating structure 704.

Figure 7E:
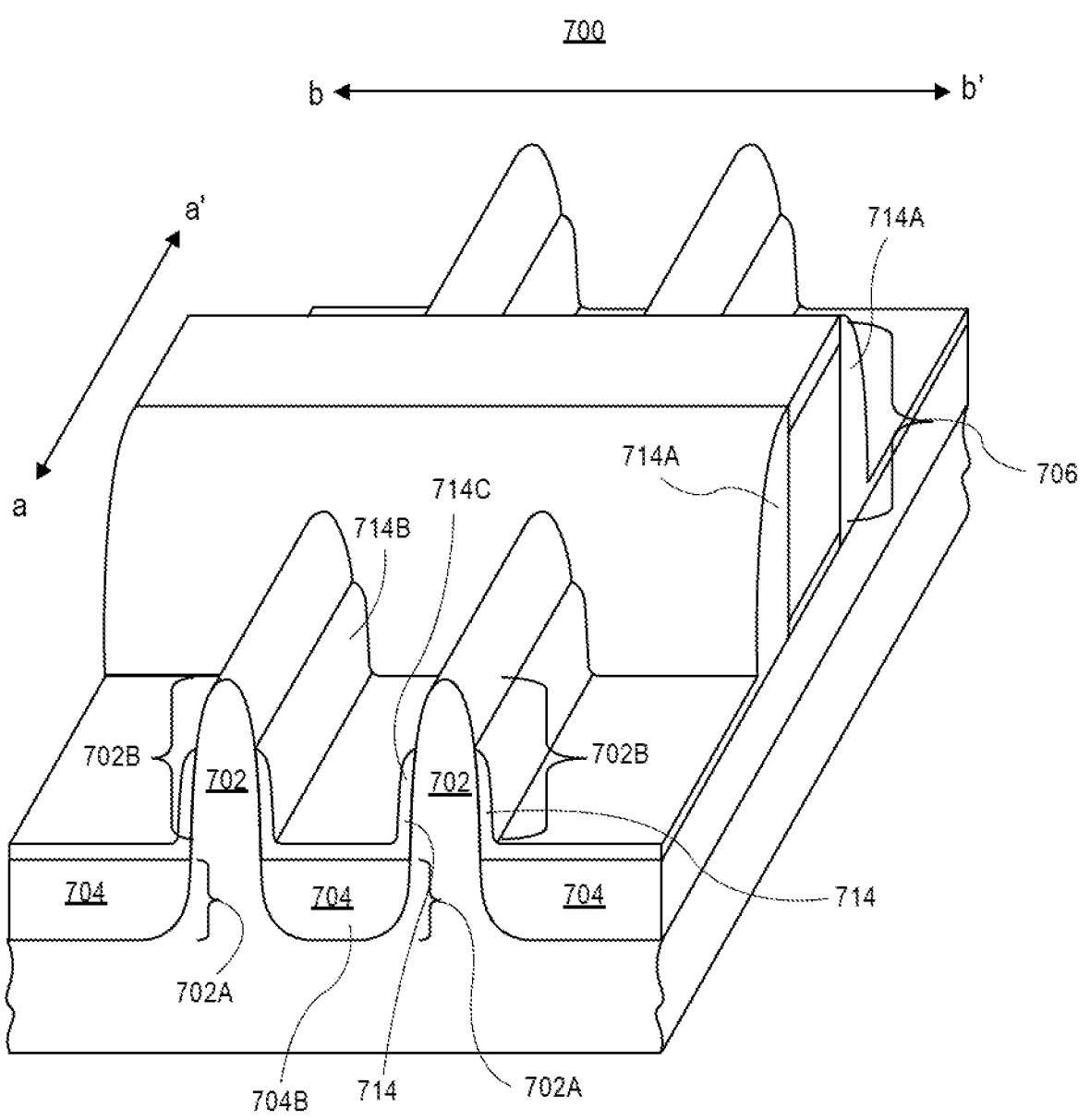

Referring to FIG. 7E, the recessed hardmask material 712 is removed from the structure of FIG. 7D. In an embodiment, the gate structure 706 is a dummy gate structure, and subsequent processing includes replacing the gate structure 706 with a permanent gate dielectric and gate electrode stack. In an embodiment, further processing includes forming embedded source or drain structures on opposing sides of the gate structure 706, as is described in greater detail below.

Referring again to FIG. 7E, in an embodiment, an integrated circuit structure 700 includes a first fin (left 702), such as a first silicon fin, the first fin having a lower fin portion 702A and an upper fin portion 702B. The integrated circuit structure further includes a second fin (right 702), such as a second silicon fin, the second fin having a lower fin portion 702A and an upper fin portion 702B. An insulating structure 704 is directly adjacent sidewalls of the lower fin portion 702A of the first fin and directly adjacent sidewalls of the lower fin portion 702A of the second fin. A gate electrode 706 is over the upper fin portion 702B of the first fin (left 702), over the upper fin portion 702B of the second fin (right 702), and over a first portion 704A of the insulating structure 704. A first dielectric spacer 714A along a sidewall of the upper fin portion 702B of the first fin (left 702), and a second dielectric spacer 702C is along a sidewall of the upper fin portion 702B of the second fin (right 702). The second dielectric spacer 714C is continuous with the first dielectric spacer 714B over a second portion 704B of the insulating structure 704 between the first fin (left 702 and the second fin (right 702).

In an embodiment, the first and second dielectric spacers 714B and 714C include silicon and nitrogen, such as a stoichiometric $Si_3N_4$ silicon nitride material, a silicon-rich silicon nitride material, or a silicon-poor silicon nitride material.

In an embodiment, the integrated circuit structure 700 further includes embedded source or drain structures on opposing sides of the gate electrode 706, the embedded source or drain structures having a bottom surface below a top surface of the first and second dielectric spacers 714B and 714C along the sidewalls of the upper fin portions 702B of the first and second fins 702, and the source or drain structures having a top surface above a top surface of the first and second dielectric spacers 714B and 714C along the sidewalls of the upper fin portions 702B of the first and second fins 702, as is described below in association with FIG. 9B. In an embodiment, the insulating structure 704 includes a first insulating layer, a second insulating layer directly on the first insulating layer, and a dielectric fill material directly laterally on the second insulating layer, as is also described below in association with FIG. 9B.

FIGS. 8A-8F illustrate slightly projected cross-sectional views taken along the a-a' axis of FIG. 7E for various operations in a method of fabricating an integrated circuit structure, in accordance with an embodiment of the present disclosure.

Figures 8A, 8B:
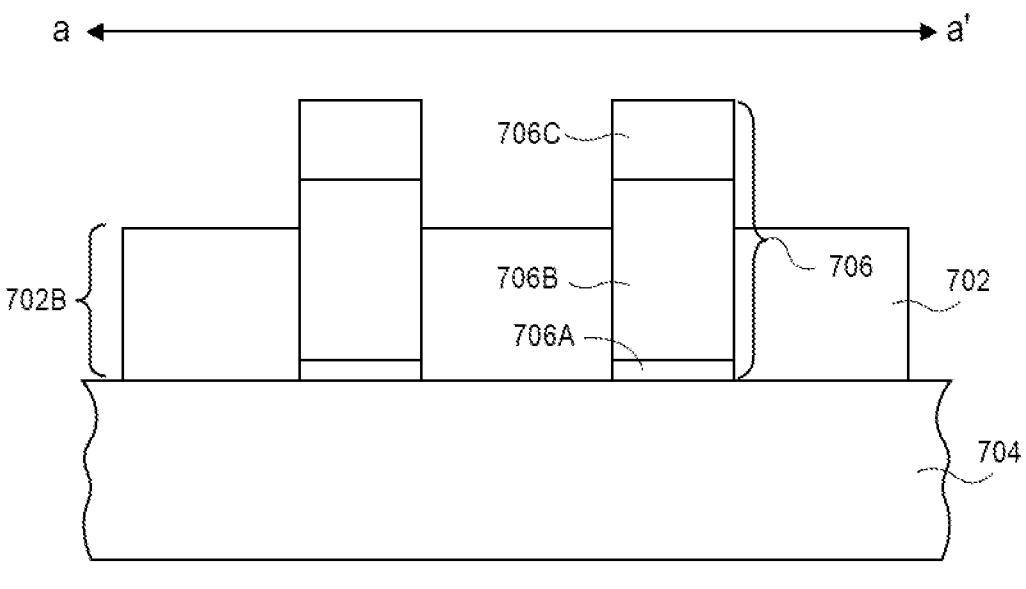
FIGS. 8A-8F illustrate slightly projected cross-sectional views taken along the a-a' axis of FIG. 7E for various operations in a method of fabricating an integrated circuit structure, in accordance with an embodiment of the present disclosure.

Referring to FIG. 8A, a method of fabricating an integrated circuit structure includes forming a fin 702, such as a silicon fin. The fin 702 has a lower fin portion (not seen in FIG. 8A) and an upper fin portion 702B. An insulating structure 704 is formed directly adjacent sidewalls of the lower fin portion 702A of the fin 702. A pair of gate structures 706 is formed over the upper fin portion 702B and over the insulating structure 704. It is to be appreciated that the perspective shown in FIGS. 8A-8F is slightly projected to show portions of the gate structures 706 and insulating structure in front of (out of the page) the upper fin portion 702B, with the upper fin portion slightly into the page. In an embodiment, the gate structures 706 are a placeholder or dummy gate structures including a sacrificial gate dielectric layer 706A, a sacrificial gate 706B, and a hardmask 706C.

Referring to FIG. 8B, which corresponds to the process operation described in association with FIG. 7A, a dielectric material 708 is formed conformal with the upper fin portion 702B of the fin 702, conformal with the gate structures 706, and conformal with exposed portions of the insulating structure 704.

Figure 8C:
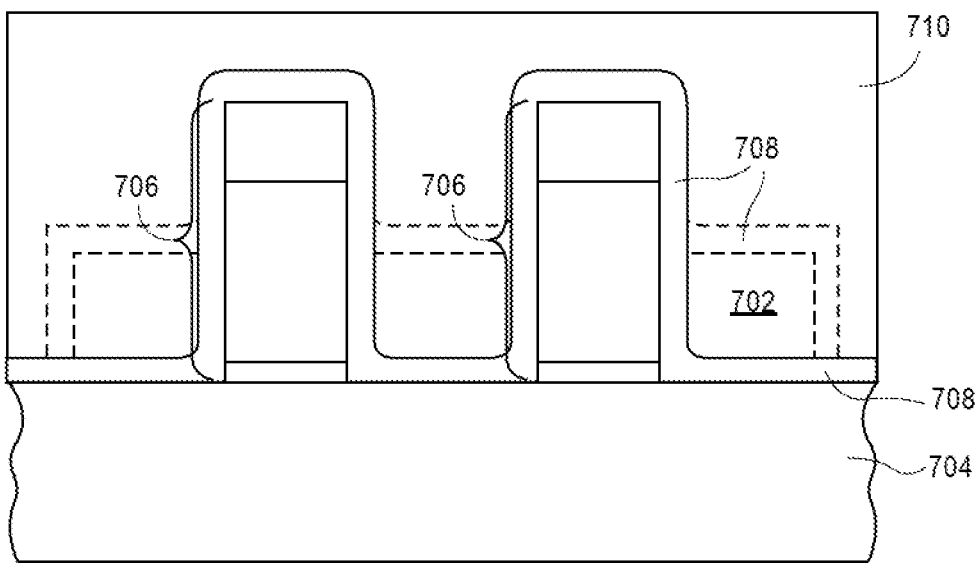

Referring to FIG. 8C, which corresponds to the process operation described in association with FIG. 7B, a hardmask material 710 is formed over the dielectric material 708. In an embodiment, the hardmask material 710 is a carbon-based hardmask material formed using a spin-on process.

Figure 8D:
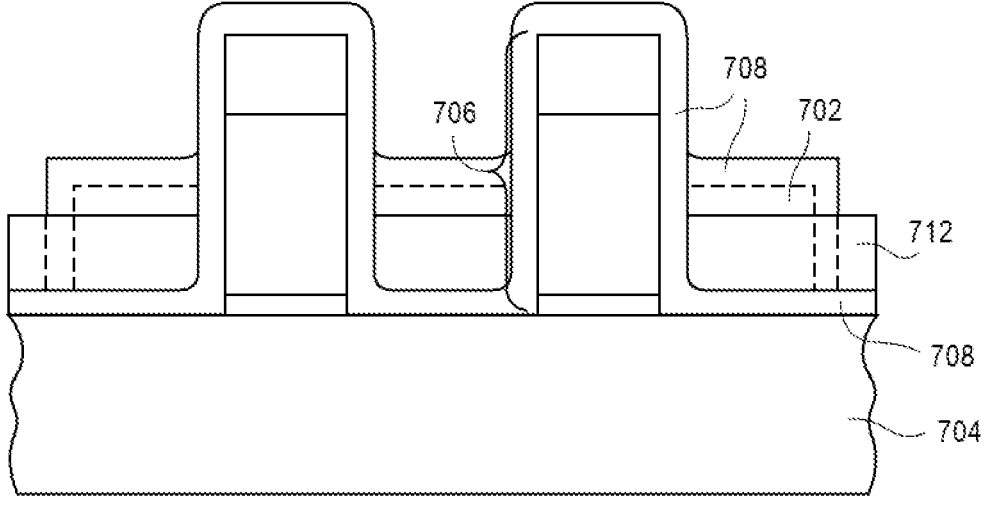

Referring to FIG. 8D, which corresponds to the process operation described in association with FIG. 7C, the hardmask material 710 is recessed to form a recessed hardmask material 712 and to expose a portion of the dielectric material 708 conformal with the upper fin portion 702B of the fin 702 and conformal with the gate structures 706. The recessed hardmask material 712 covers a portion of the dielectric material 708 conformal with the insulating structure 704. In an embodiment, the hardmask material 710 is recessed using a wet etching process. In another embodiment, the hardmask material 710 is recessed using an ash, a dry etch or a plasma etch process.

Figure 8E:
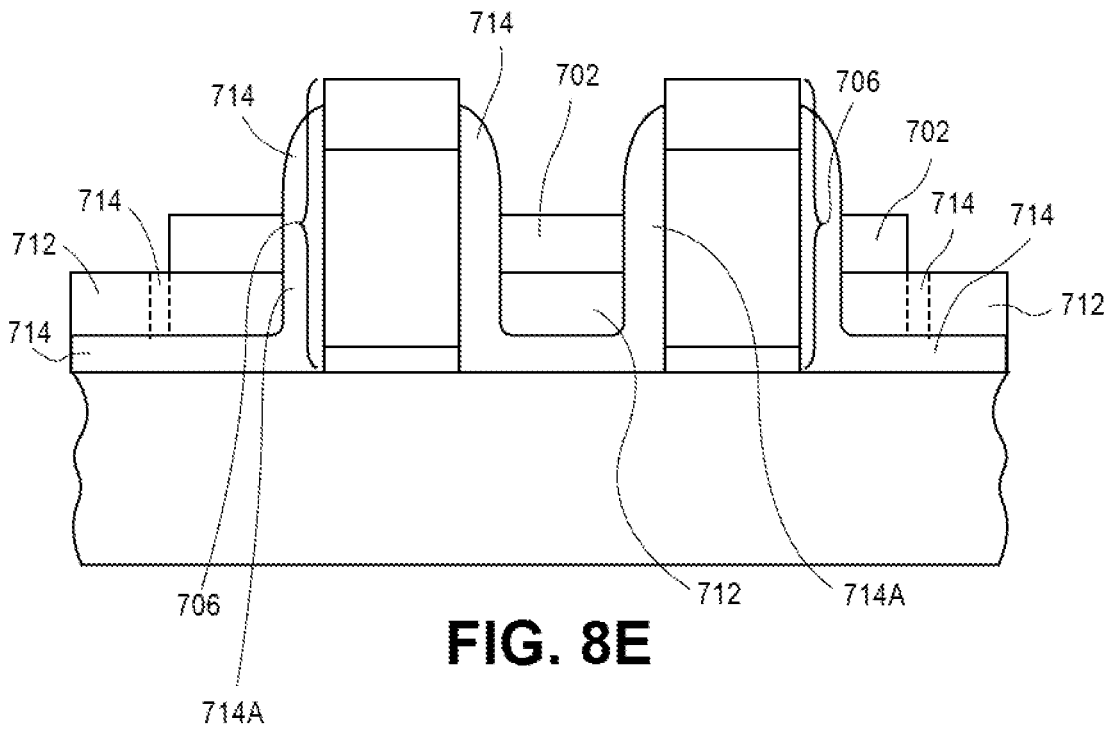

Referring to FIG. 8E, which corresponds to the process operation described in association with FIG. 7D, the dielectric material 708 is anisotropically etched to form a patterned dielectric material 714 along sidewalls of the gate structure 706 (as portions 714A), along portions of the sidewalls of the upper fin portion 702B of the fin 702, and over the insulating structure 704.

Figure 8F:
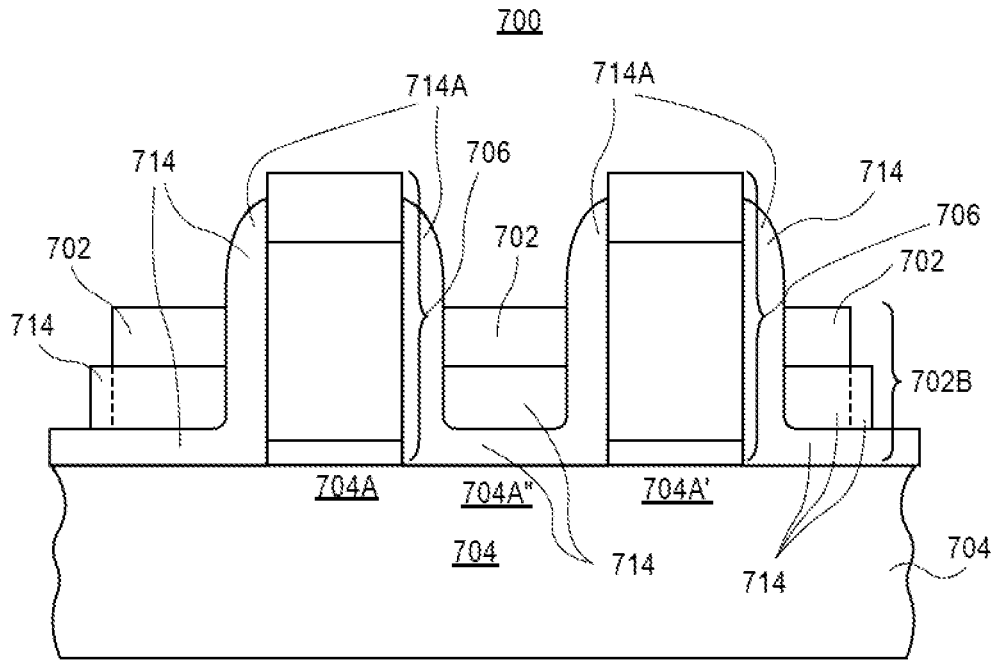

Referring to FIG. 8F, which corresponds to the process operation described in association with FIG. 7E, the recessed hardmask material 712 is removed from the structure of FIG. 8E. In an embodiment, the gate structures 706 are dummy gate structures, and subsequent processing includes replacing the gate structures 706 with permanent gate dielectric and gate electrode stacks. In an embodiment, further processing includes forming embedded source or drain structures on opposing sides of the gate structure 706, as is described in greater detail below.

Referring again to FIG. 8F, in an embodiment, an integrated circuit structure 700 includes a fin 702, such as a silicon fin, the fin 702 having a lower fin portion (not viewed in FIG. 8F) and an upper fin portion 702B. An insulating structure 704 is directly adjacent sidewalls of the lower fin portion of the fin 702. A first gate electrode (left 706) is over the upper fin portion 702B and over a first portion 704A of the insulating structure 704. A second gate electrode (right 706) is over the upper fin portion 702B and over a second portion 704A' of the insulating structure 704. A first dielectric spacer (right 714A of left 706) is along a sidewall of the first gate electrode (left 706), and a second dielectric spacer (left 714A of right 706) is along a sidewall of the second gate electrode (right 706), the second dielectric spacer continuous with the first dielectric spacer over a third portion 704A" of the insulating structure 704 between the first gate electrode (left 706) and the second gate electrode (right 706).

Figure 9A:
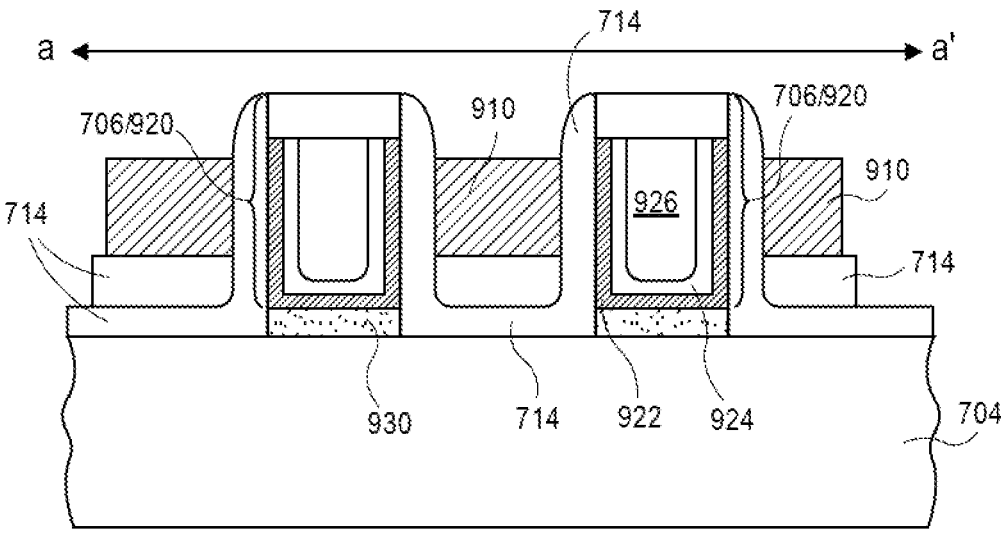
FIG. 9A illustrates a slightly projected cross-sectional view taken along the a-a' axis of FIG. 7E for an integrated circuit structure including permanent gate stacks and epitaxial source or drain regions, in accordance with an embodiment of the present disclosure.

FIG. 9A illustrates a slightly projected cross-sectional view taken along the a-a' axis of FIG. 7E for an integrated circuit structure including permanent gate stacks and epitaxial source or drain regions, in accordance with an embodiment of the present disclosure. FIG. 9B illustrates a cross-sectional view taken along the b-b' axis of FIG. 7E for an integrated circuit structure including epitaxial source or drain regions and a multi-layer trench isolation structure, in accordance with an embodiment of the present disclosure.

Figure 9B:
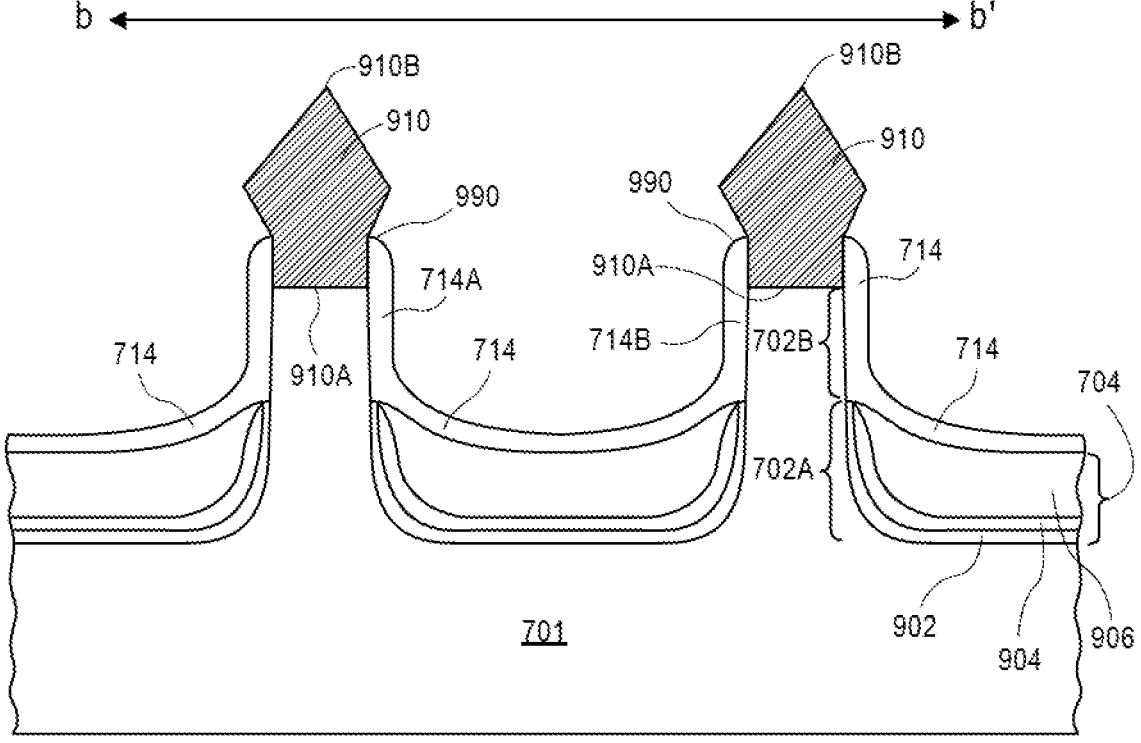
FIG. 9B illustrates a cross-sectional view taken along the b-b' axis of FIG. 7E for an integrated circuit structure including epitaxial source or drain regions and a multi-layer trench isolation structure, in accordance with an embodiment of the present disclosure.

Referring to FIGS. 9A and 9B, in an embodiment, the integrated circuit structure includes embedded source or drain structures 910 on opposing sides of the gate electrodes 706. The embedded source or drain structures 910 have a bottom surface 910A below a top surface 990 of the first and second dielectric spacers 714A and 714B along the sidewalls of the upper fin portions 702B of the first and second fins 702. The embedded source or drain structures 910 have a top surface 910B above a top surface of the first and second dielectric spacers 714A and 714B along the sidewalls of the upper fin portions 702B of the first and second fins 702.

In an embodiment, gate stacks 706 are permanent gate stacks 920. In one such embodiment, the permanent gate stacks 920 include a gate dielectric layer 922, a first gate layer 924, such as a workfunction gate layer, and a gate fill material 926, as is depicted in FIG. 9A. In one embodiment, where the permanent gate structures 920 are over the insulating structure 704, the permanent gate structures 920 are formed on residual polycrystalline silicon portions 930, which may be remnants of a replacement gate process involving sacrificial polycrystalline silicon gate electrodes.

In an embodiment, the insulating structure 704 includes a first insulating layer 902, a second insulating layer 904 directly on the first insulating layer 902, and a dielectric fill material 906 directly laterally on the second insulating layer 904. In one embodiment, the first insulating layer 902 is a non-doped insulating layer including silicon and oxygen. In one embodiment, the second insulating layer 904 includes silicon and nitrogen. In one embodiment, the dielectric fill material 906 includes silicon and oxygen.

In another aspect, epitaxial embedded source or drain regions are implemented as source or drain structures for semiconductor fins. As an example, FIG. 10 illustrates a cross-sectional view of an integrated circuit structure taken at a source or drain location, in accordance with an embodiment of the present disclosure.

Figure 10:
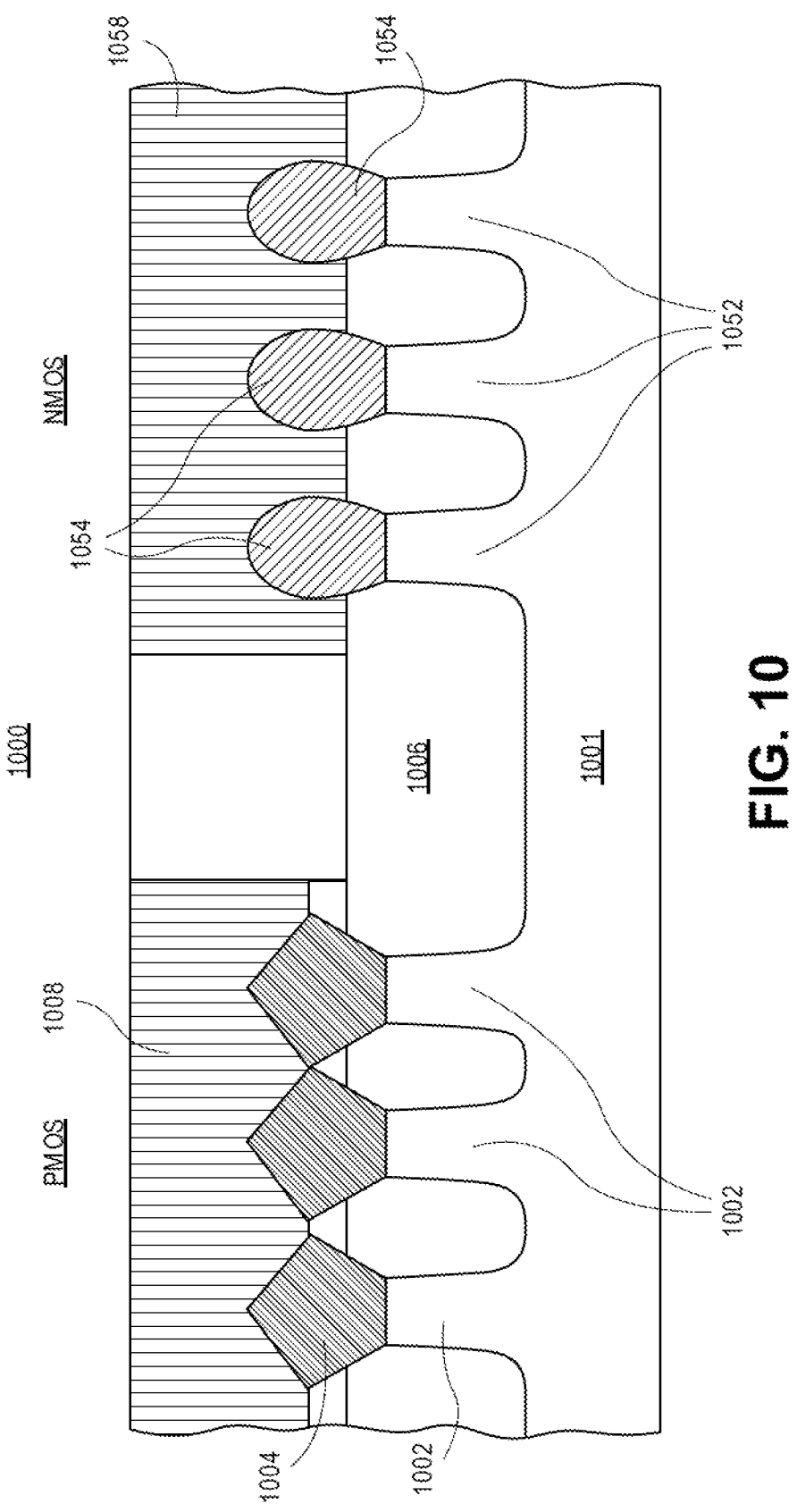
FIG. 10 illustrates a cross-sectional view of an integrated circuit structure taken at a source or drain location, in accordance with an embodiment of the present disclosure.

Referring to FIG. 10, an integrated circuit structure 1000 includes a P-type device, such as a P-type Metal Oxide Semiconductor (PMOS) device. The integrated circuit structure 1000 also includes an N-type device, such as an N-type Metal Oxide Semiconductor (PMOS) device.

The PMOS device of FIG. 10 includes a first plurality of semiconductor fins 1002, such as silicon fins formed from a bulk silicon substrate 1001. At the source or drain location, upper portions of the fins 1002 have been removed, and a same or different semiconductor material is grown to form source or drain structures 1004. It is to be appreciated that the source or drain structures 1004 will look the same at a cross-sectional view taken on either side of a gate electrode, e.g., they will look essentially the same at a source side as at a drain side. In an embodiment, as depicted, the source or drain structures 1004 have a portion below and a portion above an upper surface of an insulating structure 1006. In an embodiment, as depicted, the source or drain structures 1004 are strongly faceted. In an embodiment, a conductive contact 1008 is formed over the source or drain structures 1004. In one such embodiment, however, the strong faceting, and the relatively wide growth of the source or drain structures 1004 inhibits good coverage by the conductive contact 1008 at least to some extent.

The NMOS device of FIG. 10 includes a second plurality of semiconductor fins 1052, such as silicon fins formed from the bulk silicon substrate 1001. At the source or drain location, upper portions of the fins 1052 have been removed, and a same or different semiconductor material is grown to form source or drain structures 1054. It is to be appreciated that the source or drain structures 1054 will look the same at a cross-sectional view taken on either side of a gate electrode, e.g., they will look essentially the same at a source side as at a drain side. In an embodiment, as depicted, the source or drain structures 1054 have a portion below and a portion above an upper surface of the insulating structure 1006. In an embodiment, as depicted, the source or drain structures 1054 are weakly faceted relative to the source or drain structures 1004. In an embodiment, a conductive contact 1058 is formed over the source or drain structures 1054. In one such embodiment, relatively weak faceting, and the resulting relatively narrower growth of the source or drain structures 1054 (as compared with the source or drain structures 1004) enhances good coverage by the conductive contact 1058.

The shape of the source or drain structures of a PMOS device may be varied to improve contact area with an overlying contact. For example, FIG. 11 illustrates a cross-sectional view of another integrated circuit structure taken at a source or drain location, in accordance with an embodiment of the present disclosure.

Figure 11:
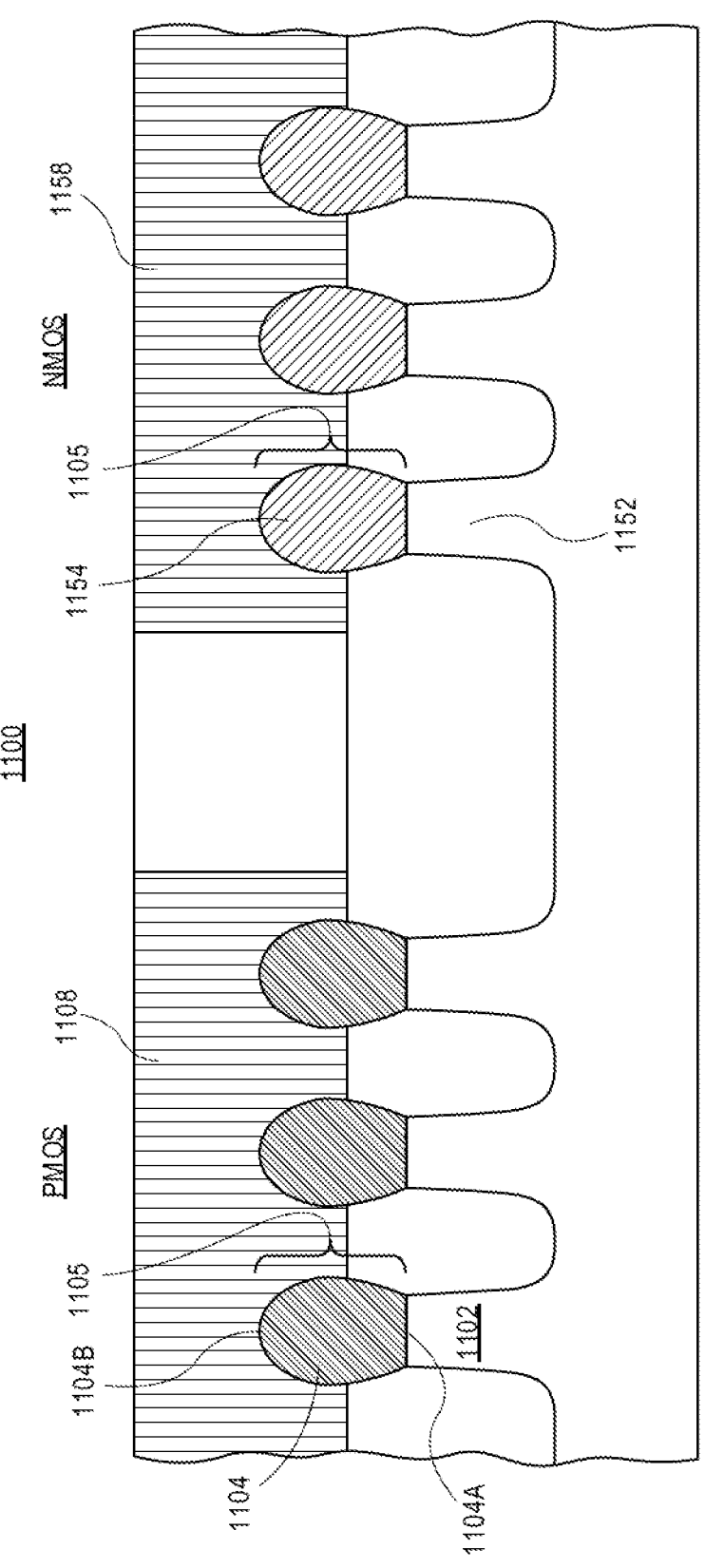
FIG. 11 illustrates a cross-sectional view of another integrated circuit structure taken at a source or drain location, in accordance with an embodiment of the present disclosure.

Referring to FIG. 11, an integrated circuit structure 1100 includes a P-type semiconductor (e.g., PMOS) device. The PMOS device includes a first fin 1102, such as a silicon fin. A first epitaxial source or drain structure 1104 is embedded in the first fin 1102. In one embodiment, although not depicted, the first epitaxial source or drain structure 1104 is at a first side of a first gate electrode (which may be formed over an upper fin portion such as a channel portion of the fin 1102), and a second epitaxial source or drain structure is embedded in the first fin 1102 at a second side of such a first gate electrode opposite the first side. In an embodiment, the first 1104 and second epitaxial source or drain structures include silicon and germanium and have a profile 1105. In one embodiment, the profile is a match-stick profile, as depicted in FIG. 11. A first conductive electrode 1108 is over the first epitaxial source or drain structure 1104.

Referring again to FIG. 11, in an embodiment, the integrated circuit structure 1100 also includes an N-type semiconductor (e.g., NMOS) device. The NMOS device includes a second fin 1152, such as a silicon fin. A third epitaxial source or drain structure 1154 is embedded in the second fin

1152. In one embodiment, although not depicted, the third epitaxial source or drain structure 1154 is at a first side of a second gate electrode (which may be formed over an upper fin portion such as a channel portion of the fin 1152), and a fourth epitaxial source or drain structure is embedded in the second fin 1152 at a second side of such a second gate electrode opposite the first side. In an embodiment, the third 1154 and fourth epitaxial source or drain structures include silicon and have substantially the same profile as the profile 1105 of the first and second epitaxial source or drain structures 1104. A second conductive electrode 1158 is over the third epitaxial source or drain structure 1154.

In an embodiment, the first epitaxial source or drain structure 1104 is weakly faceted. In an embodiment, the first epitaxial source or drain structure 1104 has a height of approximately 50 nanometers and has a width in the range of 30-35 nanometers. In one such embodiment, the third epitaxial source or drain structure 1154 has a height of approximately 50 nanometers and has a width in the range of 30-35 nanometers.

In an embodiment, the first epitaxial source or drain structure 1104 is graded with an approximately 20% germanium concentration at a bottom 1104A of the first epitaxial source or drain structure 1104 to an approximately 45% germanium concentration at a top 1104B of the first epitaxial source or drain structure 1104. In an embodiment, the first epitaxial source or drain structure 1104 is doped with boron atoms. In one such embodiment, the third epitaxial source or drain structure 1154 is doped with phosphorous atoms or arsenic atoms.

FIGS. 12A-12D illustrate cross-sectional views taken at a source or drain location and representing various operations in the fabrication of an integrated circuit structure, in accordance with an embodiment of the present disclosure.

Figure 12A:
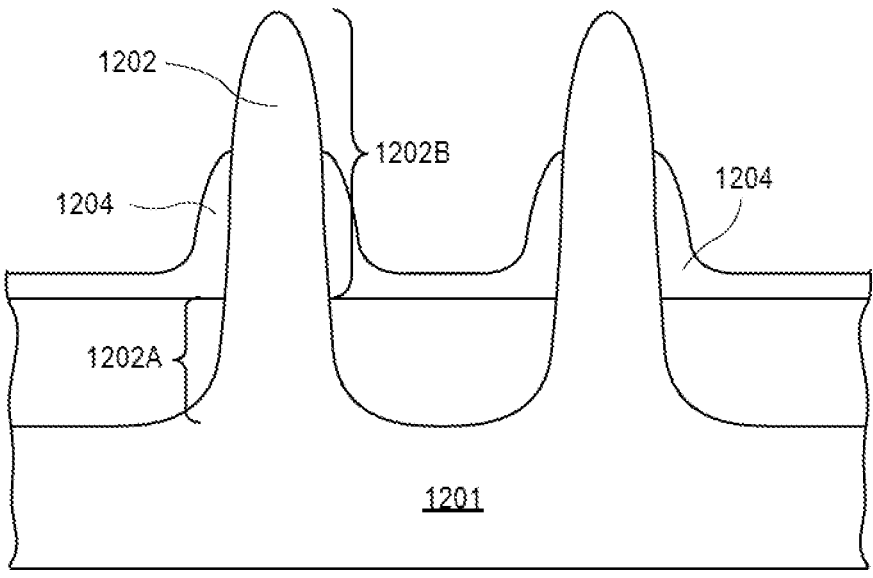
FIGS. 12A-12D illustrate cross-sectional views taken at a source or drain location and representing various operations in the fabrication of an integrated circuit structure, in accordance with an embodiment of the present disclosure.

Referring to FIG. 12A, a method of fabricating an integrated circuit structure includes forming a fin, such as a silicon fin formed from a silicon substrate 1201. The fin 1202 has a lower fin portion 1202A and an upper fin portion 1202B. In an embodiment, although not depicted, a gate electrode is formed over a portion of the upper fin portion 1202B of the fin 1202 at a location into the page. Such a gate electrode has a first side opposite a second side and defines source or drain locations on the first and second sides. For example, for the purposes of illustration, the cross-sectional locations for the views of FIGS. 12A-12D are taken at one of the source or drain locations at one of the sides of a gate electrode.

Figure 12B:
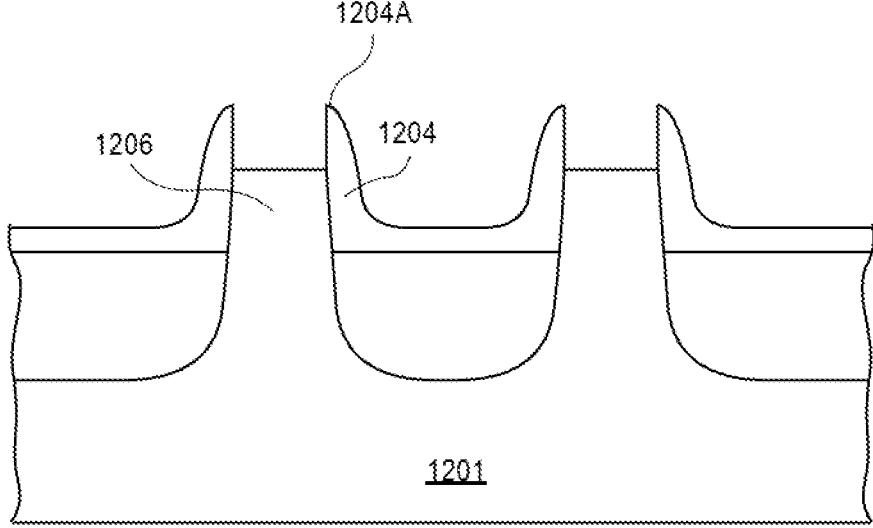

Referring to FIG. 12B, a source of drain location of the fin 1202 is recessed to form recessed fin portion 1206. The recessed source or drain location of the fin 1202 may be at a side of a gate electrode and at the second side of the gate electrode. Referring to both FIGS. 12A and 12B, in an embodiment, dielectric spacers 1204 are formed along sidewalls of a portion of the fin 1202, e.g., at a side of a gate structure. In one such embodiment, recessing the fin 1202 involves recessing the fin 1202 below a top surface 1204A of the dielectric spacers 1204.

Figure 12C:
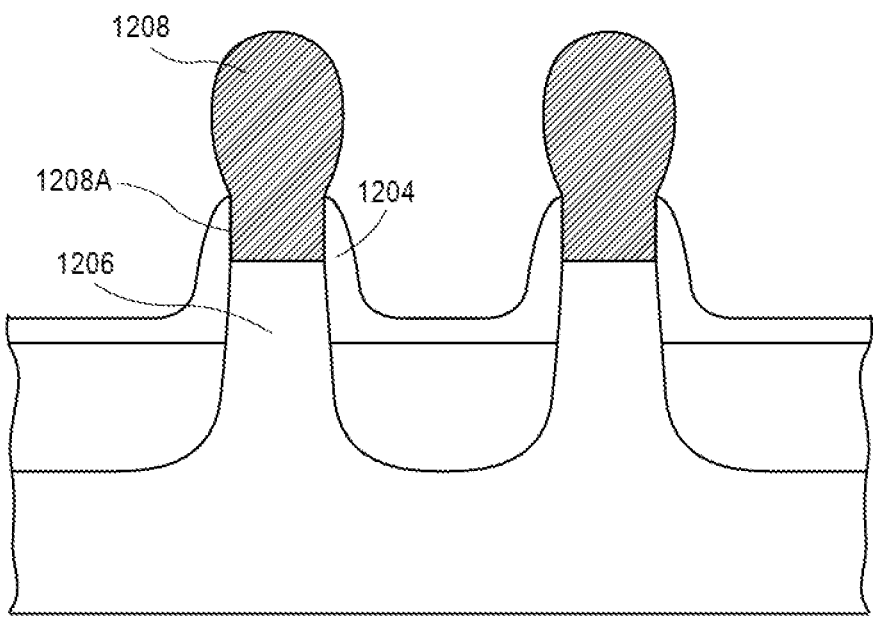

Referring to FIG. 12C, an epitaxial source or drain structure 1208 is formed on the recessed fin 1206, e.g., and thus may be formed at a side of a gate electrode. In one such embodiment, a second epitaxial source or drain structure is formed on a second portion of the recessed fin 1206 at a second side of such a gate electrode. In an embodiment, the epitaxial source or drain structure 1208 includes silicon and germanium, and has a match-stick profile, as is depicted in FIG. 12C. In an embodiment, dielectric spacers 1204 are included and are along a lower portion 1208A of sidewalls of the epitaxial source or drain structure 1208, as depicted.

Figure 12D:
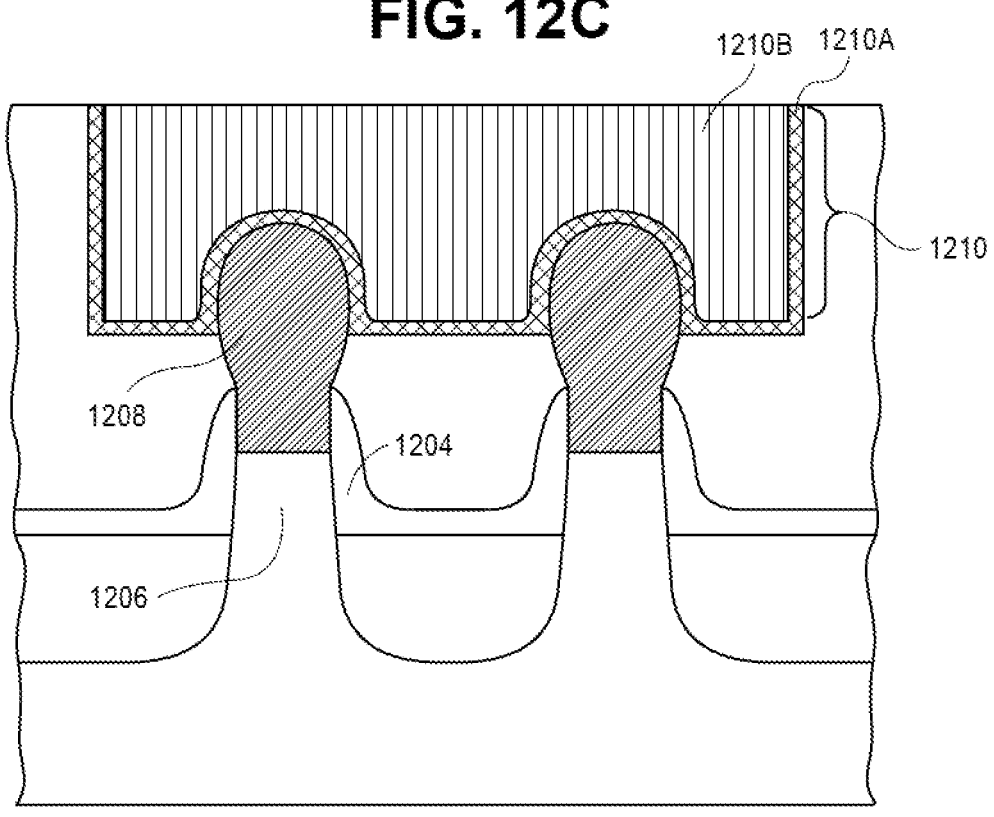

Referring to FIG. 12D, a conductive electrode 1210 is formed on the epitaxial source or drain structure 1208. In an embodiment, the conductive electrode 1210 includes a conductive barrier layer 1210A and a conductive fill material 1210B. In one embodiment, the conductive electrode 1210 follows the profile of the epitaxial source or drain structure 1208, as is depicted. In other embodiments, upper portions of the epitaxial source or drain structure 1208 are eroded during fabrication of the conductive electrode 1210.

In another aspect, portions of a placeholder gate structure or dummy gate structure may be retained over trench isolation regions beneath a permanent gate structure as a protection against erosion of the trench isolation regions during a replacement gate process. For example, FIGS. 13A-13C illustrate a plan view and corresponding cross-sectional views of an integrated circuit structure having residual dummy gate material at portions of the bottom of a permanent gate stack, in accordance with an embodiment of the present disclosure.

Figures 13A, 13B, 13C:
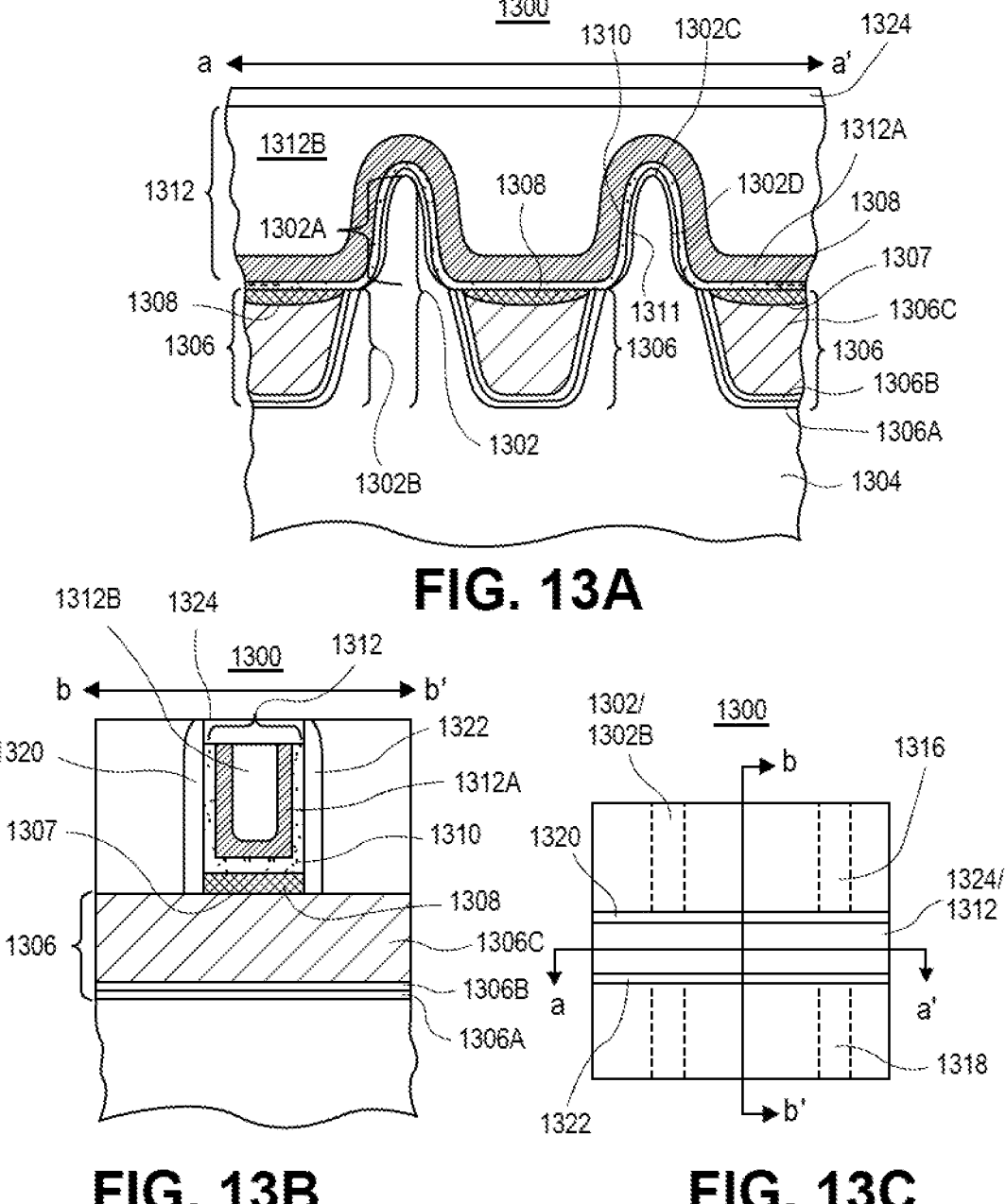
FIGS. 13A-13C illustrate a plan view and corresponding cross-sectional views of an integrated circuit structure having residual dummy gate material at portions of the bottom of a permanent gate stack, in accordance with an embodiment of the present disclosure.

Referring to FIGS. 13A-13C, an integrated circuit structure includes a fin 1302, such as a silicon fin, protruding from a semiconductor substrate 1304. The fin 1302 has a lower fin portion 1302B and an upper fin portion 1302A. The upper fin portion 1302A has a top 1302C and sidewalls 1302D. An isolation structure 1306 surrounds the lower fin portion 1302B. The isolation structure 1306 includes an insulating material 1306C having a top surface 1307. A semiconductor material 1308 is on a portion of the top surface 1307 of the insulating material 1306C. The semiconductor material 1308 is separated from the fin 1302.

A gate dielectric layer 1310 is over the top 1302C of the upper fin portion 1302A and laterally adjacent the sidewalls 1302D of the upper fin portion 1302A. The gate dielectric layer 1310 is further on the semiconductor material 1308 on the portion of the top surface 1307 of the insulating material 1306C. An intervening additional gate dielectric layer 1311, such as an oxidized portion of the fin 1302 may be between the gate dielectric layer 1310 over the top 1302C of the upper fin portion 1302A and laterally adjacent the sidewalls 1302D of the upper fin portion 1302A. A gate electrode 1312 is over the gate dielectric layer 1310 over the top 1302C of the upper fin portion 1302A and laterally adjacent the sidewalls 1302D of the upper fin portion 1302A. The gate electrode 1312 is further over the gate dielectric layer 1310 on the semiconductor material 1308 on the portion of the top surface 1307 of the insulating material 1306C. A first source or drain region 1316 is adjacent a first side of the gate electrode 1312, and a second source or drain region 1318 is adjacent a second side of the gate electrode 1312, the second side opposite the first side. In an embodiment, examples of which are described above, the isolation structure 1306 includes a first insulating layer 1306A, a second insulating layer 1306B, and the insulating material 1306C.

In one embodiment, the semiconductor material 1308 on the portion of the top surface 1307 of the insulating material 1306C is or includes polycrystalline silicon. In one embodiment, the top surface 1307 of the insulating material 1306C has a concave depression, and is depicted, and the semiconductor material 1308 is in the concave depression. In one embodiment, the isolation structure 1306 includes a second insulating material (1306A or 1306B or both 1306A/1306B) along a bottom and sidewalls of the insulating material 1306C. In one such embodiment, the portion of the second insulating material (1306A or 1306B or both 1306A/1306B) along the sidewalls of the insulating material 1306C has a top surface above an uppermost surface of the insulating material 1306C, as is depicted. In one embodiment, the top surface of the second insulating material (1306A or 1306B or both 1306A/1306B) is above or co-planar with an uppermost surface of the semiconductor material 1308.

In one embodiment, the semiconductor material 1308 on the portion of the top surface 1307 of the insulating material 1306C does not extend beyond the gate dielectric layer 1310. That is, from a plan view perspective, the location of the semiconductor material 1308 is limited to the region covered by the gate stack 1312/1310. In one embodiment, a first dielectric spacer 1320 is along the first side of the gate electrode 1312. A second dielectric spacer 1322 is along the second side of the gate electrode 1312. In one such embodiment, the gate dielectric layer 1310 further extends along sidewalls of the first dielectric spacer 1320 and the second dielectric spacer 1322, as is depicted in FIG. 13B.

In one embodiment, the gate electrode 1312 includes a conformal conductive layer 1312A (e.g., a workfunction layer). In one such embodiment, the workfunction layer 1312A includes titanium and nitrogen. In another embodiment, the workfunction layer 1312A includes titanium, aluminum, carbon and nitrogen. In one embodiment, the gate electrode 1312 further includes a conductive fill metal layer 1312B over the workfunction layer 1312A. In one such embodiment, the conductive fill metal layer 1312B includes tungsten. In a particular embodiment, the conductive fill metal layer 1312B includes 95 or greater atomic percent tungsten and 0.1 to 2 atomic percent fluorine. In one embodiment, an insulating cap 1324 is on the gate electrode 1312 and may extend over the gate dielectric layer 1310, as is depicted in FIG. 13B.

FIGS. 14A-14D illustrate cross-sectional views of various operations in a method of fabricating an integrated circuit structure having residual dummy gate material at portions of the bottom of a permanent gate stack, in accordance with another embodiment of the present disclosure. The perspective show is along a portion of the a-a' axis of the structure of FIG. 13C.

Figure 14A:
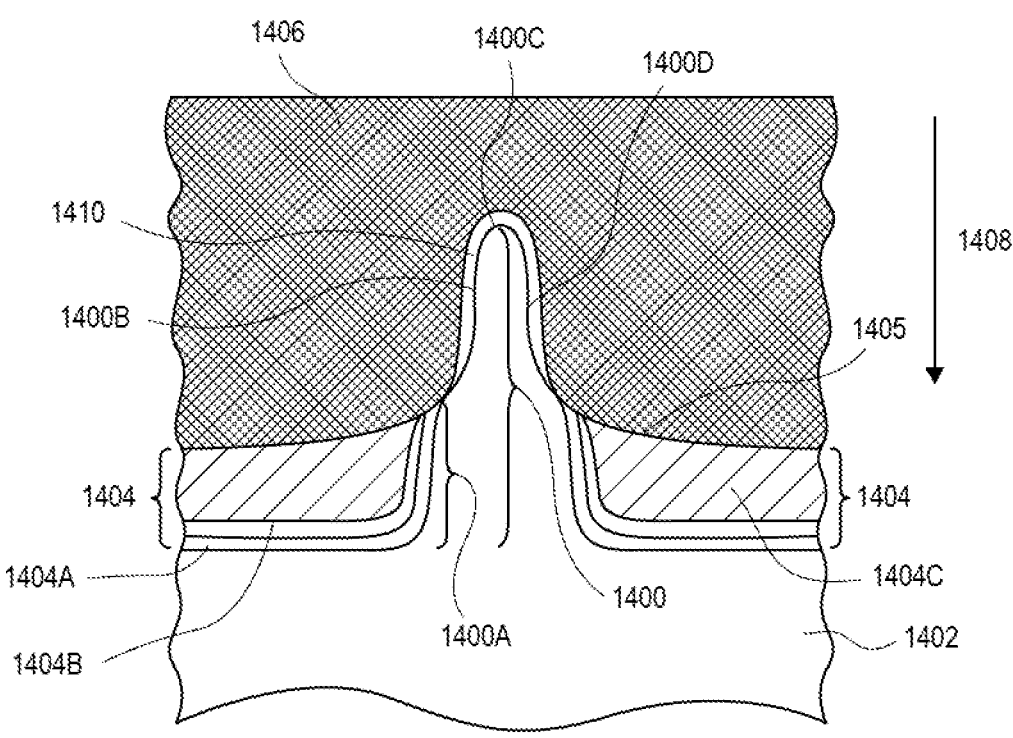
FIGS. 14A-14D illustrate cross-sectional views of various operations in a method of fabricating an integrated circuit structure having residual dummy gate material at portions of the bottom of a permanent gate stack, in accordance with another embodiment of the present disclosure.

Referring to FIG. 14A, a method of fabricating an integrated circuit structure includes forming a fin 1400 from a semiconductor substrate 1402. The fin 1400 has a lower fin portion 1400A and an upper fin portion 1400B. The upper fin portion 1400B has a top 1400C and sidewalls 1400D. An isolation structure 1404 surrounds the lower fin portion 1400A. The isolation structure 1404 includes an insulating material 1404C having a top surface 1405. A placeholder gate electrode 1406 is over the top 1400C of the upper fin portion 1400B and laterally adjacent the sidewalls 1400D of the upper fin portion 1400B. The placeholder gate electrode 1406 includes a semiconductor material.

Although not depicted from the perspective of FIG. 14A (but locations for which are shown in FIG. 13C), a first source or drain region may be formed adjacent a first side of the placeholder gate electrode 1406, and a second source or drain region may be formed adjacent a second side of the placeholder gate electrode 1406, the second side opposite the first side. Additionally, gate dielectric spacers may be formed along the sidewalls of the placeholder gate electrode 1406, and an inter-layer dielectric (ILD) layer may be formed laterally adjacent the placeholder gate electrode 1406.

In one embodiment, the placeholder gate electrode 1406 is or includes polycrystalline silicon. In one embodiment, the top surface 1405 of the insulating material 1404C of the isolation structure 1404 has a concave depression, as is depicted. A portion of the placeholder gate electrode 1406 is in the concave depression. In one embodiment, the isolation structure 1404 includes a second insulating material (1404A or 1404B or both 1404A and 1404B) is along a bottom and sidewalls of the insulating material 1404C, as is depicted. In one such embodiment, the portion of the second insulating material (1404A or 1404B or both 1404A and 1404B) along the sidewalls of the insulating material 1404C has a top surface above at least a portion of the top surface 1405 of the insulating material 1404C. In one embodiment, the top surface of the second insulating material (1404A or 1404B or both 1404A and 1404B) is above a lowermost surface of a portion of the placeholder gate electrode 1406.

Figure 14B:
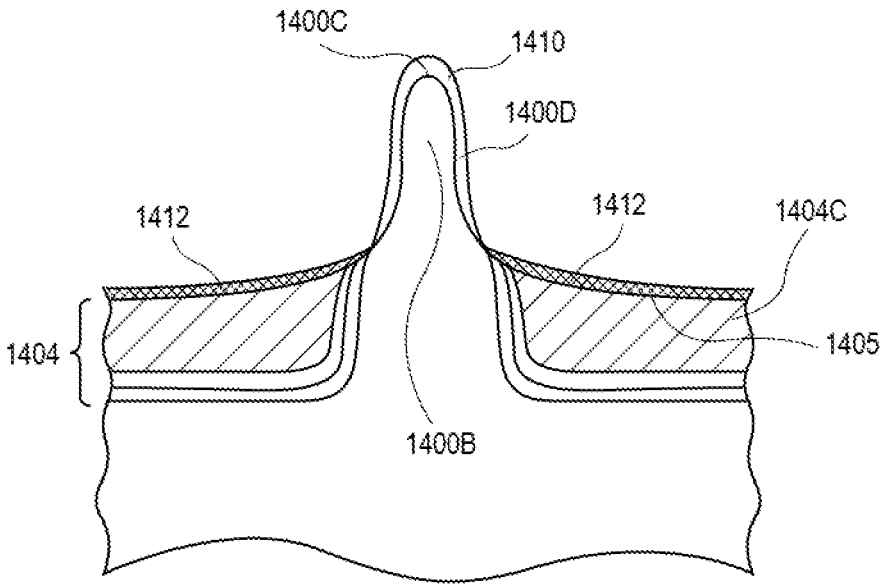

Referring to FIG. 14B, the placeholder gate electrode 1406 is etched from over the top 1400C and sidewalls 1400D of the upper fin portion 1400B, e.g., along direction 1408 of FIG. 14A. The etch process may be referred to as a replacement gate process. In an embodiment, the etching or replacement gate process is incomplete and leaves a portion 1412 of the placeholder gate electrode 1406 on at least a portion of the top surface 1405 of the insulating material 1404C of the isolation structure 1404.

Referring to both FIGS. 14A and 14B, in an embodiment, an oxidized portion 1410 of the upper fin portion 1400B formed prior to forming the placeholder gate electrode 1406 is retained during the etch process, as is depicted. In another embodiment, however, a placeholder gate dielectric layer is formed prior to forming the placeholder gate electrode 1406, and the placeholder gate dielectric layer is removed subsequent to etching the placeholder gate electrode.

Figure 14C:
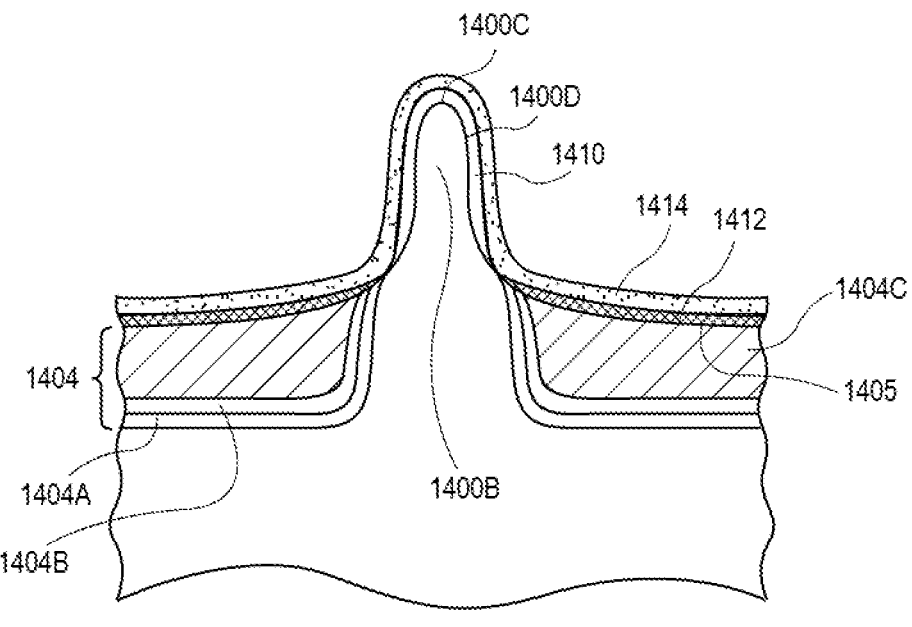

Referring to FIG. 14C, a gate dielectric layer 1414 is formed over the top 1400C of the upper fin portion 1400B and laterally adjacent the sidewalls 1400D of the upper fin portion 1400B. In one embodiment, the gate dielectric layer 1414 is formed on the oxidized portion 1410 of the upper fin portion 1400B over the top 1400C of the upper fin portion 1400B and laterally adjacent the sidewalls 1400D of the upper fin portion 1400B, as is depicted. In another embodiment, the gate dielectric layer 1414 is formed directly on the upper fin portion 1400B over the top of 1400C of the upper fin portion 1400B and laterally adjacent the sidewalls 1400D of the upper fin portion 1400B in the case where the oxidized portion 1410 of the upper fin portion 1400B is removed subsequent to etching the placeholder gate electrode. In either case, in an embodiment, the gate dielectric layer 1414 is further formed on the portion 1412 of the placeholder gate electrode 1406 on the portion of the top surface 1405 of the insulating material 1404C of the isolation structure 1404.

Figure 14D:
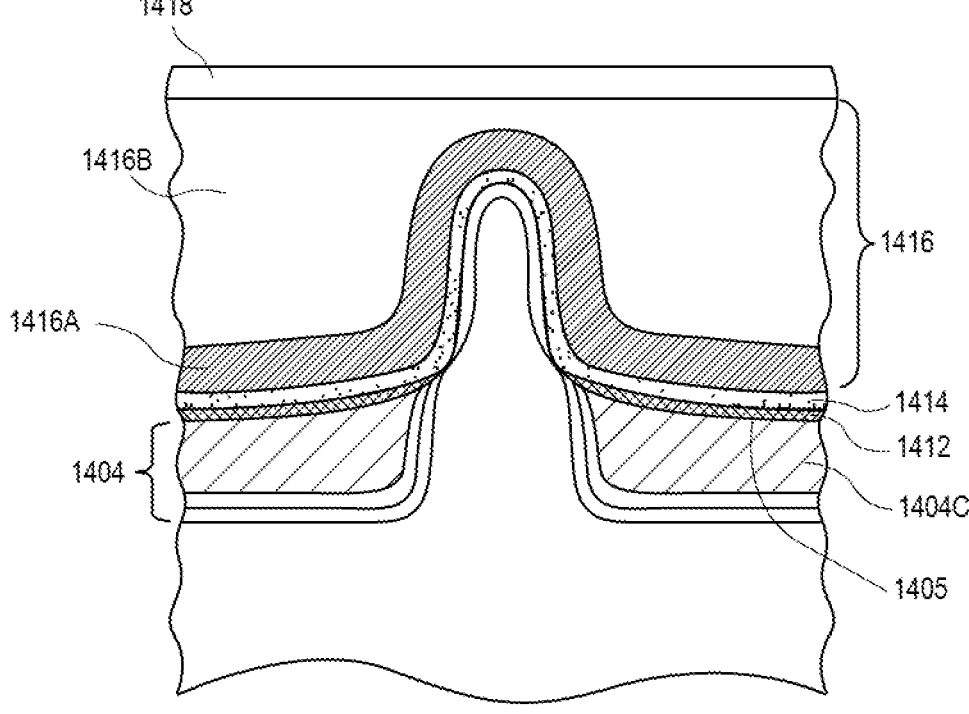

Referring to FIG. 14D, a permanent gate electrode 1416 is formed over the gate dielectric layer 1414 over the top 1400C of the upper fin portion 1400B and laterally adjacent the sidewalls 1400D of the upper fin portion 1400B. The permanent gate electrode 1416 is further over the gate dielectric layer 1414 on the portion 1412 of the placeholder gate electrode 1406 on the portion of the top surface 1405 of the insulating material 1404C.

In one embodiment, forming the permanent gate electrode 1416 includes forming a workfunction layer 1416A. In one such embodiment, the workfunction layer 1416A includes titanium and nitrogen. In another such embodiment, the workfunction layer 1416A includes titanium, aluminum, carbon and nitrogen. In one embodiment, forming the permanent gate electrode 1416 further includes forming a conductive fill metal layer 1416B formed over the workfunction layer 1416A. In one such embodiment, forming the conductive fill metal layer 1416B includes forming a tungsten-containing film using atomic layer deposition (ALD) with a tungsten hexafluoride ($WF_6$) precursor. In an embodiment, an insulating gate cap layer 1418 is formed on the permanent gate electrode 1416.

In another aspect, devices of a same conductivity type, e.g., N-type or P-type, may have differentiated gate electrode stacks for a same conductivity type. However, for comparison purposes, devices having a same conductivity type may have differentiated voltage threshold (VT) based on modulated doping.

Figure 15A:
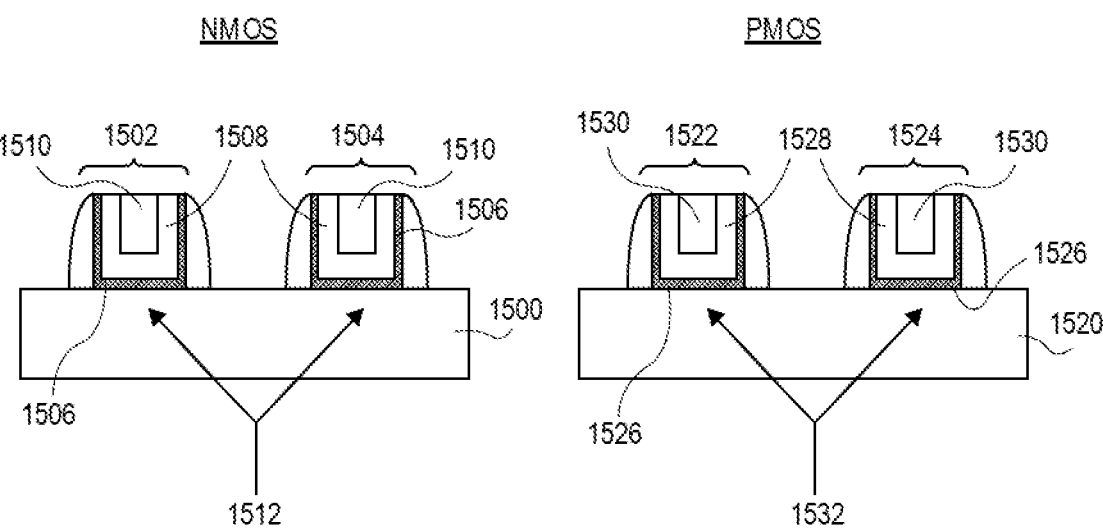
FIG. 15A illustrates cross-sectional views of a pair of NMOS devices having a differentiated voltage threshold based on modulated doping, and a pair of PMOS devices having a differentiated voltage threshold based on modulated doping, in accordance with an embodiment of the present disclosure.

FIG. 15A illustrates cross-sectional views of a pair of NMOS devices having a differentiated voltage threshold based on modulated doping, and a pair of PMOS devices having a differentiated voltage threshold based on modulated doping, in accordance with an embodiment of the present disclosure.

Referring to FIG. 15A, a first NMOS device 1502 is adjacent a second NMOS device 1504 over a semiconductor active region 1500, such as over a silicon fin or substrate. Both first NMOS device 1502 and second NMOS device 1504 include a gate dielectric layer 1506, a first gate electrode conductive layer 1508, such as a workfunction layer, and a gate electrode conductive fill 1510. In an embodiment, the first gate electrode conductive layer 1508 of the first NMOS device 1502 and of the second NMOS device 1504 are of a same material and a same thickness and, as such, have a same workfunction. However, the first NMOS device 1502 has a lower VT than the second NMOS device 1504. In one such embodiment, the first NMOS device 1502 is referred to as a "standard VT" device, and the second NMOS device 1504 is referred to as a "high VT" device. In an embodiment, the differentiated VT is achieved by using modulated or differentiated implant doping at regions 1512 of the first NMOS device 1502 and the second NMOS device 1504.

Referring again to FIG. 15A, a first PMOS device 1522 is adjacent a second PMOS device 1524 over a semiconductor active region 1520, such as over a silicon fin or substrate. Both first PMOS device 1522 and second PMOS device 1524 include a gate dielectric layer 1526, a first gate electrode conductive layer 1528, such as a workfunction layer, and a gate electrode conductive fill 1530. In an embodiment, the first gate electrode conductive layer 1528 of the first PMOS device 1522 and of the second PMOS device 1524 are of a same material and a same thickness and, as such, have a same workfunction. However, the first PMOS device 1522 has a higher VT than the second PMOS device 1524. In one such embodiment, the first PMOS device 1522 is referred to as a "standard VT" device, and the second PMOS device 1524 is referred to as a "low VT" device. In an embodiment, the differentiated VT is achieved by using modulated or differentiated implant doping at regions 1532 of the first PMOS device 1522 and the second PMOS device 1524.

Figure 15B:
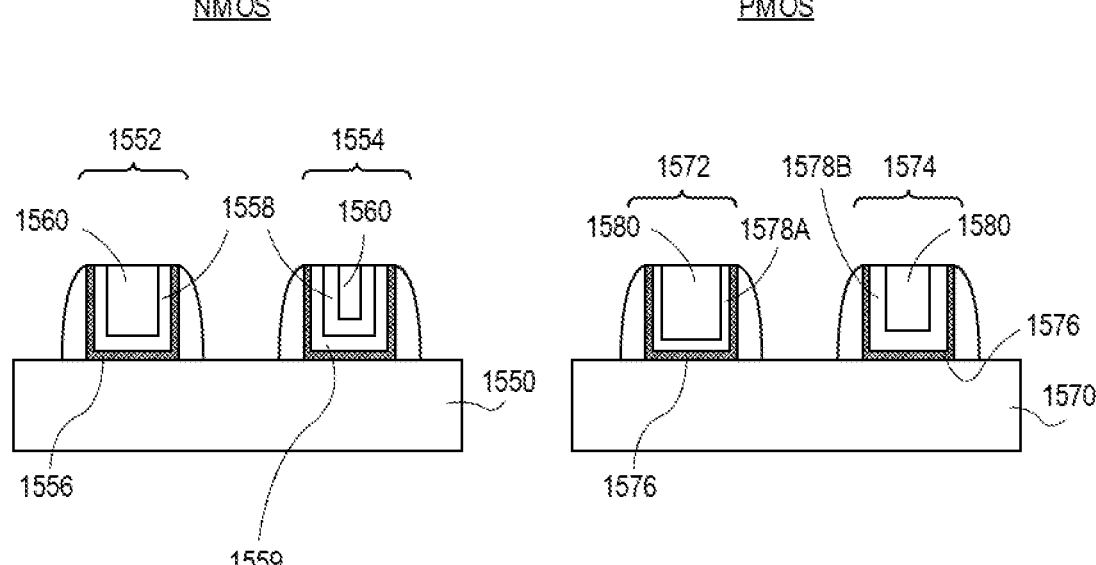
FIG. 15B illustrates cross-sectional views of a pair of NMOS devices having a differentiated voltage threshold based on differentiated gate electrode structure, and a pair of PMOS devices having a differentiated voltage threshold based on differentiated gate electrode structure, in accordance with another embodiment of the present disclosure.

In contrast to FIG. 15A, FIG. 15B illustrates cross-sectional views of a pair of NMOS devices having a differentiated voltage threshold based on differentiated gate electrode structure, and a pair of PMOS devices having a differentiated voltage threshold based on differentiated gate electrode structure, in accordance with another embodiment of the present disclosure.

Referring to FIG. 15B, a first NMOS device 1552 is adjacent a second NMOS device 1554 over a semiconductor active region 1550, such as over a silicon fin or substrate. Both first NMOS device 1552 and second NMOS device 1554 include a gate dielectric layer 1556. However, the first NMOS device 1552 and second NMOS device 1554 have structurally different gate electrode stacks. In particular, the first NMOS device 1552 includes a first gate electrode conductive layer 1558, such as a first workfunction layer, and a gate electrode conductive fill 1560. The second NMOS device 1554 includes a second gate electrode conductive layer 1559, such as a second workfunction layer, the first gate electrode conductive layer 1558 and the gate electrode conductive fill 1560. The first NMOS device 1552 has a lower VT than the second NMOS device 1554. In one such embodiment, the first NMOS device 1552 is referred to as a "standard VT" device, and the second NMOS device 1554 is referred to as a "high VT" device. In an embodiment, the differentiated VT is achieved by using differentiated gate stacks for same conductivity type devices.

Referring again to FIG. 15B, a first PMOS device 1572 is adjacent a second PMOS device 1574 over a semiconductor active region 1570, such as over a silicon fin or substrate. Both first PMOS device 1572 and second PMOS device 1574 include a gate dielectric layer 1576. However, the first PMOS device 1572 and second PMOS device 1574 have structurally different gate electrode stacks. In particular, the first PMOS device 1572 includes a gate electrode conductive layer 1578A having a first thickness, such as a workfunction layer, and a gate electrode conductive fill 1580. The second PMOS device 1574 includes a gate electrode conductive layer 1578B having a second thickness, and the gate electrode conductive fill 1580. In one embodiment, the gate electrode conductive layer 1578A and the gate electrode conductive layer 1578B have a same composition, but the thickness of the gate electrode conductive layer 1578B (second thickness) is greater than the thickness of the gate electrode conductive layer 1578A (first thickness). The first PMOS device 1572 has a higher VT than the second PMOS device 1574. In one such embodiment, the first PMOS device 1572 is referred to as a "standard VT" device, and the second PMOS device 1574 is referred to as a "low VT" device. In an embodiment, the differentiated VT is achieved by using differentiated gate stacks for same conductivity type devices.

Referring again to FIG. 15B, in accordance with an embodiment of the present disclosure, an integrated circuit structure includes a fin (e.g., a silicon fin such as 1550). It is to be appreciated that the fin has a top (as shown) and sidewalls (into and out of the page). A gate dielectric layer 1556 is over the top of the fin and laterally adjacent the sidewalls of the fin. An N-type gate electrode of device 1554 is over the gate dielectric layer 1556 over the top of the fin and laterally adjacent the sidewalls of the fin. The N-type gate electrode includes a P-type metal layer 1559 on the gate dielectric layer 1556, and an N-type metal layer 1558 on the P-type metal layer 1559. As will be appreciated, a first N-type source or drain region may be adjacent a first side of the gate electrode (e.g., into the page), and a second N-type source or drain region may be adjacent a second side of the gate electrode (e.g., out of the page), the second side opposite the first side.

In one embodiment, the P-type metal layer 1559 includes titanium and nitrogen, and the N-type metal layer 1558 includes titanium, aluminum, carbon and nitrogen. In one embodiment, the P-type metal layer 1559 has a thickness in the range of 2-12 Angstroms, and in a specific embodiment, the P-type metal layer 1559 has a thickness in the range of 2-4 Angstroms. In one embodiment, the N-type gate electrode further includes a conductive fill metal layer 1560 on the N-type metal layer 1558. In one such embodiment, the conductive fill metal layer 1560 includes tungsten. In a particular embodiment, the conductive fill metal layer 1560 includes 95 or greater atomic percent tungsten and 0.1 to 2 atomic percent fluorine.

Referring again to FIG. 15B, in accordance with another embodiment of the present disclosure, an integrated circuit structure includes a first N-type device 1552 having a voltage threshold (VT), the first N-type device 1552 having a first gate dielectric layer 1556, and a first N-type metal layer 1558 on the first gate dielectric layer 1556. Also, included is a second N-type device 1554 having a voltage threshold (VT), the second N-type device 1554 having a second gate dielectric layer 1556, a P-type metal layer 1559 on the second gate dielectric layer 1556, and a second N-type metal layer 1558 on the P-type metal layer 1559.

In one embodiment, wherein the VT of the second N-type device 1554 is higher than the VT of the first N-type device 1552. In one embodiment, the first N-type metal layer 1558 and the second N-type metal layer 1558 have a same composition. In one embodiment, the first N-type metal layer 1558 and the second N-type metal layer 1558 have a same thickness. In one embodiment, wherein the N-type metal layer 1558 includes titanium, aluminum, carbon and nitrogen, and the P-type metal layer 1559 includes titanium and nitrogen.

Referring again to FIG. 15B, in accordance with another embodiment of the present disclosure, an integrated circuit structure includes a first P-type device 1572 having a voltage threshold (VT), the first P-type device 1572 having a first gate dielectric layer 1576, and a first P-type metal layer 1578A on the first gate dielectric layer 1576. The first P-type metal layer 1578A has a thickness. A second P-type device 1574 is also included and has a voltage threshold (VT). The second P-type device 1574 has a second gate dielectric layer 1576, and a second P-type metal layer 1578B on the second gate dielectric layer 1576. The second P-type metal layer 1578B has a thickness greater than the thickness of the first P-type metal layer 1578A.

In one embodiment, the VT of the second P-type device 1574 is lower than the VT of the first P-type device 1572. In one embodiment, the first P-type metal layer 1578A and the second P-type metal layer 1578B have a same composition. In one embodiment, the first P-type metal layer 1578A and the second P-type metal layer 1578B both include titanium and nitrogen. In one embodiment, the thickness of the first P-type metal layer 1578A is less than a work-function saturation thickness of a material of the second P-type metal layer 1578B. In one embodiment, although not depicted the second P-type metal layer 1578B includes a first metal film (e.g., from a second deposition) on a second metal film (e.g., from a first deposition), and a seam is between the first metal film and the second metal film.

Referring again to FIG. 15B, in accordance with another embodiment of the present disclosure, an integrated circuit structure includes a first N-type device 1552 has a first gate dielectric layer 1556, and a first N-type metal layer 1558 on the first gate dielectric layer 1556. A second N-type device 1554 has a second gate dielectric layer 1556, a first P-type metal layer 1559 on the second gate dielectric layer 1556, and a second N-type metal layer 1558 on the first P-type metal layer 1559. A first P-type device 1572 has a third gate dielectric layer 1576, and a second P-type metal layer 1578A on the third gate dielectric layer 1576. The second P-type metal layer 1578A has a thickness. A second P-type device 1574 has a fourth gate dielectric layer 1576, and a third P-type metal layer 1578B on the fourth gate dielectric layer 1576. The third P-type metal layer 1578B has a thickness greater than the thickness of the second P-type metal layer 1578A.

In one embodiment, the first N-type device 1552 has a voltage threshold (VT), the second N-type device 1554 has a voltage threshold (VT), and the VT of the second N-type device 1554 is lower than the VT of the first N-type device 1552. In one embodiment, the first P-type device 1572 has a voltage threshold (VT), the second P-type device 1574 has a voltage threshold (VT), and the VT of the second P-type device 1574 is lower than the VT of the first P-type device 1572. In one embodiment, the third P-type metal layer 1578B includes a first metal film on a second metal film, and a seam between the first metal film and the second metal film.

It is to be appreciated that greater than two types of VT devices for a same conductivity type may be included in a same structure, such as on a same die. In a first example, FIG. 16A illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with an embodiment of the present disclosure.

Figures 16A, 16B:
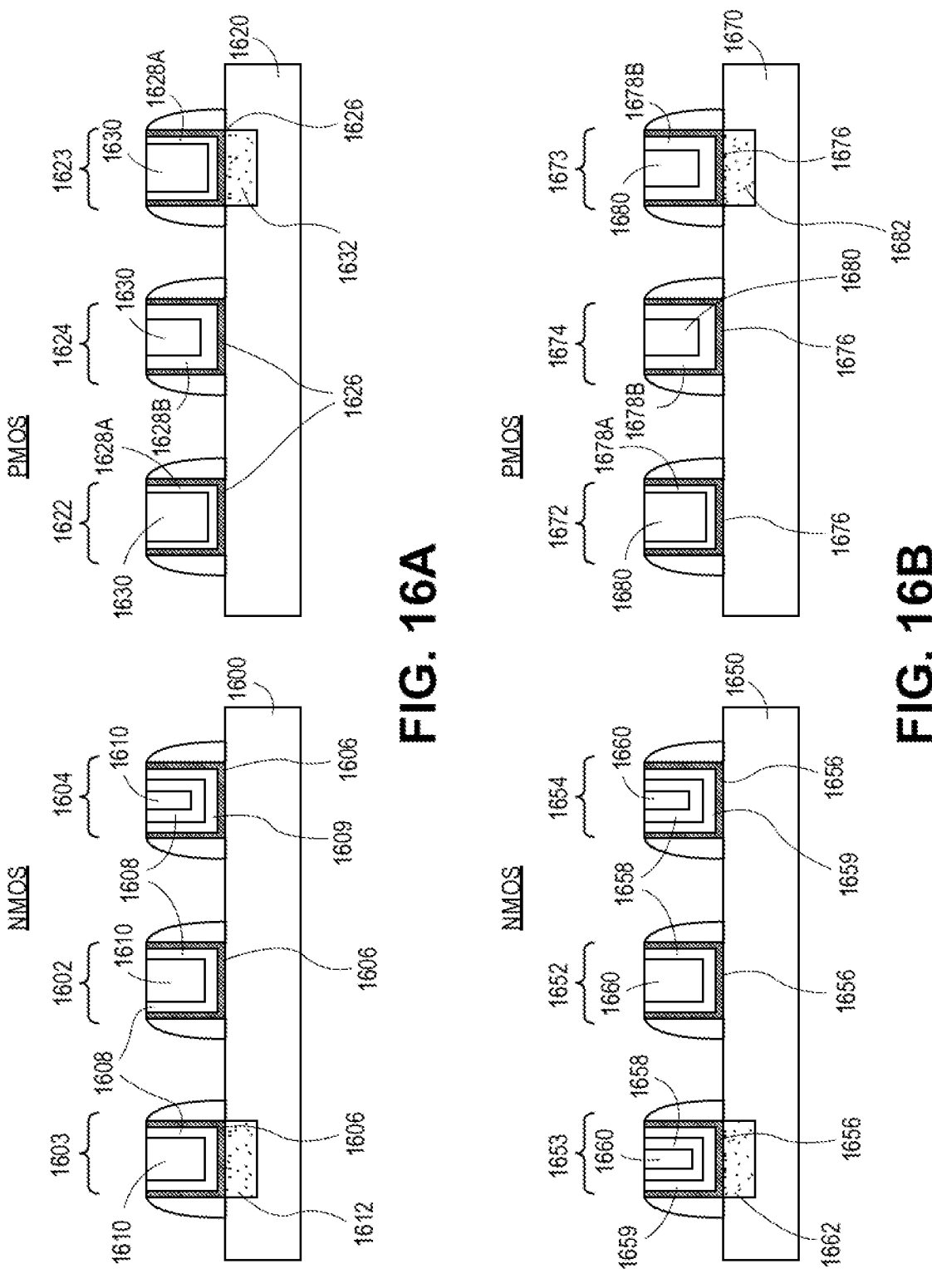
FIG. 16A illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with an embodiment of the present disclosure.
FIG. 16B illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with another embodiment of the present disclosure.

Referring to FIG. 16A, a first NMOS device 1602 is adjacent a second NMOS device 1604 and a third NMOS device 1603 over a semiconductor active region 1600, such as over a silicon fin or substrate. The first NMOS device 1602, second NMOS device 1604, and third NMOS device 1603 include a gate dielectric layer 1606. The first NMOS device 1602 and third NMOS device 1603 have structurally same or similar gate electrode stacks. However, the second NMOS device 1604 has a structurally different gate electrode stack than the first NMOS device 1602 and the third NMOS device 1603. In particular, the first NMOS device 1602 and the third NMOS device 1603 include a first gate electrode conductive layer 1608, such as a first workfunction layer, and a gate electrode conductive fill 1610. The second NMOS device 1604 includes a second gate electrode conductive layer 1609, such as a second workfunction layer, the first gate electrode conductive layer 1608 and the gate electrode conductive fill 1610. The first NMOS device 1602 has a lower VT than the second NMOS device 1604. In one such embodiment, the first NMOS device 1602 is referred to as a "standard VT" device, and the second NMOS device 1604 is referred to as a "high VT" device. In an embodiment, the differentiated VT is achieved by using differentiated gate stacks for same conductivity type devices. In an embodiment, the third NMOS device 1603 has a VT different than the VT of the first NMOS device 1602 and the second NMOS device 1604, even though the gate electrode structure of the third NMOS device 1603 is the same as the gate electrode structure of the first NMOS device 1602. In one embodiment, the VT of the third NMOS device 1603 is between the VT of the first NMOS device 1602 and the second NMOS device 1604. In an embodiment, the differentiated VT between the third NMOS device 1603 and the first NMOS device 1602 is achieved by using modulated or differentiated implant doping at a region 1612 of the third NMOS device 1603. In one such embodiment, the third N-type device 1603 has a channel region having a dopant concentration different than a dopant concentration of a channel region of the first N-type device 1602.

Referring again to FIG. 16A, a first PMOS device 1622 is adjacent a second PMOS device 1624 and a third PMOS device 1623 over a semiconductor active region 1620, such as over a silicon fin or substrate. The first PMOS device 1622, second PMOS device 1624, and third PMOS device 1623 include a gate dielectric layer 1626. The first PMOS device 1622 and third PMOS device 1623 have structurally same or similar gate electrode stacks. However, the second PMOS device 1624 has a structurally different gate electrode stack than the first PMOS device 1622 and the third PMOS device 1623. In particular, the first PMOS device 1622 and the third PMOS device 1623 include a gate electrode conductive layer 1628A having a first thickness, such as a workfunction layer, and a gate electrode conductive fill 1630. The second PMOS device 1624 includes a gate electrode conductive layer 1628B having a second thickness, and the gate electrode conductive fill 1630. In one embodiment, the gate electrode conductive layer 1628A and the gate electrode conductive layer 1628B have a same composition, but the thickness of the gate electrode conductive layer 1628B (second thickness) is greater than the thickness of the gate electrode conductive layer 1628A (first thickness). In an embodiment, the first PMOS device 1622 has a higher VT than the second PMOS device 1624. In one such embodiment, the first PMOS device 1622 is referred to as a "standard VT" device, and the second PMOS device 1624 is referred to as a "low VT" device. In an embodiment, the differentiated VT is achieved by using differentiated gate stacks for same conductivity type devices. In an embodiment, the third PMOS device 1623 has a VT different than the VT of the first PMOS device 1622 and the second PMOS device 1624, even though the gate electrode structure of the third PMOS device 1623 is the same as the gate electrode structure of the first PMOS device 1622. In one embodiment, the VT of the third PMOS device 1623 is between the VT of the first PMOS device 1622 and the second PMOS device 1624. In an embodiment, the differentiated VT between the third PMOS device 1623 and the first PMOS device 1622 is achieved by using modulated or differentiated implant doping at a region 1632 of the third PMOS device 1623. In one such embodiment, the third P-type device 1623 has a channel region having a dopant concentration different than a dopant concentration of a channel region of the first P-type device 1622.

In a second example, FIG. 16B illustrates cross-sectional views of a triplet of NMOS devices having a differentiated voltage threshold based on differentiated gate electrode structure and on modulated doping, and a triplet of PMOS devices having a differentiated voltage threshold based on differentiated gate electrode structure and on modulated doping, in accordance with another embodiment of the present disclosure.

Referring to FIG. 16B, a first NMOS device 1652 is adjacent a second NMOS device 1654 and a third NMOS device 1653 over a semiconductor active region 1650, such as over a silicon fin or substrate. The first NMOS device 1652, second NMOS device 1654, and third NMOS device 1653 include a gate dielectric layer 1656. The second NMOS device 1654 and third NMOS device 1653 have structurally same or similar gate electrode stacks. However, the first NMOS device 1652 has a structurally different gate electrode stack than the second NMOS device 1654 and the third NMOS device 1653. In particular, the first NMOS device 1652 includes a first gate electrode conductive layer 1658, such as a first workfunction layer, and a gate electrode conductive fill 1660. The second NMOS device 1654 and the third NMOS device 1653 include a second gate electrode conductive layer 1659, such as a second workfunction layer, the first gate electrode conductive layer 1658 and the gate electrode conductive fill 1660. The first NMOS device 1652 has a lower VT than the second NMOS device 1654. In one such embodiment, the first NMOS device 1652 is referred to as a "standard VT" device, and the second NMOS device 1654 is referred to as a "high VT" device. In an embodiment, the differentiated VT is achieved by using differentiated gate stacks for same conductivity type devices. In an embodiment, the third NMOS device 1653 has a VT different than the VT of the first NMOS device 1652 and the second NMOS device 1654, even though the gate electrode structure of the third NMOS device 1653 is the same as the gate electrode structure of the second NMOS device 1654. In one embodiment, the VT of the third NMOS device 1653 is between the VT of the first NMOS device 1652 and the second NMOS device 1654. In an embodiment, the differentiated VT between the third NMOS device 1653 and the second NMOS device 1654 is achieved by using modulated or differentiated implant doping at a region 1662 of the third NMOS device 1653. In one such embodiment, the third N-type device 1653 has a channel region having a dopant concentration different than a dopant concentration of a channel region of the second N-type device 1654.

Referring again to FIG. 16B, a first PMOS device 1672 is adjacent a second PMOS device 1674 and a third PMOS device 1673 over a semiconductor active region 1670, such as over a silicon fin or substrate. The first PMOS device 1672, second PMOS device 1674, and third PMOS device 1673 include a gate dielectric layer 1676. The second PMOS device 1674 and third PMOS device 1673 have structurally same or similar gate electrode stacks. However, the first PMOS device 1672 has a structurally different gate electrode stack than the second PMOS device 1674 and the third PMOS device 1673. In particular, the first PMOS device 1672 includes a gate electrode conductive layer 1678A having a first thickness, such as a workfunction layer, and a gate electrode conductive fill 1680. The second PMOS device 1674 and the third PMOS device 1673 include a gate electrode conductive layer 1678B having a second thickness, and the gate electrode conductive fill 1680. In one embodiment, the gate electrode conductive layer 1678A and the gate electrode conductive layer 1678B have a same composition, but the thickness of the gate electrode conductive layer 1678B (second thickness) is greater than the thickness of the gate electrode conductive layer 1678A (first thickness). In an embodiment, the first PMOS device 1672 has a higher VT than the second PMOS device 1674. In one such embodiment, the first PMOS device 1672 is referred to as a "standard VT" device, and the second PMOS device 1674 is referred to as a "low VT" device. In an embodiment, the differentiated VT is achieved by using differentiated gate stacks for same conductivity type devices. In an embodiment, the third PMOS device 1673 has a VT different than the VT of the first PMOS device 1672 and the second PMOS device 1674, even though the gate electrode structure of the third PMOS device 1673 is the same as the gate electrode structure of the second PMOS device 1674. In one embodiment, the VT of the third PMOS device 1673 is between the VT of the first PMOS device 1672 and the second PMOS device 1674. In an embodiment, the differentiated VT between the third PMOS device 1673 and the first PMOS device 1672 is achieved by using modulated or differentiated implant doping at a region 1682 of the third PMOS device 1673. In one such embodiment, the third P-type device 1673 has a channel region having a dopant concentration different than a dopant concentration of a channel region of the second P-type device 1674.

FIGS. 17A-17D illustrate cross-sectional views of various operations in a method of fabricating NMOS devices having a differentiated voltage threshold based on differentiated gate electrode structure, in accordance with another embodiment of the present disclosure.

Figure 17A:
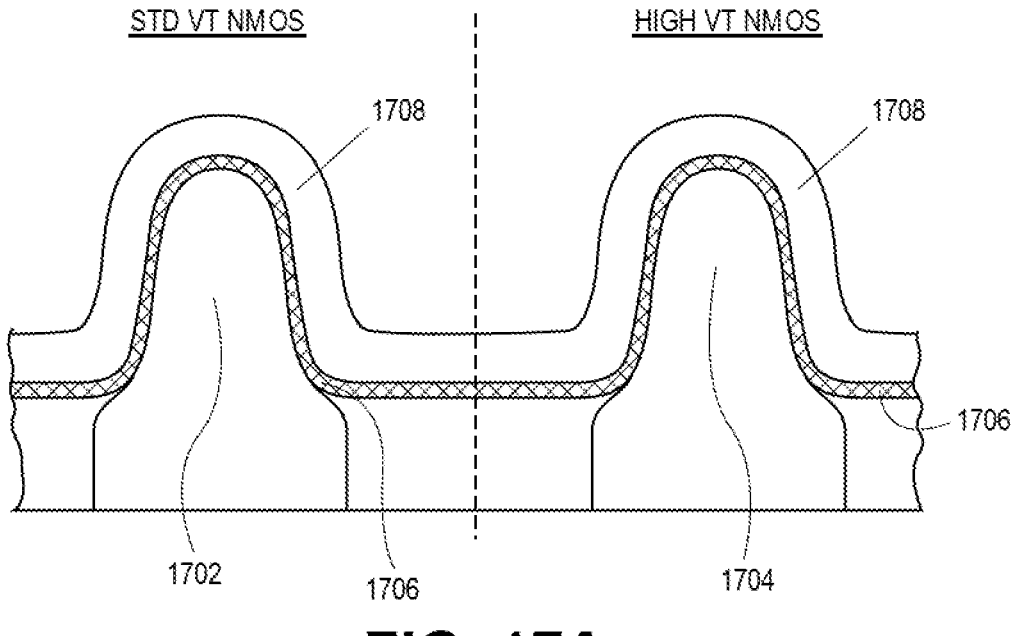
FIGS. 17A-17D illustrate cross-sectional views of various operations in a method of fabricating NMOS devices having a differentiated voltage threshold based on differentiated gate electrode structure, in accordance with another embodiment of the present disclosure.

Referring to FIG. 17A, where a "standard VT NMOS" region (STD VT NMOS) and a "high VT NMOS" region (HIGH VT NMOS) are shown as bifurcated on a common substrate, a method of fabricating an integrated circuit structure includes forming a gate dielectric layer 1706 over a first semiconductor fin 1702 and over a second semiconductor fin 1704, such as over first and second silicon fins. A P-type metal layer 1708 is formed on the gate dielectric layer 1706 over the first semiconductor fin 1702 and over the second semiconductor fin 1704.

Figure 17B:
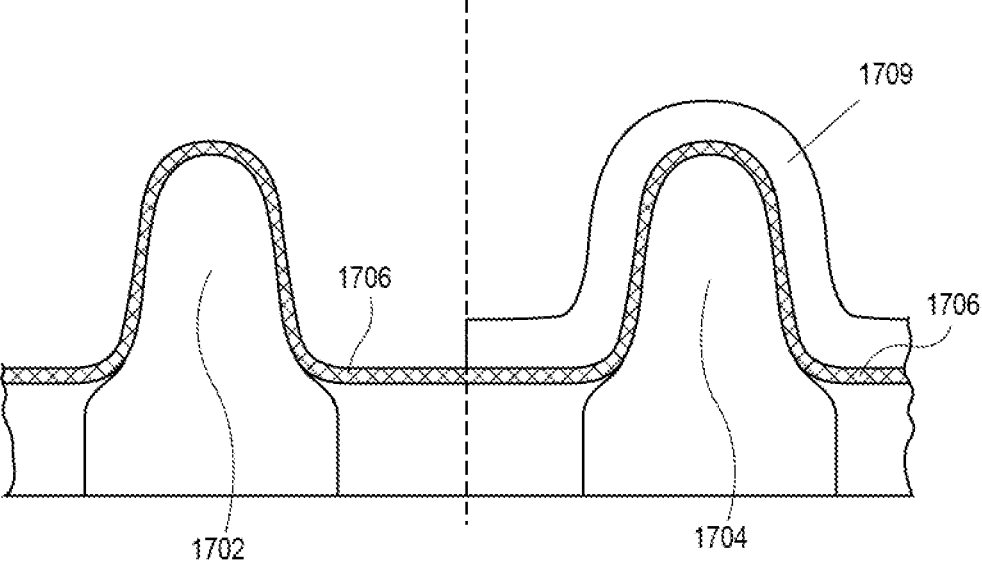

Referring to FIG. 17B, a portion of the P-type metal layer 1708 is removed from the gate dielectric layer 1706 over the first semiconductor fin 1702, but a portion 1709 of the P-type metal layer 1708 is retained on the gate dielectric layer 1706 over the second semiconductor fin 1704.

Figures 17C, 17D:
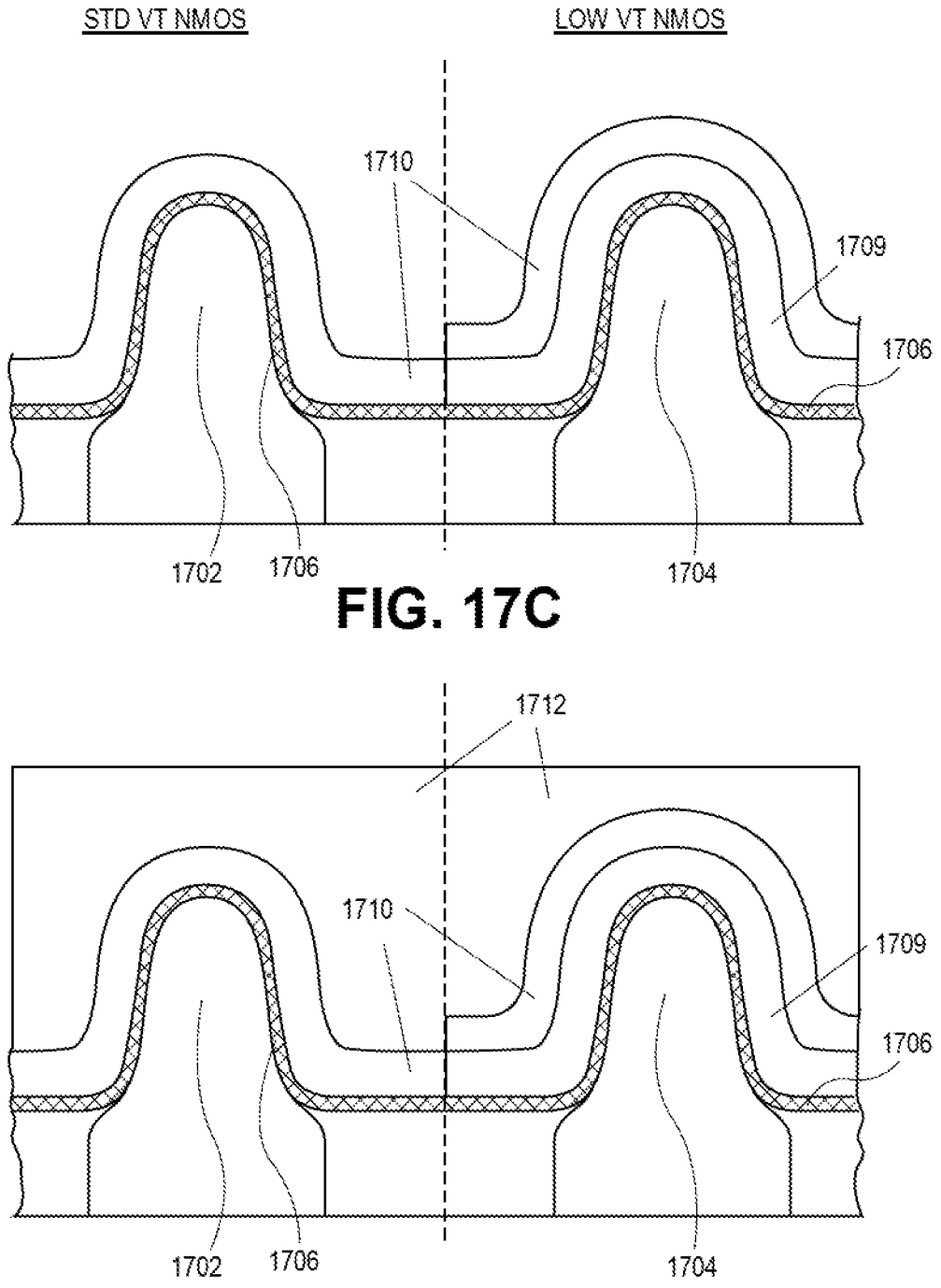

Referring to FIG. 17C, an N-type metal layer 1710 is formed on the gate dielectric layer 1706 over the first semiconductor fin 1702, and on the portion 1709 of the P-type metal layer on the gate dielectric layer 1706 over the second semiconductor fin 1704. In an embodiment, subsequent processing includes forming a first N-type device having a voltage threshold (VT) over the first semiconductor fin 1702, and forming a second N-type device having a voltage threshold (VT) over the second semiconductor fin 1704, wherein the VT of the second N-type device is higher than the VT of the first N-type device.

Referring to FIG. 17D, in an embodiment, a conductive fill metal layer 1712 is formed on the N-type metal layer 1710. In one such embodiment, forming the conductive fill metal layer 1712 includes forming a tungsten-containing film using atomic layer deposition (ALD) with a tungsten hexafluoride ($WF_6$) precursor.

FIGS. 18A-18D illustrate cross-sectional views of various operations in a method of fabricating PMOS devices having a differentiated voltage threshold based on differentiated gate electrode structure, in accordance with another embodiment of the present disclosure.

Figures 18A, 18B:
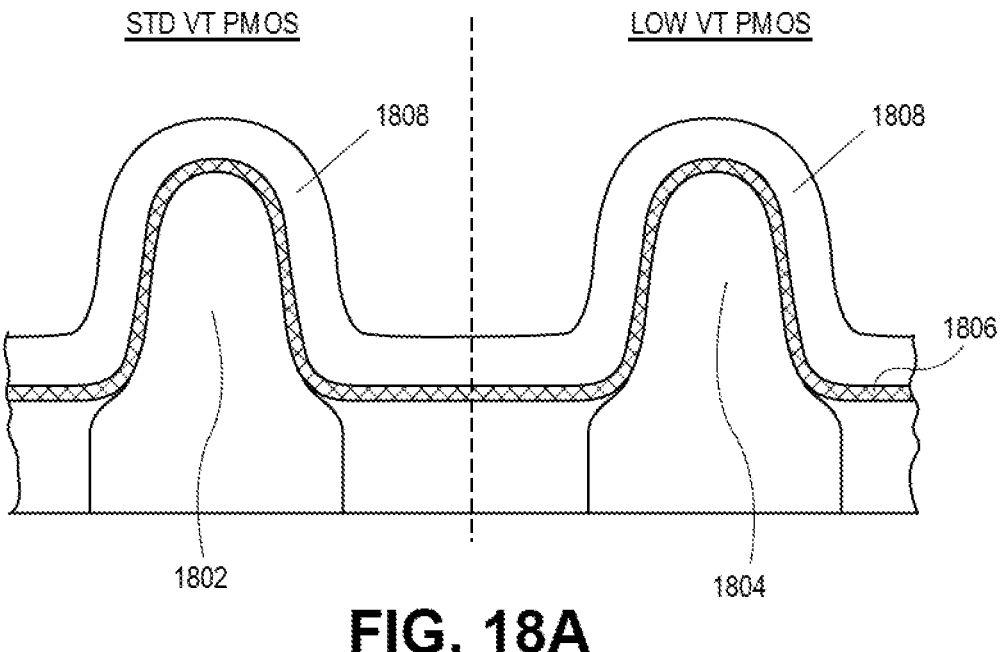
FIGS. 18A-18D illustrate cross-sectional views of various operations in a method of fabricating PMOS devices having a differentiated voltage threshold based on differentiated gate electrode structure, in accordance with another embodiment of the present disclosure.

Referring to FIG. 18A, where a "standard VT PMOS" region (STD VT PMOS) and a "low VT PMOS" region (LOW VT PMOS) are shown as bifurcated on a common substrate, a method of fabricating an integrated circuit structure includes forming a gate dielectric layer 1806 over a first semiconductor fin 1802 and over a second semiconductor fin 1804, such as over first and second silicon fins. A first P-type metal layer 1808 is formed on the gate dielectric layer 1806 over the first semiconductor fin 1802 and over the second semiconductor fin 1804.

Referring to FIG. 18B, a portion of the first P-type metal layer 1808 is removed from the gate dielectric layer 1806 over the first semiconductor fin 1802, but a portion 1809 of the first P-type metal layer 1808 is retained on the gate dielectric layer 1806 over the second semiconductor fin 1804.

Figures 18C, 18D:
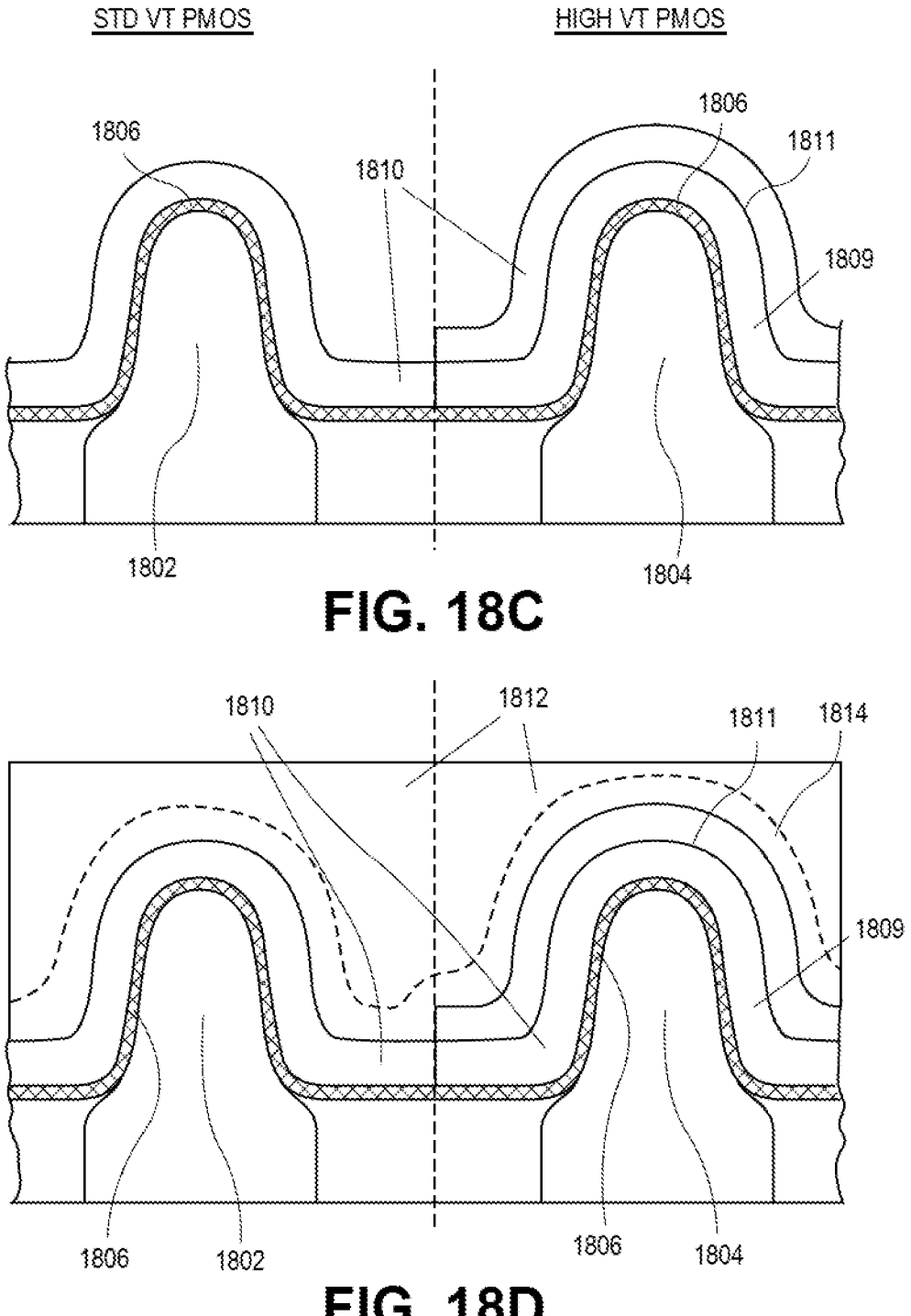

Referring to FIG. 18C, a second P-type metal layer 1810 is formed on the gate dielectric layer 1806 over the first semiconductor fin 1802, and on the portion 1809 of the first P-type metal layer on the gate dielectric layer 1806 over the second semiconductor fin 1804. In an embodiment, subsequent processing includes forming a first P-type device having a voltage threshold (VT) over the first semiconductor fin 1802, and forming a second P-type device having a voltage threshold (VT) over the second semiconductor fin 1804, wherein the VT of the second P-type device is lower than the VT of the first P-type device.

In one embodiment, the first P-type metal layer 1808 and the second P-type metal layer 1810 have a same composition. In one embodiment, the first P-type metal layer 1808 and the second P-type metal layer 1810 have a same thickness. In one embodiment, the first P-type metal layer 1808 and the second P-type metal layer 1810 have a same thickness and a same composition. In one embodiment, a seam 1811 is between the first P-type metal layer 1808 and the second P-type metal layer 1810, as is depicted.

Referring to FIG. 18D, in an embodiment, a conductive fill metal layer 1812 is formed over the P-type metal layer 1810. In one such embodiment, forming the conductive fill metal layer 1812 includes forming a tungsten-containing film using atomic layer deposition (ALD) with a tungsten hexafluoride (WF$_6$) precursor. In one embodiment, an N-type metal layer 1814 is formed on the P-type metal layer 1810 prior to forming the conductive fill metal layer 1812, as is depicted. In one such embodiment, the N-type metal layer 1814 is an artifact of a dual metal gate replacement processing scheme.

In another aspect, metal gate structures for complementary metal oxide semiconductor (CMOS) semiconductor devices are described. In an example, FIG. 19 illustrates a cross-sectional view of an integrated circuit structure having a P/N junction, in accordance with an embodiment of the present disclosure.

Figure 19:
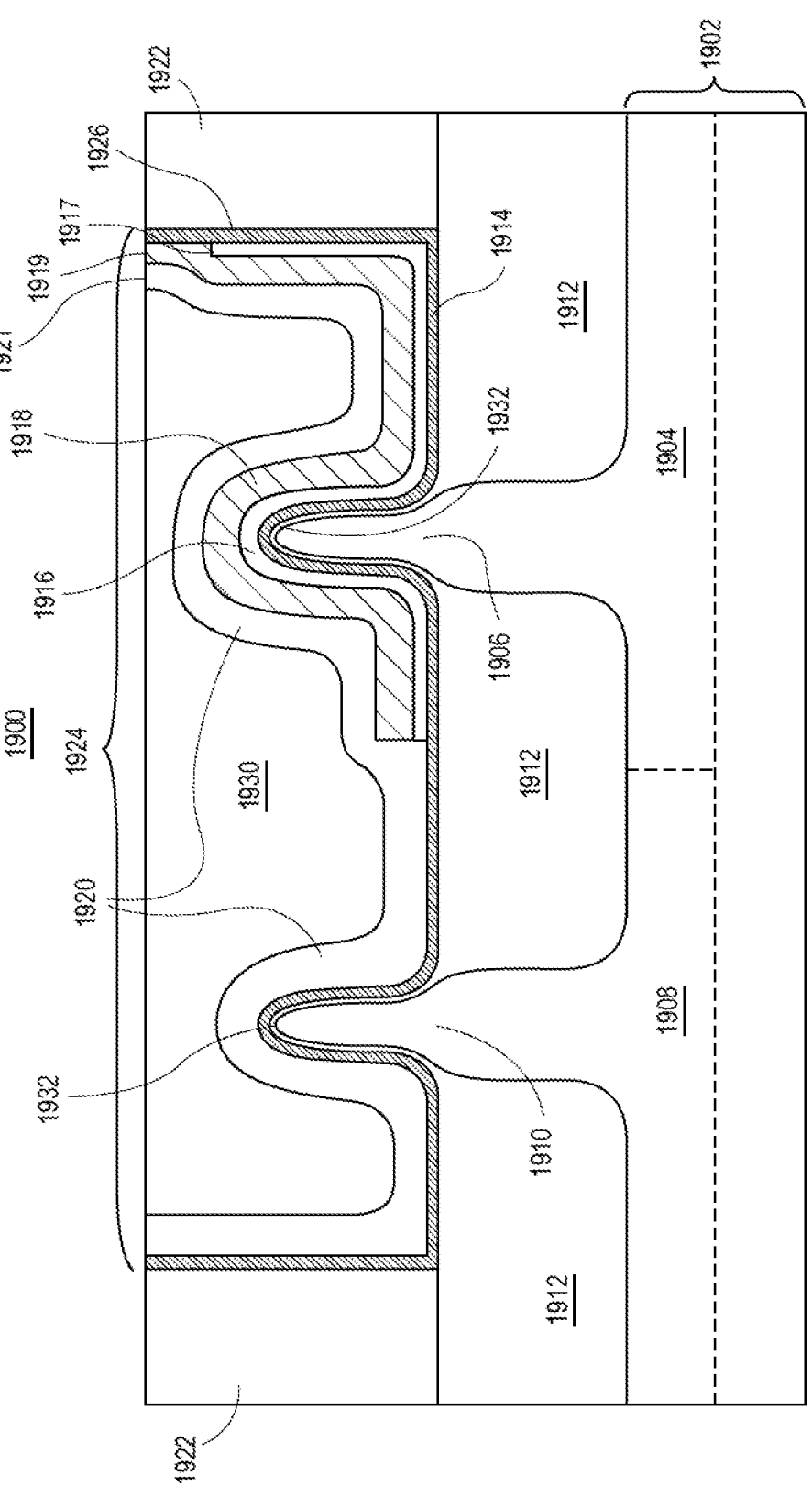
FIG. 19 illustrates a cross-sectional view of an integrated circuit structure having a P/N junction, in accordance with an embodiment of the present disclosure.

Referring to FIG. 19, an integrated circuit structure 1900 includes a semiconductor substrate 1902 having an N well region 1904 having a first semiconductor fin 1906 protruding therefrom and a P well region 1908 having a second semiconductor fin 1910 protruding therefrom. The first semiconductor fin 1906 is spaced apart from the second semiconductor fin 1910. The N well region 1904 is directly adjacent to the P well region 1908 in the semiconductor substrate 1902. A trench isolation structure 1912 is on the semiconductor substrate 1902 outside of and between first 1906 and second 1910 semiconductor fins. The first 1906 and second 1910 semiconductor fins extend above the trench isolation structure 1912.

A gate dielectric layer 1914 is on the first 1906 and second 1910 semiconductor fins and on the trench isolation structure 1912. The gate dielectric layer 1914 is continuous between the first 1906 and second 1910 semiconductor fins. A conductive layer 1916 is over the gate dielectric layer 1914 over the first semiconductor fin 1906 but not over the second semiconductor fin 1910. In one embodiment, the conductive layer 1916 includes titanium, nitrogen and oxygen. A P-type metal gate layer 1918 is over the conductive layer 1916 over the first semiconductor fin 1906 but not over the second semiconductor fin 1910. The P-type metal gate layer 1918 is further on a portion of but not all of the trench isolation structure 1912 between the first semiconductor fin 1906 and the second semiconductor fin 1910. An N-type metal gate layer 1920 is over the second semiconductor fin 1910, over the trench isolation structure 1912 between the first semiconductor fin 1906 and the second semiconductor fin 1910, and over the P-type metal gate layer 1918.

In one embodiment, an inter-layer dielectric (ILD) layer 1922 is above the trench isolation structure 1912 on the outsides of the first semiconductor fin 1906 and the second semiconductor fin 1910. The ILD layer 1922 has an opening 1924, the opening 1924 exposing the first 1906 and second 1910 semiconductor fins. In one such embodiment, the conductive layer 1916, the P-type metal gate layer 1918, and the N-type metal gate layer 1920 are further formed along a sidewall 1926 of the opening 1924, as is depicted. In a particular embodiment, the conductive layer 1916 has a top surface 1917 along the sidewall 1926 of the opening 1924 below a top surface 1919 of the P-type metal gate layer 1918 and a top surface 1921 of the N-type metal gate layer 1920 along the sidewall 1926 of the opening 1924, as is depicted.

In one embodiment, the P-type metal gate layer 1918 includes titanium and nitrogen. In one embodiment, the N-type metal gate layer 1920 includes titanium and aluminum. In one embodiment, a conductive fill metal layer 1930 is over the N-type metal gate layer 1920, as is depicted. In one such embodiment, the conductive fill metal layer 1930 includes tungsten. In a particular embodiment, the conductive fill metal layer 1930 includes 95 or greater atomic percent tungsten and 0.1 to 2 atomic percent fluorine. In one embodiment, the gate dielectric layer 1914 has a layer including hafnium and oxygen. In one embodiment, a thermal or chemical oxide layer 1932 is between upper portions of the first 1906 and second 1910 semiconductor fins, as is depicted. In one embodiment, the semiconductor substrate 1902 is a bulk silicon semiconductor substrate.

Referring now to only the right-hand side of FIG. 19, in accordance with an embodiment of the present disclosure, an integrated circuit structure includes a semiconductor substrate 1902 including an N well region 1904 having a semiconductor fin 1906 protruding therefrom. A trench isolation structure 1912 is on the semiconductor substrate 1902 around the semiconductor fin 1906. The semiconductor fin 1906 extends above the trench isolation structure 1912. A gate dielectric layer 1914 is over the semiconductor fin 1906. A conductive layer 1916 is over the gate dielectric layer 1914 over the semiconductor fin 1906. In one embodiment, the conductive layer 1916 includes titanium, nitrogen and oxygen. A P-type metal gate layer 1918 is over the conductive layer 1916 over the semiconductor fin 1906.

In one embodiment, an inter-layer dielectric (ILD) layer 1922 is above the trench isolation structure 1912. The ILD layer has an opening, the opening exposing the semiconductor fin 1906. The conductive layer 1916 and the P-type metal gate layer 1918 are further formed along a sidewall of the opening. In one such embodiment, the conductive layer 1916 has a top surface along the sidewall of the opening below a top surface of the P-type metal gate layer 1918 along the sidewall of the opening. In one embodiment, the P-type metal gate layer 1918 is on the conductive layer 1916. In one embodiment, the P-type metal gate layer 1918 includes titanium and nitrogen. In one embodiment, a conductive fill metal layer 1930 is over the P-type metal gate layer 1918. In one such embodiment, the conductive fill metal layer 1930 includes tungsten. In a particular embodiment, the conductive fill metal layer 1930 is composed of 95 or greater atomic percent tungsten and 0.1 to 2 atomic percent fluorine. In one embodiment, the gate dielectric layer 1914 includes a layer having hafnium and oxygen.

FIGS. 20A-20H illustrate cross-sectional views of various operations in a method of fabricating an integrated circuit structure using a dual metal gate replacement gate process flow, in accordance with an embodiment of the present disclosure.

Figure 20A:
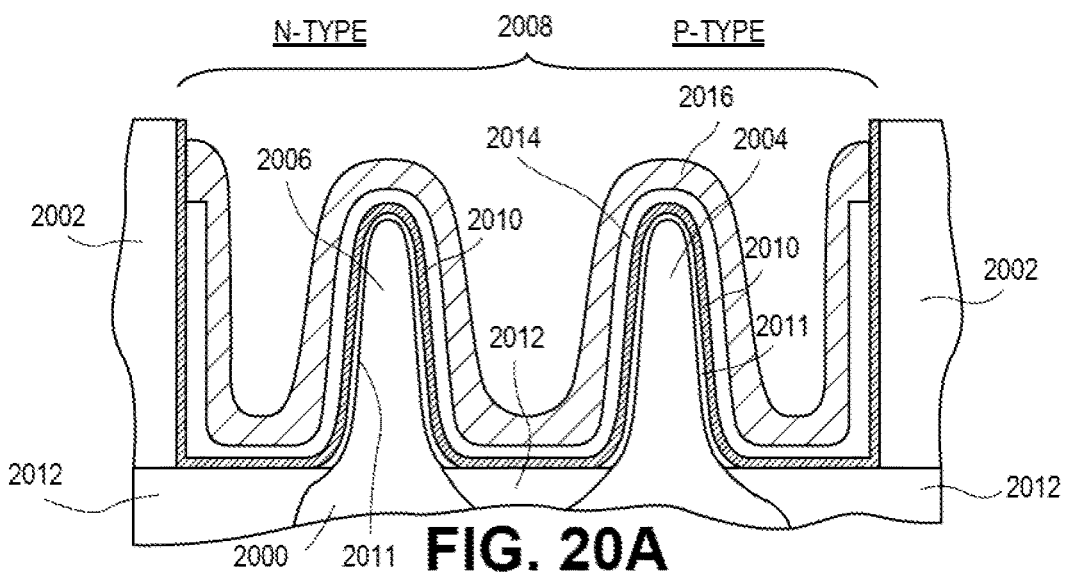
FIGS. 20A-20H illustrate cross-sectional views of various operations in a method of fabricating an integrated circuit structure using a dual metal gate replacement gate process flow, in accordance with an embodiment of the present disclosure.

Referring to FIG. 20A, which shows an NMOS (N-type) regions and a PMOS (P-type) region, a method of fabricating an integrated circuit structure includes forming an inter-layer dielectric (ILD) layer 2002 above first 2004 and second 2006 semiconductor fins above a substrate 2000. An opening 2008 is formed in the ILD layer 2002, the opening 2008 exposing the first 2004 and second 2006 semiconductor fins. In one embodiment, the opening 2008 is formed by removing a gate placeholder or dummy gate structure initially in place over the first 2004 and second 2006 semiconductor fins.

A gate dielectric layer 2010 is formed in the opening 2008 and over the first 2004 and second 2006 semiconductor fins and on a portion of a trench isolation structure 2012 between the first 2004 and second 2006 semiconductor fins. In one embodiment, the gate dielectric layer 2010 is formed on a thermal or chemical oxide layer 2011, such as a silicon oxide or silicon dioxide layer, formed on the first 2004 and second 2006 semiconductor fins, as is depicted. In another embodiment, the gate dielectric layer 2010 is formed directly on the first 2004 and second 2006 semiconductor fins.

A conductive layer 2014 is formed over the gate dielectric layer 2010 formed over the first 2004 and second 2006 semiconductor fins In one embodiment, the conductive layer 2014 includes titanium, nitrogen and oxygen. A P-type metal gate layer 2016 is formed over the conductive layer 2014 formed over the first semiconductor fin 2004 and over the second 2006 semiconductor fin.

Figure 20B:
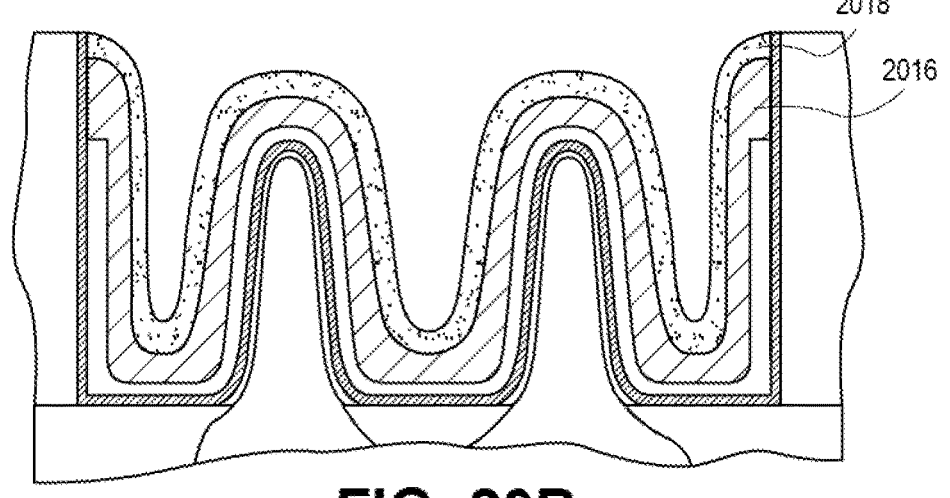

Referring to FIG. 20B, a dielectric etch stop layer 2018 is formed on the P-type metal gate layer 2016. In one embodiment, the dielectric etch stop layer 2018 includes a first layer of silicon oxide (e.g., $SiO_2$), a layer of aluminum oxide (e.g., $Al_2O_3$) on the first layer of silicon oxide, and a second layer of silicon oxide (e.g., $SiO_2$) on the layer of aluminum oxide.

Figure 20C:
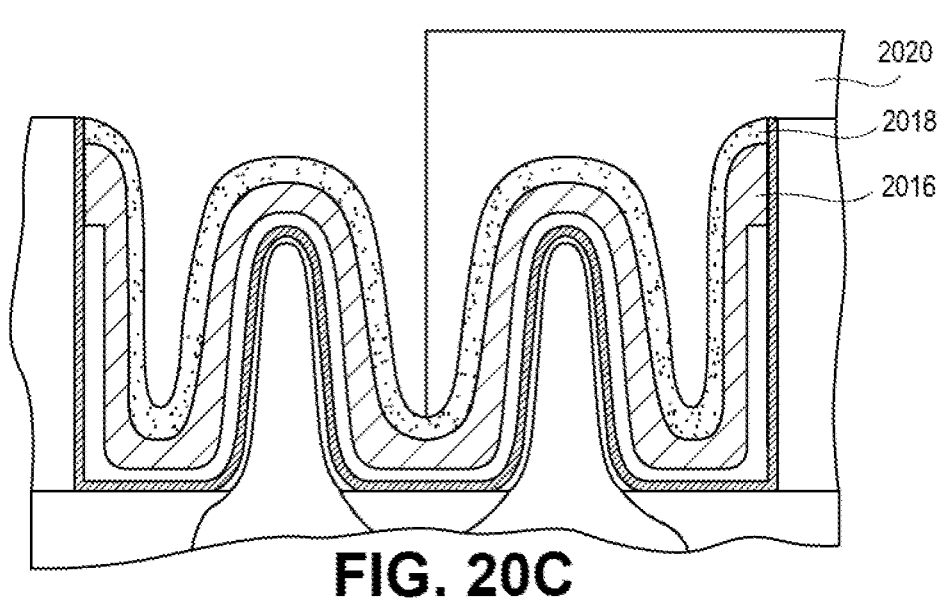

Referring to FIG. 20C, a mask 2020 is formed over the structure of FIG. 20B. The mask 2020 covers the PMOS region and expose the NMOS region.

Figure 20D:
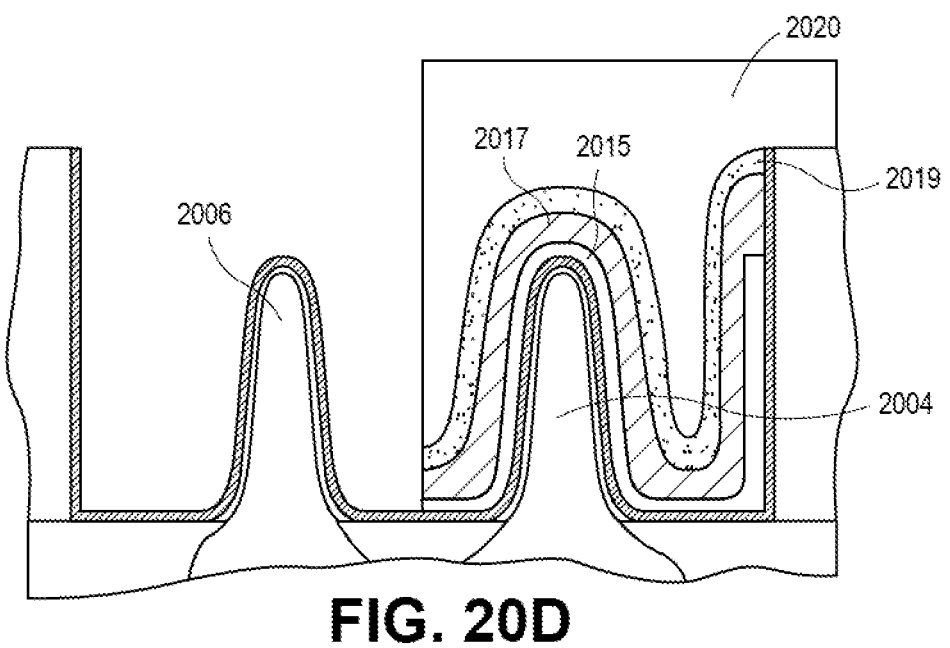

Referring to FIG. 20D, the dielectric etch stop layer 2018, the P-type metal gate layer 2016 and the conductive layer 2014 are patterned to provide a patterned dielectric etch stop layer 2019, a patterned P-type metal gate layer 2017 over a patterned conductive layer 2015 over the first semiconductor fin 2004 but not over the second semiconductor fin 2006. In an embodiment, the conductive layer 2014 protects the second semiconductor fin 2006 during the patterning.

Figure 20E:
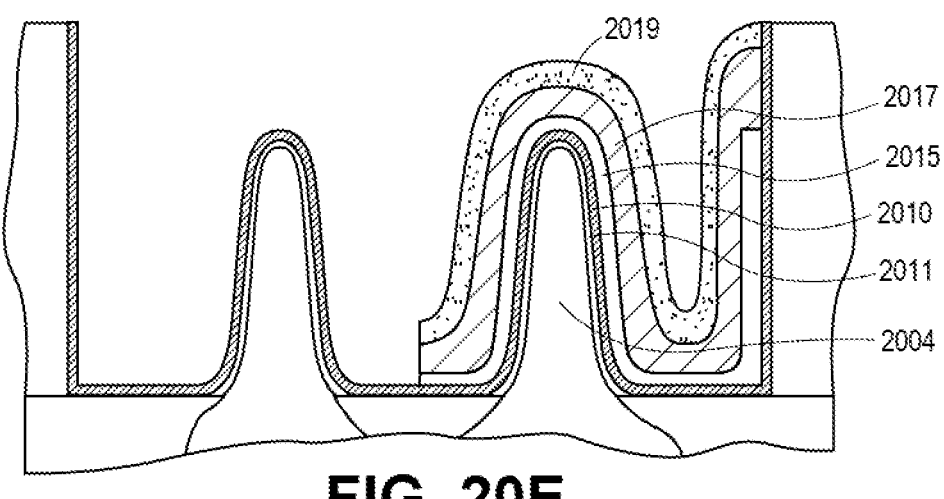
Figure 20F:
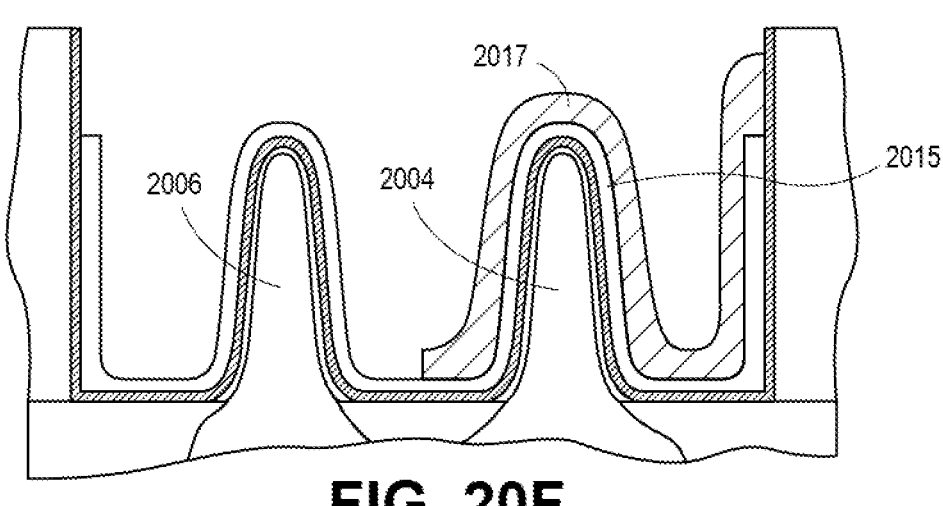

Referring to FIG. 20E, the mask 2020 is removed from the structure of FIG. 20D. Referring to FIG. 20F, the patterned dielectric etch stop layer 2019 is removed from the structure of FIG. 3E.

Figure 20G:
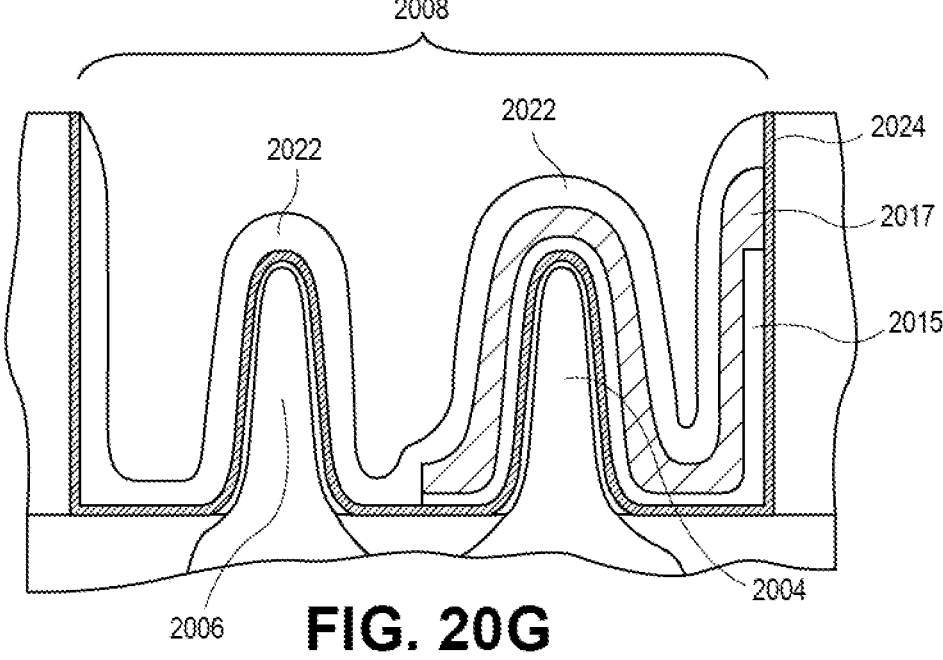

Referring to FIG. 20G, an N-type metal gate layer 2022 is formed over the second semiconductor fin 2006, over the portion of the trench isolation structure 2012 between the first 2004 and second 2006 semiconductor fins, and over the patterned P-type metal gate layer 2017. In an embodiment, the patterned conductive layer 2015, the patterned P-type metal gate layer 2017, and the N-type metal gate layer 2022 are further formed along a sidewall 2024 of the opening 2008. In one such embodiment, the patterned conductive layer 2015 has a top surface along the sidewall 2024 of the opening 2008 below a top surface of the patterned P-type metal gate layer 2017 and a top surface of the N-type metal gate layer 2022 along the sidewall 2024 of the opening 2008.

Figure 20H:
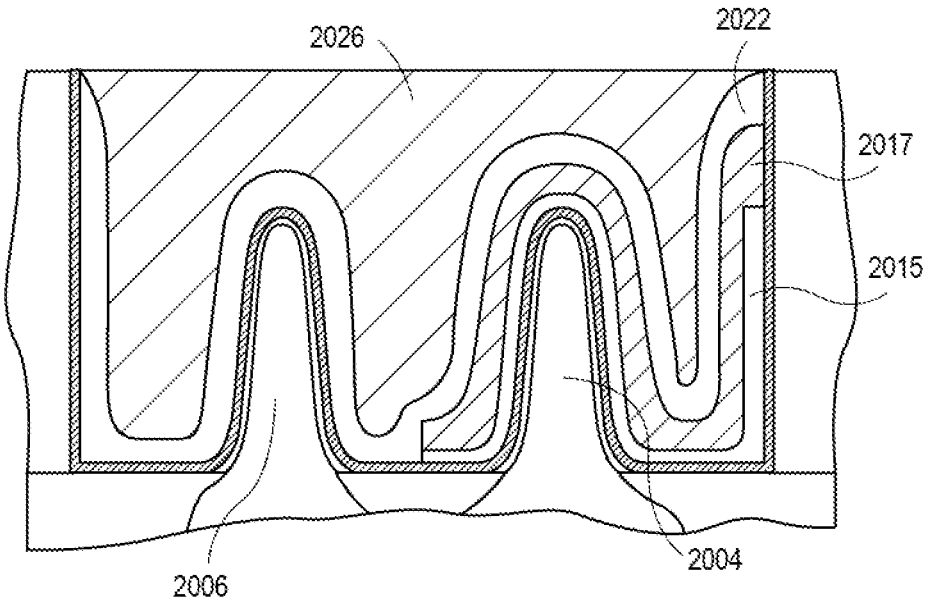

Referring to FIG. 20H, a conductive fill metal layer 2026 is formed over the N-type metal gate layer 2022. In one embodiment, the conductive fill metal layer 2026 is formed by depositing a tungsten-containing film using atomic layer deposition (ALD) with a tungsten hexafluoride ($WF_6$) precursor.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that in the above exemplary FEOL embodiments, in an embodiment, 10 nanometer or sub-10 nanometer node processing is implemented directly in to the fabrication schemes and resulting structures as a technology driver. In other embodiment, FEOL considerations may be driven by BEOL 10 nanometer or sub-10 nanometer processing requirements. For example, material selection and layouts for FEOL layers and devices may need to accommodate BEOL processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semi-conductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 21:
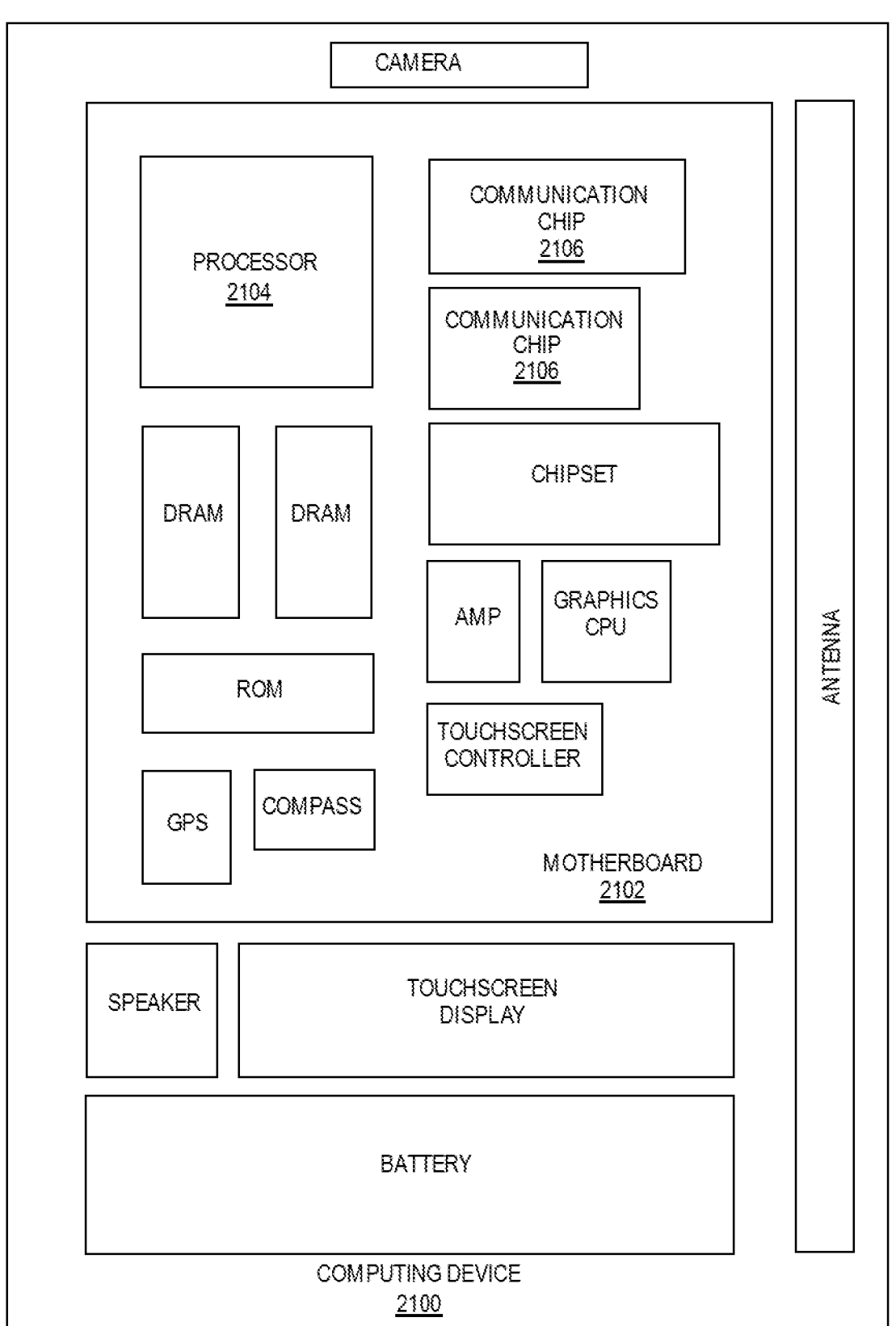
FIG. 21 illustrates a computing device in accordance with one implementation of the disclosure.

FIG. 21 illustrates a computing device 2100 in accordance with one implementation of the disclosure. The computing device 2100 houses a board 2102. The board 2102 may include a number of components, including but not limited to a processor 2104 and at least one communication chip 2106. The processor 2104 is physically and electrically coupled to the board 2102. In some implementations the at least one communication chip 2106 is also physically and electrically coupled to the board 2102. In further implementations, the communication chip 2106 is part of the processor 2104.

Depending on its applications, computing device 2100 may include other components that may or may not be physically and electrically coupled to the board 2102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2106 enables wireless communications for the transfer of data to and from the computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2100 may include a plurality of communication chips 2106. For instance, a first communication chip 2106 may be dedicated to shorter range wireless communications such as Wi-Fi and Bluetooth and a second communication chip 2106 may be dedicated to longer range wireless communications such as GPS, EDGE, GPRS, CDMA, WiMAX, LTE, Ev-DO, and others.

The processor 2104 of the computing device 2100 includes an integrated circuit die packaged within the processor 2104. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 2106 also includes an integrated circuit die packaged within the communication chip 2106. In accordance with another implementation of the disclosure, the integrated circuit die of the communication chip is built in accordance with implementations of the disclosure.

In further implementations, another component housed within the computing device 2100 may contain an integrated circuit die built in accordance with implementations of embodiments of the disclosure.

In various embodiments, the computing device 2100 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 2100 may be any other electronic device that processes data.

Figure 22:
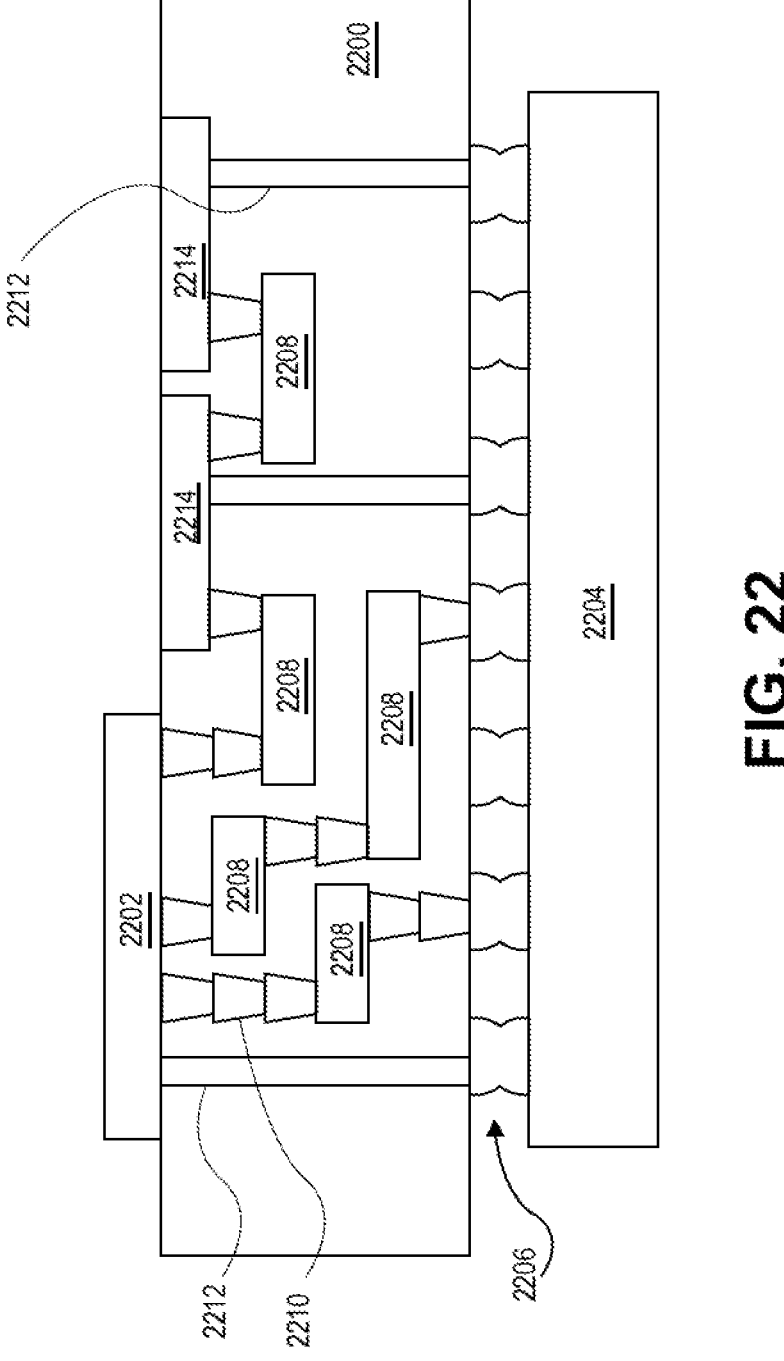
FIG. 22 illustrates an interposer that includes one or more embodiments of the disclosure.

FIG. 22 illustrates an interposer 2200 that includes one or more embodiments of the disclosure. The interposer 2200 is an intervening substrate used to bridge a first substrate 2202 to a second substrate 2204. The first substrate 2202 may be, for instance, an integrated circuit die. The second substrate 2204 may be, for instance, a memory module, a computer motherboard, or another integrated circuit die. Generally, the purpose of an interposer 2200 is to spread a connection to a wider pitch or to reroute a connection to a different connection. For example, an interposer 2200 may couple an integrated circuit die to a ball grid array (BGA) 2206 that can subsequently be coupled to the second substrate 2204. In some embodiments, the first and second substrates 2202/2204 are attached to opposing sides of the interposer 2200. In other embodiments, the first and second substrates 2202/2204 are attached to the same side of the interposer 2200. And in further embodiments, three or more substrates are interconnected by way of the interposer 2200.

The interposer 2200 may be formed of an epoxy resin, a fiberglass-reinforced epoxy resin, a ceramic material, or a polymer material such as polyimide. In further implementations, the interposer 2200 may be formed of alternate rigid or flexible materials that may include the same materials described above for use in a semiconductor substrate, such as silicon, germanium, and other group III-V and group IV materials.

The interposer 2200 may include metal interconnects 2208 and vias 2210, including but not limited to through-silicon vias (TSVs) 2212. The interposer 2200 may further include embedded devices 2214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 2200. In accordance with embodiments of the disclosure, apparatuses or processes disclosed herein may be used in the fabrication of interposer 2200 or in the fabrication of components included in the interposer 2200.

Figure 23:
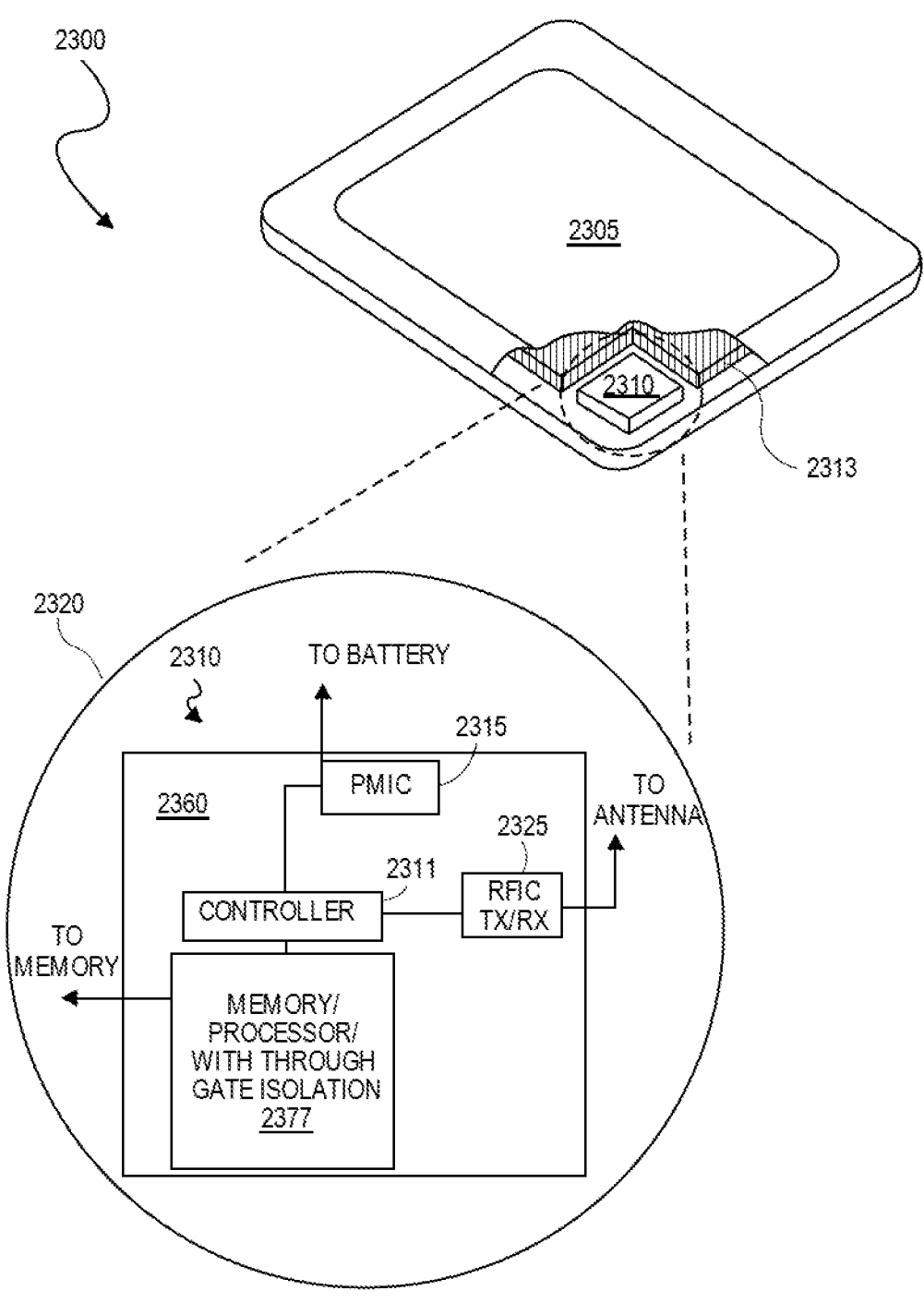
FIG. 23 is an isometric view of a mobile computing platform employing an IC fabricated according to one or more processes described herein or including one or more features described herein, in accordance with an embodiment of the present disclosure.

FIG. 23 is an isometric view of a mobile computing platform 2300 employing an integrated circuit (IC) fabricated according to one or more processes described herein or including one or more features described herein, in accordance with an embodiment of the present disclosure.

The mobile computing platform 2300 may be any portable device configured for each of electronic data display, electronic data processing, and wireless electronic data transmission. For example, mobile computing platform 2300 may be any of a tablet, a smart phone, laptop computer, etc. and includes a display screen 2305 which in the exemplary embodiment is a touchscreen (capacitive, inductive, resistive, etc.), a chip-level (SoC) or package-level integrated system 2310, and a battery 2313. As illustrated, the greater the level of integration in the system 2310 enabled by higher transistor packing density, the greater the portion of the mobile computing platform 2300 that may be occupied by the battery 2313 or non-volatile storage, such as a solid state drive, or the greater the transistor gate count for improved platform functionality. Similarly, the greater the carrier mobility of each transistor in the system 2310, the greater the functionality. As such, techniques described herein may enable performance and form factor improvements in the mobile computing platform 2300.

The integrated system 2310 is further illustrated in the expanded view 2320. In the exemplary embodiment, packaged device 2377 includes at least one memory chip (e.g., RAM), or at least one processor chip (e.g., a multi-core microprocessor and/or graphics processor) fabricated according to one or more processes described herein or including one or more features described herein. The packaged device 2377 is further coupled to the board 2360 along with one or more of a power management integrated circuit (PMIC) 2315, RF (wireless) integrated circuit (RFIC) 2325 including a wideband RF (wireless) transmitter and/or receiver (e.g., including a digital baseband and an analog front end module further comprises a power amplifier on a transmit path and a low noise amplifier on a receive path), and a controller thereof 2311. Functionally, the PMIC 2315 performs battery power regulation, DC-to-DC conversion, etc., and so has an input coupled to the battery 2313 and with an output providing a current supply to all the other functional modules. As further illustrated, in the exemplary embodiment, the RFIC 2325 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 2377 or within a single IC (SoC) coupled to the package substrate of the packaged device 2377.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 24:
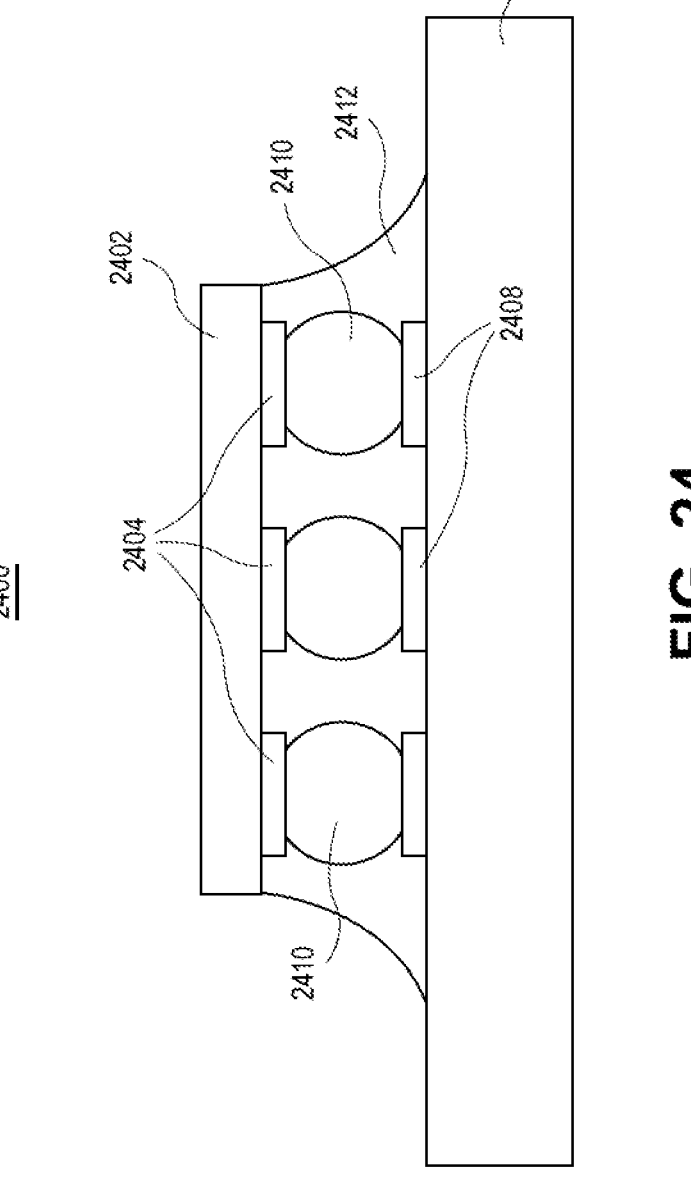
FIG. 24 illustrates a cross-sectional view of a flip-chip mounted die, in accordance with an embodiment of the present disclosure.

FIG. 24 illustrates a cross-sectional view of a flip-chip mounted die, in accordance with an embodiment of the present disclosure.

Referring to FIG. 24, an apparatus 2400 includes a die 2402 such as an integrated circuit (IC) fabricated according to one or more processes described herein or including one or more features described herein, in accordance with an embodiment of the present disclosure. The die 2402 includes metallized pads 2404 thereon. A package substrate 2406, such as a ceramic or organic substrate, includes connections 2408 thereon. The die 2402 and package substrate 2406 are electrically connected by solder balls 2410 coupled to the metallized pads 2404 and the connections 2408. An underfill material 2412 surrounds the solder balls 2410.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a first plurality of logic gate structures having a first pitch between adjacent ones of the first plurality of logic gate structures. Individual ones of the first plurality of logic gate structures have a first width. The integrated circuit structure also includes a second plurality of logic gate structures having a second pitch between adjacent ones of the second plurality of logic gate structures. The second pitch is greater than the first pitch. Individual ones of the second plurality of logic gate structures have a second width the same as the first width.

Example embodiment 2: The integrated circuit structure of example embodiment 1, wherein the second pitch is 5% and 25% greater than the first pitch.

Example embodiment 3: The integrated circuit structure of example embodiment 1, wherein the second pitch is less than 50% greater than the first pitch.

Example embodiment 4: The integrated circuit structure of example embodiment 1, wherein the first pitch is about 54 nm, and the second pitch is about 60 nm.

Example embodiment 5: The integrated circuit structure of example embodiment 1, 2, 3 or 4, wherein the first width is 10 nm or less.

Example embodiment 6: An integrated circuit structure includes a first plurality of logic gate structures having a first pitch between adjacent ones of the first plurality of logic gate structures. Individual ones of the first plurality of logic gate structures have a first width. The integrated circuit structure also includes a second plurality of logic gate structures having a second pitch between adjacent ones of the second plurality of logic gate structures. The second pitch is greater than the first pitch. Individual ones of the second plurality of logic gate structures have a second width less than the first width.

Example embodiment 7: The integrated circuit structure of example embodiment 6, wherein the second pitch is 5% and 25% greater than the first pitch.

Example embodiment 8: The integrated circuit structure of example embodiment 6, wherein the second pitch is less than 50% greater than the first pitch.

Example embodiment 9: The integrated circuit structure of example embodiment 6, wherein the first pitch is about 54 nm, and the second pitch is about 60 nm.

Example embodiment 10: The integrated circuit structure of example embodiment 6, 7, 8 or 9, wherein the first width is 10 nm or less, and the second width is less than 10 nm.

Example embodiment 11: A computing device includes a board, and a component coupled to the board. The component includes an integrated circuit structure including a first plurality of logic gate structures having a first pitch between adjacent ones of the first plurality of logic gate structures. Individual ones of the first plurality of logic gate structures have a first width. The integrated circuit structure also includes a second plurality of logic gate structures having a second pitch between adjacent ones of the second plurality of logic gate structures. The second pitch is greater than the first pitch. Individual ones of the second plurality of logic gate structures have a second width the same as the first width.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a camera coupled to the board.

Example embodiment 15: The computing device of example embodiment 11, 12, 13 or 14, wherein the component is a packaged integrated circuit die.

Example embodiment 16: A computing device includes a board, and a component coupled to the board. The component includes an integrated circuit structure including a first plurality of logic gate structures having a first pitch between adjacent ones of the first plurality of logic gate structures. Individual ones of the first plurality of logic gate structures have a first width. The integrated circuit structure also includes a second plurality of logic gate structures having a second pitch between adjacent ones of the second plurality of logic gate structures. The second pitch is greater than the first pitch. Individual ones of the second plurality of logic gate structures have a second width less than the first width.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
a first plurality of logic gate structures over a first plurality of fins, the first plurality of logic gate structures having a first pitch between adjacent ones of the first plurality of logic gate structures, wherein individual ones of the first plurality of logic gate structures have a gate electrode having a first width; and
a second plurality of logic gate structures over a second plurality of fins, the second plurality of logic gate structures having a second pitch between adjacent ones of the second plurality of logic gate structures, the second pitch greater than the first pitch, wherein individual ones of the second plurality of logic gate structures have a gate electrode having a second width the same as the first width, wherein a third pitch between neighboring ones of the second plurality of logic gate structures and the first plurality of logic gate structures is greater than two times but less than three times the second pitch.

2. The integrated circuit structure of claim 1, wherein the second pitch is 5% and 25% greater than the first pitch.

3. The integrated circuit structure of claim 1, wherein the second pitch is less than 50% greater than the first pitch.

4. The integrated circuit structure of claim 1, wherein the first pitch is about 54 nm, and the second pitch is about 60 nm.

5. The integrated circuit structure of claim 1, wherein the first width is 10 nm or less.

6. An integrated circuit structure, comprising:
a first plurality of logic gate structures having a first pitch between adjacent ones of the first plurality of logic gate structures, wherein individual ones of the first plurality of logic gate structures have a first width; and
a second plurality of logic gate structures having a second pitch between adjacent ones of the second plurality of logic gate structures, the second pitch greater than the first pitch, wherein individual ones of the second plurality of logic gate structures have a second width less than the first width, wherein a third pitch between neighboring ones of the second plurality of logic gate structures and the first plurality of logic gate structures is greater than two times but less than three times the second pitch.

7. The integrated circuit structure of claim 6, wherein the second pitch is 5% and 25% greater than the first pitch.

8. The integrated circuit structure of claim 6, wherein the second pitch is less than 50% greater than the first pitch.

9. The integrated circuit structure of claim 6, wherein the first pitch is about 54 nm, and the second pitch is about 60 nm.

10. The integrated circuit structure of claim 1, wherein the first width is 10 nm or less, and the second width is 10 nm or less.

11. A computing device, comprising:
a board; and
a component coupled to the board, the component including an integrated circuit structure, comprising:
a first plurality of logic gate structures over a first plurality of fins, the first plurality of logic gate structures having a first pitch between adjacent ones of the first plurality of logic gate structures, wherein individual ones of the first plurality of logic gate structures have a gate electrode having a first width; and
a second plurality of logic gate structures over a second plurality of fins, the second plurality of logic gate structures having a second pitch between adjacent ones of the second plurality of logic gate structures, the second pitch greater than the first pitch, wherein individual ones of the second plurality of logic gate structures have a gate electrode having a second width the same as the first width, wherein a third pitch between neighboring ones of the second plurality of logic gate structures and the first plurality of logic gate structures is greater than two times but less than three times the second pitch.

12. The computing device of claim 11, further comprising:

a memory coupled to the board.

13. The computing device of claim 11, further comprising:

a communication chip coupled to the board.

14. The computing device of claim 11, further comprising:

a camera coupled to the board.

15. The computing device of claim 11, wherein the component is a packaged integrated circuit die.

16. A computing device, comprising:

a board; and a component coupled to the board, the component including an integrated circuit structure, comprising:

a first plurality of logic gate structures having a first pitch between adjacent ones of the first plurality of logic gate structures, wherein individual ones of the first plurality of logic gate structures have a first width; and a second plurality of logic gate structures having a second pitch between adjacent ones of the second plurality of logic gate structures, the second pitch greater than the first pitch, wherein individual ones of the second plurality of logic gate structures have a second width less than the first width, wherein a third pitch between neighboring ones of the second plurality of logic gate structures and the first plurality of logic gate structures is greater than two times but less than three times the second pitch.

17. The computing device of claim 16, further comprising:

a memory coupled to the board.

18. The computing device of claim 16, further comprising:

a communication chip coupled to the board.

19. The computing device of claim 16, further comprising:

a camera coupled to the board.

20. The computing device of claim 16, wherein the component is a packaged integrated circuit die.

* * * * *